(12) United States Patent
Leipold et al.

(10) Patent No.: US 11,635,642 B2
(45) Date of Patent: *Apr. 25, 2023

(54) REPROGRAMMABLE QUANTUM PROCESSOR ARCHITECTURE INCORPORATING QUANTUM ERROR CORRECTION

(71) Applicant: equal1.labs Inc., Fremont, CA (US)

(72) Inventors: Dirk Robert Walter Leipold, Fremont, CA (US); George Adrian Maxim, Saratoga, CA (US); Michael Albert Asker, San Jose, CA (US)

(73) Assignee: Equal1.Labs Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/645,047

(22) Filed: Dec. 18, 2021

(65) Prior Publication Data

US 2022/0137439 A1 May 5, 2022

Related U.S. Application Data

(62) Division of application No. 16/446,271, filed on Jun. 19, 2019, now Pat. No. 11,203,526.

(Continued)

(51) Int. Cl.
*H03M 13/00* (2006.01)
*G02F 1/017* (2006.01)
(Continued)

(52) U.S. Cl.
CPC .......... *G02F 1/01725* (2013.01); *B82Y 10/00* (2013.01); *B82Y 15/00* (2013.01);
(Continued)

(58) Field of Classification Search
CPC ..... G02F 1/01725; B82Y 10/00; G06N 10/00; G06N 10/70; H03M 13/1575
See application file for complete search history.

(56) References Cited

U.S. PATENT DOCUMENTS 6,301,029 B1   10/2001   Azuma et al.
6,472,681 B1   10/2002   Kane et al.
(Continued)

FOREIGN PATENT DOCUMENTS

CN   108776582 A   11/2018
EP   1860600       11/2008
(Continued)

OTHER PUBLICATIONS

Guo et al., "Control and Readout of Software in Superconducting Quantum Computing," https://arxiv.org/abs/1806.04021, Jun. 2018.
(Continued)

*Primary Examiner* — Samir W Rizk
(74) *Attorney, Agent, or Firm* — Zaretsky Group PC; Howard Zaretsky

(57) ABSTRACT

A novel and useful quantum computing machine architecture that includes a classic computing core as well as a quantum computing core. A programmable pattern generator executes sequences of instructions that control the quantum core. In accordance with the sequences, a pulse generator functions to generate the control signals that are input to the quantum core to perform quantum operations. A partial readout of the quantum state in the quantum core is generated that is subsequently re-injected back into the quantum core to extend decoherence time. Access gates control movement of quantum particles in the quantum core. Errors are corrected from the partial readout before being re-injected back into the quantum core. Internal and external calibration loops calculate error syndromes and calibrate the control pulses input to the quantum core. Control of the quantum core is provided from an external support unit via the pattern generator or can be retrieved from classic memory where sequences of commands for the quantum core are stored a priori in the memory. A cryostat unit (Continued)

functions to provide several temperatures to the quantum machine including a temperature to cool the quantum computing core to approximately 4 Kelvin.

18 Claims, 29 Drawing Sheets

Related U.S. Application Data

(60) Provisional application No. 62/687,800, filed on Jun. 20, 2018, provisional application No. 62/687,803, filed on Jun. 21, 2018, provisional application No. 62/689,035, filed on Jun. 22, 2018, provisional application No. 62/689,100, filed on Jun. 23, 2018, provisional application No. 62/689,166, filed on Jun. 24, 2018, provisional application No. 62/692,745, filed on Jun. 30, 2018, provisional application No. 62/692,804, filed on Jul. 1, 2018, provisional application No. 62/692,844, filed on Jul. 1, 2018, provisional application No. 62/694,022, filed on Jul. 5, 2018, provisional application No. 62/695,842, filed on Jul. 10, 2018, provisional application No. 62/698,278, filed on Jul. 15, 2018, provisional application No. 62/726,290, filed on Sep. 2, 2018, provisional application No. 62/689,291, filed on Jun. 25, 2018, provisional application No. 62/687,793, filed on Jun. 20, 2018, provisional application No. 62/688,341, filed on Jun. 21, 2018, provisional application No. 62/703,888, filed on Jul. 27, 2018, provisional application No. 62/726,271, filed on Sep. 2, 2018, provisional application No. 62/726,397, filed on Sep. 3, 2018, provisional application No. 62/731,810, filed on Sep. 14, 2018, provisional application No. 62/788,865, filed on Jan. 6, 2019, provisional application No. 62/791,818, filed on Jan. 13, 2019, provisional application No. 62/794,591, filed on Jan. 19, 2019, provisional application No. 62/794,655, filed on Jan. 20, 2019, provisional application No. 62/687,779, filed on Jun. 20, 2018.

(51) Int. Cl.

| | | |
|---|---|---|
| *B82Y 10/00* | (2011.01) | |
| *G06N 10/00* | (2022.01) | |
| *H01L 29/12* | (2006.01) | |
| *H01L 29/66* | (2006.01) | |
| *H03K 19/195* | (2006.01) | |
| *B82Y 15/00* | (2011.01) | |
| *G06F 1/20* | (2006.01) | |
| *G06F 11/07* | (2006.01) | |
| *G06F 15/16* | (2006.01) | |
| *G06N 99/00* | (2019.01) | |
| *G11C 19/32* | (2006.01) | |
| *H01L 21/02* | (2006.01) | |
| *H01L 27/088* | (2006.01) | |
| *H01L 29/15* | (2006.01) | |
| *H01L 29/417* | (2006.01) | |
| *H01L 33/04* | (2010.01) | |
| *H03M 1/34* | (2006.01) | |
| *H03M 1/66* | (2006.01) | |
| *H03K 3/38* | (2006.01) | |
| *H03M 13/15* | (2006.01) | |
| *G06N 10/70* | (2022.01) | |

(52) U.S. Cl.
CPC .......... *G06F 1/20* (2013.01); *G06F 11/0724* (2013.01); *G06F 11/0751* (2013.01); *G06F 11/0793* (2013.01); *G06F 15/16* (2013.01); *G06N 10/00* (2019.01); *G06N 10/70* (2022.01); *G06N 99/00* (2013.01); *G11C 19/32* (2013.01); *H01L 21/02694* (2013.01); *H01L 27/0883* (2013.01); *H01L 29/122* (2013.01); *H01L 29/157* (2013.01); *H01L 29/41791* (2013.01); *H01L 29/66977* (2013.01); *H01L 29/66984* (2013.01); *H01L 33/04* (2013.01); *H03K 3/38* (2013.01); *H03K 19/195* (2013.01); *H03M 1/34* (2013.01); *H03M 1/66* (2013.01); *H03M 13/1575* (2013.01); *H10N 60/11* (2023.02); *H10N 60/128* (2023.02); *H10N 69/00* (2023.02); *G02F 1/01791* (2021.01)

(56) References Cited

U.S. PATENT DOCUMENTS

| | | | |
|---|---|---|---|
| 6,597,010 | B2 | 7/2003 | Eriksson |
| 6,635,898 | B2 | 10/2003 | Williams et al. |
| 6,657,222 | B1 | 12/2003 | Foden et al. |
| 6,720,589 | B1 | 4/2004 | Shields |
| 6,787,794 | B2 | 9/2004 | Cain |
| 7,026,641 | B2 | 4/2006 | Mohseni |
| 7,317,230 | B2 | 1/2008 | Lee et al. |
| 7,451,292 | B2 | 11/2008 | Routt |
| 7,498,832 | B2 | 3/2009 | Baumgardner |
| 7,655,850 | B1 | 2/2010 | Ahn |
| 7,659,538 | B2 | 2/2010 | Snyder et al. |
| 7,830,695 | B1 | 11/2010 | Moon |
| 8,035,540 | B2 | 10/2011 | Berkley |
| 8,229,863 | B2 | 7/2012 | Amin |
| 8,294,137 | B2 | 10/2012 | Jain et al. |
| 8,507,894 | B2 | 8/2013 | Morello |
| 8,576,614 | B2 | 11/2013 | Heyns |
| 9,093,499 | B2 | 7/2015 | Noel |
| 9,126,829 | B2 | 9/2015 | Wu |
| 9,153,594 | B2 | 10/2015 | Jain |
| 9,269,052 | B2 | 2/2016 | Svore et al. |
| 9,502,265 | B1 | 11/2016 | Jiang |
| 9,633,313 | B2 | 4/2017 | Svore et al. |
| 9,691,033 | B2 | 6/2017 | Rogge |
| 9,741,081 | B2 | 8/2017 | Alboszta et al. |
| 9,842,921 | B2 | 12/2017 | Eriksson |
| 9,858,531 | B1 | 1/2018 | Monroe |
| 9,859,409 | B2 | 1/2018 | Cheng et al. |
| 9,978,020 | B1 | 5/2018 | Gambetta |
| 10,068,903 | B2 | 9/2018 | Edwards |
| 10,192,976 | B2 | 1/2019 | Petta |
| 10,229,365 | B2 | 3/2019 | Fuechsle |
| 10,255,556 | B2 | 4/2019 | Hollenberg |
| 10,311,369 | B2 | 6/2019 | Epstein |
| 10,332,023 | B2 | 6/2019 | Mezzacap |
| 10,340,290 | B2 | 7/2019 | Pawlak |
| 10,353,862 | B2 | 7/2019 | Henry |
| 10,380,496 | B2 | 8/2019 | Elsherbini et al. |
| 10,446,700 | B2 | 10/2019 | Wang |
| 10,482,388 | B1 | 11/2019 | Jock |
| 10,483,980 | B2 | 11/2019 | Sete |
| 10,491,221 | B1 | 11/2019 | McKay |
| 10,528,884 | B2 | 1/2020 | Morello |
| 10,560,096 | B2 | 2/2020 | Raeis |
| 10,565,515 | B2 | 2/2020 | Lampert |
| 10,635,989 | B2 | 4/2020 | Blais |
| 10,726,351 | B1 | 7/2020 | Li et al. |
| 10,763,349 | B2 | 9/2020 | Pillarisetty et al. |
| 10,804,399 | B2 | 10/2020 | Pillarisetty |
| 10,929,769 | B2 | 2/2021 | Pioro-Ladriere |
| 11,031,239 | B2 | 6/2021 | Cheng |
| 11,094,716 | B2 | 8/2021 | Basu |
| 11,203,526 | B2 * | 12/2021 | Leipold .................. G06N 10/70 |

(56) References Cited

U.S. PATENT DOCUMENTS

| | | |
|---|---|---|
| 11,222,977 B2 | 1/2022 | Glass |
| 2002/0190249 A1 | 12/2002 | Williams et al. |
| 2007/0063182 A1 | 3/2007 | Yang |
| 2008/0172197 A1 | 7/2008 | Skipor |
| 2009/0127542 A1 | 5/2009 | Sugaya |
| 2010/0155808 A1 | 6/2010 | Makihara |
| 2011/0121895 A1 | 5/2011 | Morello |
| 2011/0309236 A1 | 12/2011 | Tian |
| 2012/0212375 A1 | 8/2012 | Depree |
| 2013/0087766 A1 | 4/2013 | Schenkel |
| 2014/0026107 A1 | 1/2014 | Bocharov |
| 2014/0203243 A1 | 7/2014 | Xiao |
| 2016/0112066 A1 | 4/2016 | Ashikhmin |
| 2016/0189053 A1 | 6/2016 | Alboszta et al. |
| 2016/0021560 A1 | 7/2016 | Alboszta et al. |
| 2016/0204202 A1 | 7/2016 | Jain |
| 2016/0268406 A1 | 9/2016 | Barraud |
| 2016/0300155 A1 | 10/2016 | Betz |
| 2017/0147939 A1 | 5/2017 | Dzurak et al. |
| 2017/0214070 A1 | 7/2017 | Wang |
| 2017/0300808 A1 | 10/2017 | Ronagh et al. |
| 2018/0122336 A1 | 5/2018 | Kunitake |
| 2018/0260732 A1 | 9/2018 | Bloom |
| 2018/0279429 A1 | 9/2018 | Sadwick |
| 2019/0044049 A1 | 2/2019 | Thomas et al. |
| 2019/0044050 A1 | 2/2019 | Pillarisetty et al. |
| 2019/0044542 A1 | 2/2019 | Hogaboam et al. |
| 2019/0334020 A1 | 2/2019 | Amin |
| 2019/0080256 A1 | 3/2019 | Irwin |
| 2019/0130298 A1 | 5/2019 | Pioro-Ladriere |
| 2019/0164959 A1 | 5/2019 | Thomas |
| 2019/0181256 A1 | 6/2019 | Roberts |
| 2019/0198618 A1 | 6/2019 | George |
| 2019/0214385 A1 | 7/2019 | Roberts et al. |
| 2019/0266509 A1 | 8/2019 | Hutin |
| 2019/0266511 A1 | 8/2019 | Pillarisetty |
| 2019/0273197 A1 | 9/2019 | Roberts |
| 2019/0392341 A1 | 12/2019 | Leipold |
| 2019/0392352 A1 | 12/2019 | Lampert |
| 2019/0392912 A1 | 12/2019 | Leipold et al. |
| 2019/0392913 A1 | 12/2019 | Leipold et al. |
| 2019/0392917 A1 | 12/2019 | Leipold |
| 2019/0393397 A1 | 12/2019 | Leipold |
| 2020/0126980 A1 | 4/2020 | Park |
| 2020/0127096 A1 | 4/2020 | Eendebak |
| 2020/0160205 A1 | 5/2020 | Leipold |
| 2020/0169396 A1 | 5/2020 | Neven et al. |
| 2020/0285947 A1 | 9/2020 | Gunnels et al. |
| 2020/0311525 A1 | 10/2020 | Kachman |
| 2020/0312846 A1 | 10/2020 | Rachmady |
| 2020/0328277 A1 | 10/2020 | Jain |
| 2020/0412532 A1 | 12/2020 | Shi et al. |
| 2021/0342730 A1 | 11/2021 | Redmond |
| 2022/0067563 A1 | 3/2022 | Bonderson |

FOREIGN PATENT DOCUMENTS

| | | |
|---|---|---|
| EP | 2421043 | 2/2012 |
| EP | 3505490 | 1/2018 |
| EP | 3869421 | 8/2021 |
| KR | 20180112833 A | 10/2018 |
| WO | 2018004554 | 1/2018 |
| WO | 2020245013 | 10/2020 |

OTHER PUBLICATIONS

Alkhalil et al., "Realization of Fully Tunable FinFET Double Quantum Dots with Close Proximity Plunger Gates," 12th EEE International Conference on Nanotechnology (IEEE-NANO), 2012.

Kuhlmann et al., "Ambipolar quantum dots in undoped silicon fin field-effect transistors," Applied Physics Letters 113 122107, 2018.

Angus et al., "Gate-Defined Quantum Dots in Intrinsic Silicon," Nano Letters, vol. 7, No. 7, pp. 2051-2055, 2007.

Lansbergen et al., "Transport-based dopant metrology in advanced FinFETs," IEEE, 2008.

Zajac et al., "Resonantly driven CNOT gate for electron spins", Science 359, pp. 439-442, 2018.

Veldhorst et al., "A Two Qubit Logic Gate in Silicon", 2014.

Rashba. "Electron spin operation by electric fields: spin dynamics and spin injection," Physica E 20 (2004) pp. 189-195.

Bernardo-Gavito, R., Bagci, I.E., Roberts, J et al. Extracting random numbers from quantum tunnelling through a single diode. Sci Rep 7, 17879 (2017). https://doi.org/10.1038/s41598-017-18161-9 Dec. 31, 2017 (Dec. 31, 2017).

Hopkins M, Mikaitis M, Lester DR, Furber S. 2020 Stochastic rounding and reduced-precision fixed-point arithmetic for solving neural ordinary differential equations.Phil. Trans. R. Soc. A 378: 20190052. http://dx.doi.org/10.1098/rsta.2019.0052, Jan. 20, 2020 (Jan. 20, 2020).

I. Bashir et al., "A Single-Electron Injection Device for CMOS Charge Qubits Implemented in 22-nm FS-SOI," in SSC Letters, vol. 3, Jul. 2020, pp. 206-209 Jul. 21, 2020 (Jul. 21, 2020).

I. V. P. D. Reyes, A. M. Sison and R. P. Medina, "A Novel Fused Random Pooling Method for Convolutional Neural Network to Improve Image Classification Accuracy," 2019 IEEE 6th International Conference on Engineering Technologies and Applied Sciences (ICETAS), 2019, pp. 1-5, doi 10.1109/ICETAS48360.2019.9117323. Dec. 31, 2019 (Dec. 31, 2019).

Krishnakumar, R., & Zeng, W. (2021). Quantum Rounding. arXiv preprint arXiv:2108.05949. Aug. 12, 2021 (Aug. 12, 2021).

Morau et al., "Transport spectroscopy of coupled donors in silicon nano-transistors", Scientific Reports 4 (2014) 6219.

Xia, Lu, et al. "A Simple and Efficient Stochastic Rounding Method for Training Neural Networks in Low Precision." arXiv preprint arXiv:2103.13445 (2021). Mar. 24, 2021 (Mar. 24, 2021).

* cited by examiner

REPROGRAMMABLE QUANTUM PROCESSOR ARCHITECTURE INCORPORATING QUANTUM ERROR CORRECTION

REFERENCE TO PRIORITY APPLICATIONS

This application is a divisional of U.S. application Ser. No. 16/446,271, filed Jun. 19, 2019, entitled "Reprogrammable Quantum Processor Architecture Incorporating Quantum Error Correction," now U.S. Pat. No. 11,203,526, which claims the benefit of U.S. Provisional Application No. 62/687,800, filed Jun. 20, 2018, entitled "Electric Signal Pulse-Width And Amplitude Controlled And Re-Programmable Semiconductor Quantum Rotation Gates," U.S. Provisional Application No. 62/687,803, filed Jun. 21, 2018, entitled "Semiconductor Quantum Structures and Computing Circuits Using Local Depleted Well Tunneling," U.S. Provisional Application No. 62/689,100, filed Jun. 23, 2018, entitled "Semiconductor Controlled Entangled-Aperture-Logic Quantum Shift Register," U.S. Provisional Application No. 62/694,022, filed Jul. 5, 2018, entitled "Double-V Semiconductor Entangled-Aperture-Logic Parallel Quantum Interaction Path," U.S. Provisional Application No. 62/687,779, filed Jun. 20, 2018, entitled "Semiconductor Quantum Structures And Gates Using Through-Thin-Oxide Well-To-Gate Aperture Tunneling," U.S. Provisional Application No. 62/687,793, filed Jun. 20, 2018, entitled "Controlled Semiconductor Quantum Structures And Computing Circuits Using Aperture Well-To-Gate Tunneling," U.S. Provisional Application No. 62/688,341, filed Jun. 21, 2018, entitled "3D Semiconductor Quantum Structures And Computing Circuits Using Fin-To-Gate Tunneling," U.S. Provisional Application No. 62/689,035, filed Jun. 22, 2018, entitled "3D Semiconductor Quantum Structures And Computing Circuits Using Controlled Tunneling Through Local Fin Depletion Regions," U.S. Provisional Application No. 62/689,291, filed Jun. 25, 2018, entitled "Semiconductor Quantum Dot And Qubit Structures Using Aperture-Tunneling Through Oxide Layer," U.S. Provisional Application No. 62/689,166, filed Jun. 24, 2018, entitled "Semiconductor Entangled-Aperture-Logic Quantum Ancillary Gates," U.S. Provisional Application No. 62/692,745, filed Jun. 20, 2018, entitled "Re-Programmable And Re-Configurable Quantum Processor Using Pulse-Width Based Rotation Selection And Path Access Or Bifurcation Control," U.S. Provisional Application No. 62/692,804, filed Jul. 1, 2018, entitled "Quantum Processor With Dual-Path Quantum Error Correction," U.S. Provisional Application No. 62/692,844, filed Jul. 1, 2018, entitled "Quantum Computing Machine With Partial Data Readout And Re-Injection Into The Quantum State," U.S. Provisional Application No. 62/726,290, filed Jun. 20, 2018, entitled "Controlled-NOT and Tofolli Semiconductor Entangled-Aperture-Logic Quantum Gates," U.S. Provisional Application No. 62/695,842, filed Jul. 10, 2018, entitled "Entangled Aperture-Logic Semiconductor Quantum Computing Structure with Intermediary Interactor Path," U.S. Provisional Application No. 62/698,278, filed Jul. 15, 2018, entitled "Entangled Aperture-Logic Semiconductor Quantum Bifurcation and Merging Gate," U.S. Provisional Application No. 62/726,397, filed Sep. 3, 2018, entitled "Semiconductor Quantum Structure With Simultaneous Shift Into Entangled State," U.S. Provisional Application No. 62/791,818, filed Jan. 13, 2019, entitled "Semiconductor Process for Quantum Structures with Staircase Active Well," U.S. Provisional Application No. 62/788,865, filed Jan. 6, 2018, entitled "Semiconductor Process For Quantum Structures Without Inner Contacts And Doping Layers," U.S. Provisional Application No. 62/794,591, filed Jan. 19, 2019, entitled "Semiconductor Quantum Structures Using Localized Aperture Channel Tunneling Through Controlled Depletion Region," U.S. Provisional Application No. 62/703,888, filed Jul. 27, 2018, entitled "Aperture Tunneling Semiconductor Quantum Dots and Chord-Line Quantum Computing Structures," U.S. Provisional Application No. 62/726,271, filed Sep. 2, 2018, entitled "Controlled Local Thermal Activation Of Freeze-Out Semiconductor Circuits For Cryogenic Operation," U.S. Provisional Application No. 62/731,810, filed Sep. 14, 2018, entitled "Multi-Stage Semiconductor Quantum Detector with Anti-Correlation Merged With Quantum Core," and U.S. Provisional Application No. 62/794,655, filed Jan. 20, 2019, entitled "Semiconductor Quantum Structures Using Preferential Tunneling Direction Through Thin Insulator Layers." All of which are incorporated herein by reference in their entirety.

FIELD OF THE DISCLOSURE

The subject matter disclosed herein relates to the field of quantum computing and more particularly relates to a quantum computing machine architecture.

BACKGROUND OF THE INVENTION

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, analog and digital are the two main approaches to physically implementing a quantum computer. Analog approaches are further divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

The key challenge of quantum computing is isolating such microscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement of the particles to well below the energy/movement coming from their desired interaction. Current physical quantum computers, however, are very noisy and quantum error correction is commonly applied to compensate for the noise.

Most existing quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of milli-kelvin (mK) temperatures, that are difficult to achieve and where it is difficult to dissipate significant power to operate the quantum machine.

SUMMARY OF THE INVENTION

The present invention describes a quantum computing machine architecture that includes a classic computing core as well as a quantum computing core. A programmable pattern generator functions to execute sequences of instructions that control the quantum core. In accordance with the sequences, a pulse generator functions to generate the control signals that are input to the quantum core to perform quantum operations. Various parameters of the control pulses are configured including amplitude, pulse width, and reference voltage.

A partial readout unit functions to generate a partial readout of a quantum state in the quantum core that is subsequently re-injected back into the quantum core in order to extend the decoherence time. A plurality of access gates control movement of quantum particles through access paths in the quantum core. An error correction unit functions to correct output from the partial readout before it is re-injected back into the quantum core. Internal and external calibration loops calculate error syndromes and calibrate the control pulses input to the quantum core.

Instructions and control of the quantum core can be provided from an external support unit via the pattern generator or can be retrieved from classic memory whereby sequences of commands for the quantum core are stored a priori in the memory.

A cryostat unit functions to provide several temperatures to the quantum machine including a temperature to cool the quantum computing core to approximately 4 Kelvin.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a quantum computing machine, comprising one or more quantum computing cores, and an internal error correction loop including a quantum error correction unit whereby error detection and/or error syndromes are calculated and fedback to a pattern generator control unit operative to generate control pulses for controlling said quantum computing core to correct errors in quantum computations therein.

There is also provided in accordance with the invention, a quantum computing machine, comprising one or more quantum cores each including a quantum computing unit and a quantum entanglement unit for configuring controls thereto, a quantum error detection unit operative to detect errors in quantum computations in said quantum entanglement and quantum computing units and to calculate error syndromes therefrom, and a quantum error correction unit operative to perform forward error correction correcting errors detected by said quantum error detection unit.

There is further provided in accordance with the invention, a quantum computing machine, comprising one or more quantum computing cores including a quantum entanglement unit for configuring controls to perform operations on quantum states therein, ancillary quantum states input to said quantum entanglement unit and an ancillary quantum processing path, a quantum error detection unit operative to detect errors in quantum computations in said quantum entanglement unit utilizing said ancillary quantum states to calculate error syndromes therefrom, a quantum error correction control unit operative to determine corrections to apply to said quantum states based on computed error syndromes, and a quantum error correction unit operative to perform forward error correction correcting errors in accordance with said corrections from said quantum error correction control unit.

There is also provided in accordance with the invention, a quantum computing machine, comprising one or more quantum computing cores including a quantum entanglement unit for configuring controls to perform operations on quantum states therein, a quantum computation including a main path and a complimentary path, a main detector coupled to said main path and a complimentary detector coupled to said complimentary path, a classic error detection unit coupled to the output of said main detector and said complimentary detector, and operative to generate error detection and/or error correction feedback data input to said quantum entanglement unit, a quantum error detection unit operative to detect errors in quantum computations in said quantum entanglement unit and quantum computation utilizing ancillary quantum states to calculate error syndromes therefrom, a quantum error correction control unit operative to determine corrections to apply to said quantum states, and a quantum error correction unit operative to perform forward error correction correcting errors in accordance with said corrections from said quantum error correction control unit.

DETAILED DESCRIPTION

Figure 1:
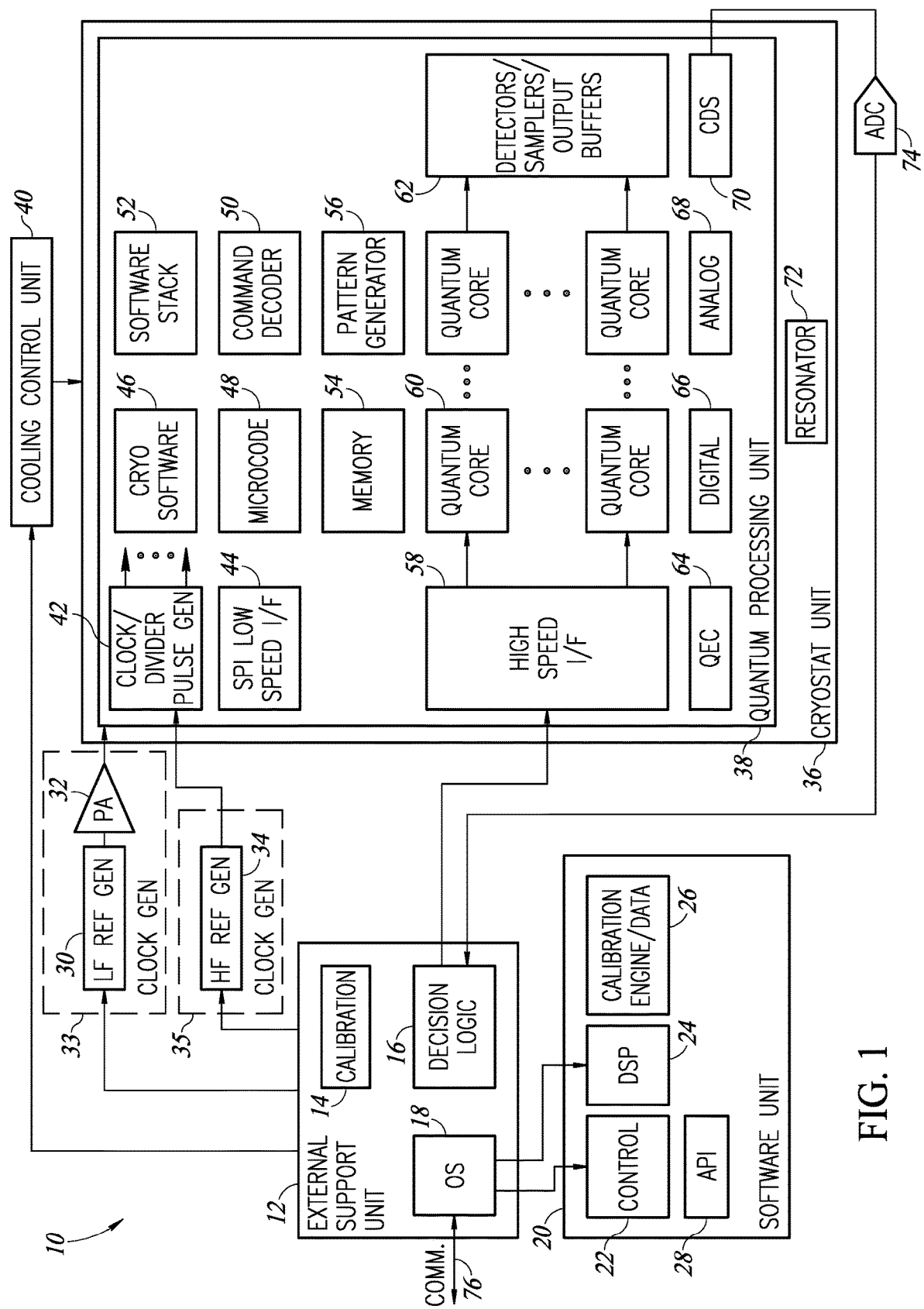
FIG. 1 is a high level block diagram illustrating a first example quantum computer system constructed in accordance with the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle may be split and present in multiple quantum dots. Thus, a reference to a particle also includes split particles.

In quantum computing, the qubit is the basic unit of quantum information, i.e. the quantum version of the classical binary bit physically realized with a two-state device. A qubit is a two state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other. Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical FET gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a low doped or undoped continuous depleted semiconductor well that functions to contain quantum particles in a qubit or qudit. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

Throughout this document, a representation of the state of the quantum system in spherical coordinates includes two angles θ and φ. Considering a unitary sphere, as the Hilbert space is a unitary state, the state of the system is completely described by the vector Ψ. The vector Ψ in spherical coordinates can be described in two angles θ and φ. The angle θ is between the vector Ψ and the z-axis and the angle φ is the angle between the projection of the vector on the XY plane and the x-axis. Thus, any position on the sphere is described by these two angles θ and φ. Note that for one qubit angle θ representation is in three dimensions. For multiple qubits θ representation is in higher order dimensions.

Quantum Computer Architecture

A high-level block diagram illustrating a first example quantum computer system constructed in accordance with the present invention is shown in FIG. 1. The quantum computer, generally referenced 10, comprises a conventional (i.e. not a quantum circuit) external support unit 12, software unit 20, cryostat unit 36, quantum processing unit 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum processing unit 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum processing unit 38 further comprises serial peripheral interface (SPI) low speed interface 44, cryostat software block 46, microcode 48, command decoder 50, software stack 52, memory 54, and pattern generator 56. The clock generator 33 comprises low frequency (LF) generator 30 and power amplifier (PA) 32, the output of which is input to the quantum processing unit (QPU) 38. Clock generator 33 also functions to aid in controlling the spin of the quantum particles in the quantum cores 60.

The cryostat unit 36 is the mechanical system that cools the QPU down to cryogenic temperatures. Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it is made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows, MacOS, Linux, QNX, NetBSD, etc. The software stack includes the API, the calibration and management of the data, and all the necessary controls to operate the external support unit itself.

The clock generated by the high frequency clock generator 35 is input to the clock divider 42 that functions to generate the signals that drive the QPU. Low frequency clock signals are also input to and used by the QPU. A slow serial/parallel interface (SPI) 44 functions to handle the control signals to configure the quantum operation in the QPU. The high speed interface 58 is used to pump data from the classic computer, i.e. the external support unit, to the QPU. The data that the QPU operates on is provided by the external support unit.

Non-volatile memory may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java, Smalltalk, C++, C# or the like, conventional procedural programming languages, such as the "C" programming language, and functional programming languages such as Python, Hotlab, Prolog and Lisp, machine code, assembler or any other suitable programming languages.

Also shown in FIG. 1 is the optional data feedback loop between the quantum processing unit 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the QPU.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Figure 2:
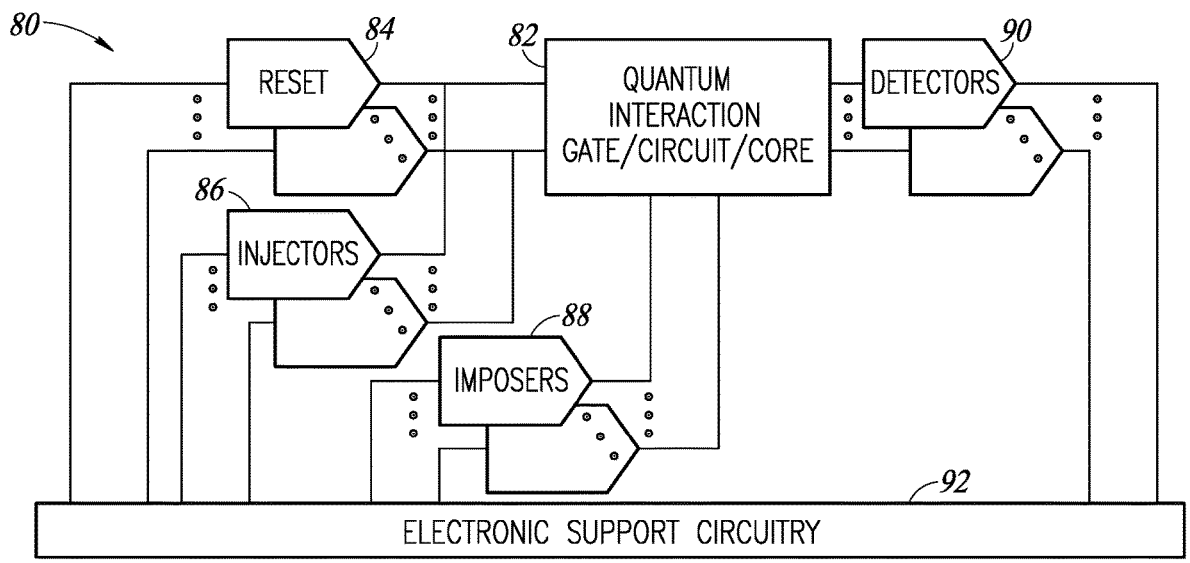
FIG. 2 is a diagram illustrating an example quantum core incorporating one or more quantum circuits.

A diagram illustrating an example quantum core incorporating one or more quantum circuits is shown in FIG. 2. The quantum core, generally referenced 80, comprises one or more quantum interaction gates, circuits, or cores 82 each comprising one or more quantum wells. The quantum interaction gates/circuits/cores or fabric have corresponding control circuitry including reset circuitry 84 for placing the quantum circuit into a known state, injector circuitry 86 for injecting one or more particles (e.g., electron or holes) into the circuit, imposer circuitry 88 for controlling the quantum operation, and detector circuitry 90 for detecting the presence or absence of particles. Together these classic electronic interface circuits electronically control the operation of the semiconductor quantum interaction gates/circuits/cores.

Figure 3:
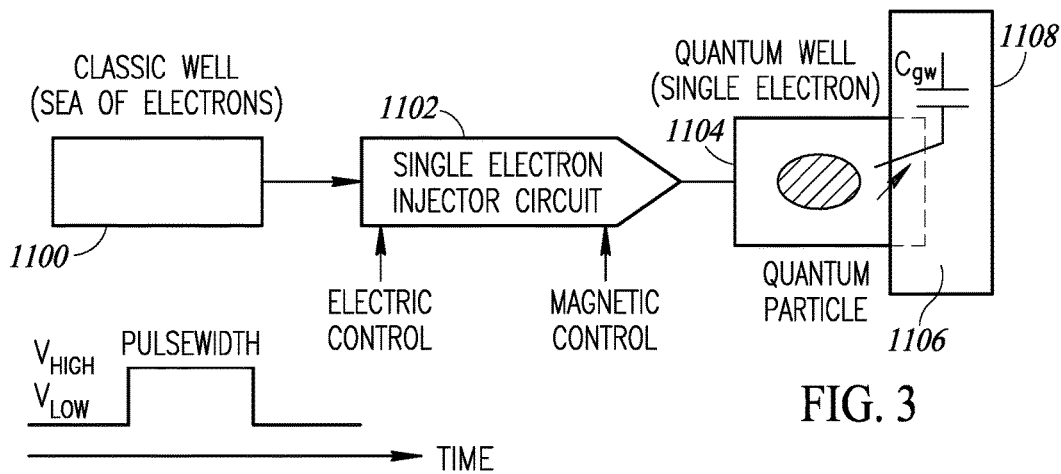
FIG. 3 is a diagram illustrating an example initialization configuration for a quantum interaction structure using tunneling through gate-well oxide layer.

A diagram illustrating an example initialization configuration for a quantum interaction structure using tunneling through gate-well oxide layer is shown in FIG. 3. The circuit comprises a classic well 1100, single particle (e.g., electron, hole) injector circuit 1102, quantum well 1104, and control gate 1108. The circuit is operative to separate a quantum behaving electron from the sea of electrons present on the surrounding classic semiconductor structures 1100. The single electron injection circuit 1102 takes only one electron (or a small number of them) from the classic well situated on its left side and injects it into the quantum well when the proper control signal is applied. In general, there are several ways to control the quantum structure: (1) using electric signals only, (2) using magnetic signals only, or (3) using a combination of electric and magnetic signals. The electric control signal preferably has specified amplitude levels ($V_{LOW}/V_{HIGH}$), pulse width, and position. The magnetic control signal is preferably of appropriate strength.

Note that the magnetic field control can be used to select an electron with a given spin orientation. This uses the property of electrons to orient their spin depending on the direction of the magnetic field direction at the time when the single electron was isolated from the classic sea of electrons. The direction of the magnetic field can be changed and thus the two spin orientations can be individually selected.

In order to perform a quantum operation in a given quantum structure having two or more qdots, the quantum system first needs to be initialized into a known base state. One or more electrons (or holes) can be injected into the multi-qdot quantum structure. These single electrons are injected only into some of the qdots of the overall quantum structure. Next, control imposing signals are applied that determine the quantum evolution of the state and perform a certain desired quantum operation.

In general, the quantum operation performed depends on the specific control signals applied. In the case of a single position/charge qubit including two qdots that can realize a generalized phase rotation of the quantum state, the rotation angle is dependent on the pulse width of the control signal applied as compared to the Rabi (or occupancy) oscillation period.

In a two qdot quantum system, if the tunneling barrier is lowered and kept low, a quantum particle starting from one of the qdots will begin tunneling to the next qdot. At a given time of half the Rabi oscillation period the particle will be completely on the second qdot, after which it will start tunneling back to the first qdot. At a certain time, the particle will have returned to the first qdot, after which the process repeats itself. This process is called the Rabi or occupancy oscillation and its period is named the Rabi oscillation period. The phase rotation in a two qdot system will depend on the control signal pulse width as related to the Rabi oscillation period.

Figure 4:
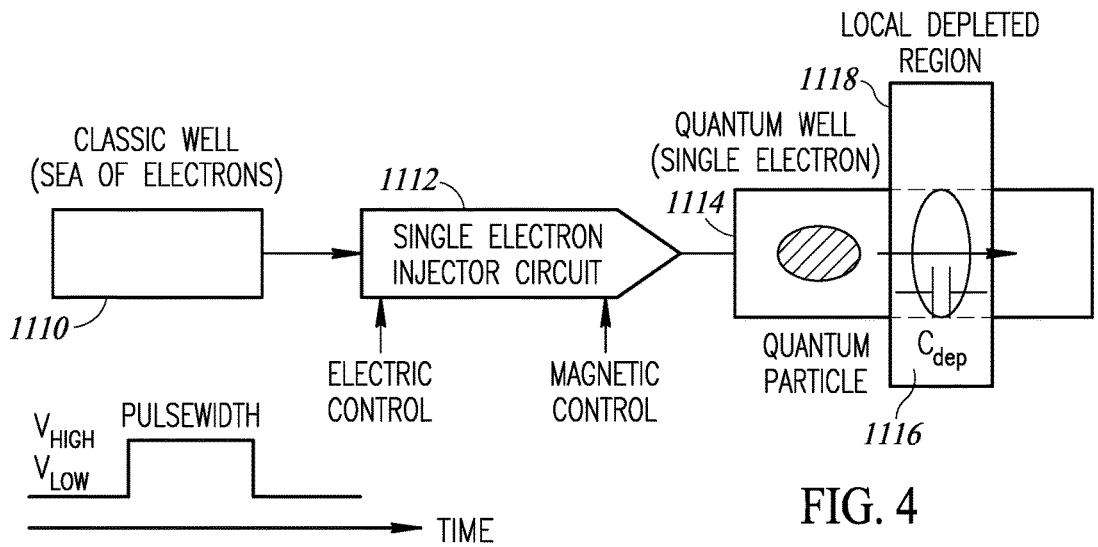
FIG. 4 is a diagram illustrating an example initialization configuration for a quantum interaction structure using tunneling through local depleted region in a continuous well.

A diagram illustrating an example initialization configuration for a quantum interaction structure using tunneling through local depleted region in a continuous well is shown in FIG. 4. The circuit comprises a classic well 1110, single particle (e.g., electron) injector circuit 1112, quantum well 1114, and control gate 1118. The quantum structure comprises two qdots (additional qdots are possible) on either side of the control gate 1118, and a tunneling path (represented by the arrow) that has a partial overlap with the qdots. The quantum operation is controlled by a control gate (or control terminal) 1118 situated in close proximity of the tunneling path.

In one embodiment, the qdots are implemented by semiconductor wells, while the tunneling path is realized by a polysilicon layer that partially or completely overlaps the two wells and preferably is left floating. The tunneling appears vertically over the thin oxide layer between the semiconductor well and the polysilicon layer. The control terminal is realized with another well or another polysilicon layer placed in close proximity in order to exercise reasonable control over the tunneling effect.

In another embodiment, a semiconductor quantum processing structure is realized using lateral tunneling in a local depleted well. The two qdots are linked by a region that is locally depleted where the tunneling occurs (represented by the arrow). The control terminal typically overlaps the tunneling path in order to maintain well-controlled depletion of the entire linking region between the two qdots. This prevents direct electric conduction between the two qdots.

In another embodiment, the two qdots of the quantum structure are realized by a single semiconductor well having a control polysilicon layer on top. The tunneling occurs laterally/horizontally through the depleted region that isolates the two qdots.

It is noted that quantum structures can be implemented in semiconductor processes using various tunneling effects. One possible tunneling is the through a thin oxide layer. In most semiconductor processes the thinnest oxide is the gate oxide. In some processes, the oxide layer used by the metal-insulator-metal (MIM) capacitance is also very thin. Another example is the tunneling through a depleted region between two semiconductor well regions. Such a local depleted region may be induced by a control terminal into an otherwise continuous drawn well or fin.

Figure 5A:
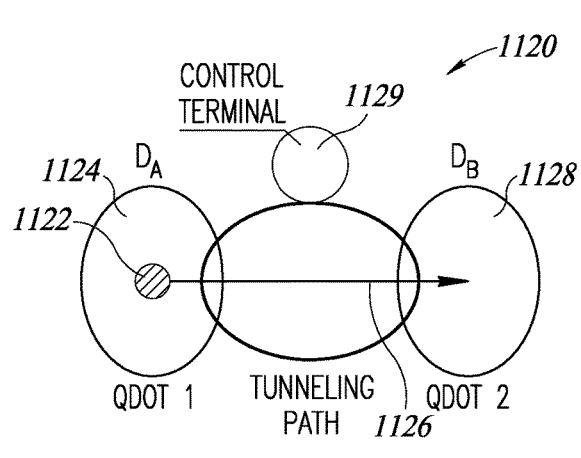
FIG. 5A is a diagram illustrating an example planar semiconductor quantum structure using tunneling through oxide layer.

A diagram illustrating an example planar semiconductor quantum structure using tunneling through oxide layer is shown in FIG. 5A. The semiconductor qubit, generally referenced 1120, comprises two qdots 1124, 1128, particle 1122, partial overlapped polysilicon gate 1129 and vertical thin oxide tunneling 1126.

Figure 5B:
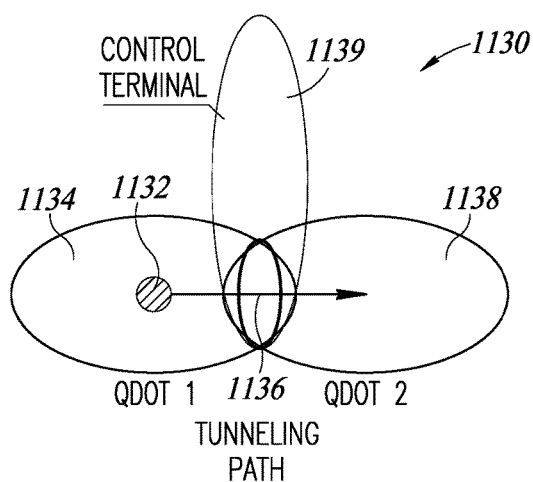
FIG. 5B is a diagram illustrating an example planar semiconductor quantum structure using tunneling through local depleted well.

A diagram illustrating an example planar semiconductor quantum structure using tunneling through local depleted well is shown in FIG. 5B. The semiconductor qubit, generally referenced 1130, comprises two qdots 1134, 1138, particle 1132, control gate 1139, and horizontal local depleted well tunneling 1136.

Figure 5C:
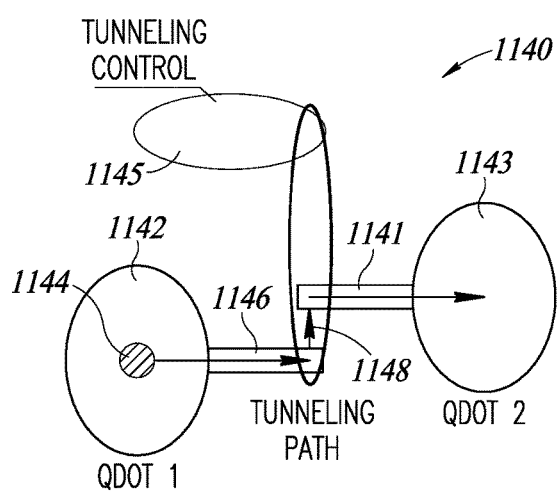
FIG. 5C is a diagram illustrating an example 3D process semiconductor quantum structure using tunneling through oxide layer.

Note that there are numerous types of semiconductor processes. Some are planar, while others are used to fabricate 3D structures (e.g., FinFET). A diagram illustrating an example 3D process semiconductor quantum structure using tunneling through oxide layer is shown in FIG. 5C. The semiconductor qubit, generally referenced 1140, comprises two qdots 1142, 1143, particle 1144, control gate 1145, 3D fins 1146, 1141, and partial fin-to-gate overlap and vertical thin oxide tunneling 1148.

Figure 5D:
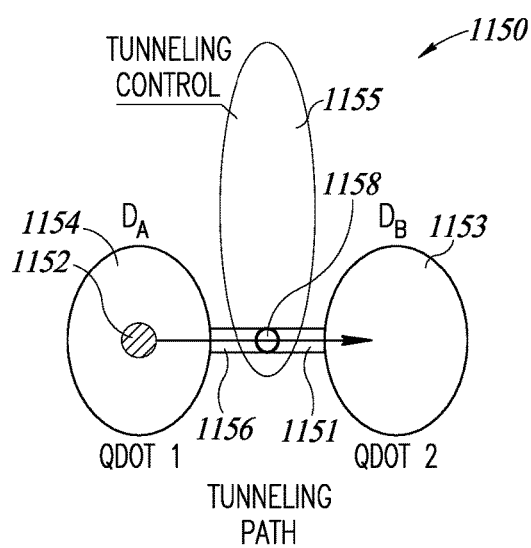
FIG. 5D is a diagram illustrating an example 3D process semiconductor quantum structure using tunneling through local depleted well.

A diagram illustrating an example 3D process semiconductor quantum structure using tunneling through local depleted well is shown in FIG. 5D. The 3D semiconductor qubit, generally referenced 1150, comprises two qdots 1154, 1153, particle 1152, control gate 1155, 3D fins 1156, 1151, and horizontal local depleted fin tunneling 1158.

Figure 6A:
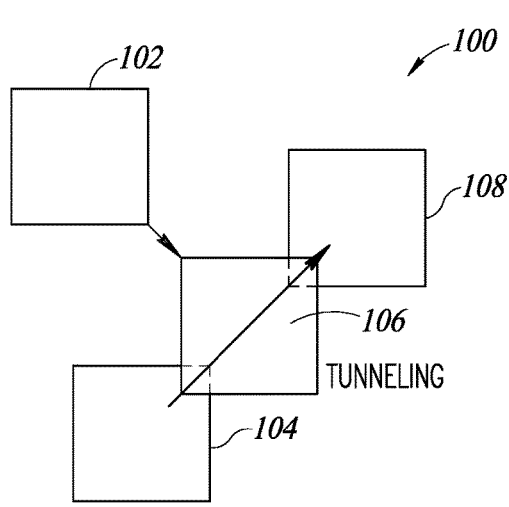
FIG. 6A is a diagram illustrating an example semiconductor qubit using tunneling through a separate layer planar structure.

A diagram illustrating an example semiconductor double qdot qubit using tunneling through a separate layer planar structure is shown in FIG. 6A. The planar semiconductor qubit, generally referenced 100, uses thin gate oxide tunneling and comprises qdots 104, 108, control gate 102, and polysilicon or metal layer 106.

Figure 6B:
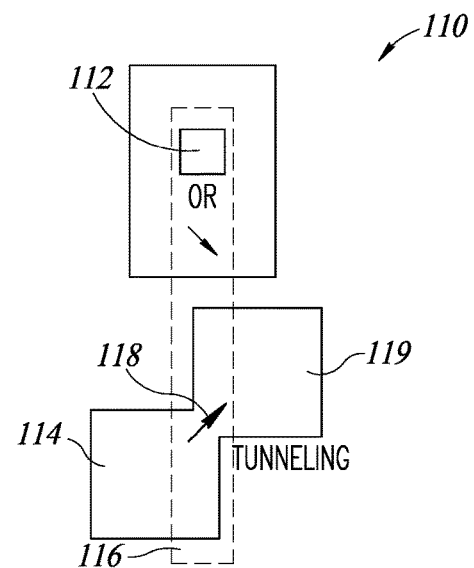
FIG. 6B is a diagram illustrating an example semiconductor qubit using tunneling through a local depleted well planar structure.

A diagram illustrating an example planar semiconductor double qdot qubit using tunneling through a local depleted well planar structure is shown in FIG. 6B. The planar semiconductor qubit, generally referenced 110, uses tunneling 118 through a local depletion region inside a continuous well, and comprises qdots 114, 119, control gate 116, and metal contact 112.

Figure 6C:
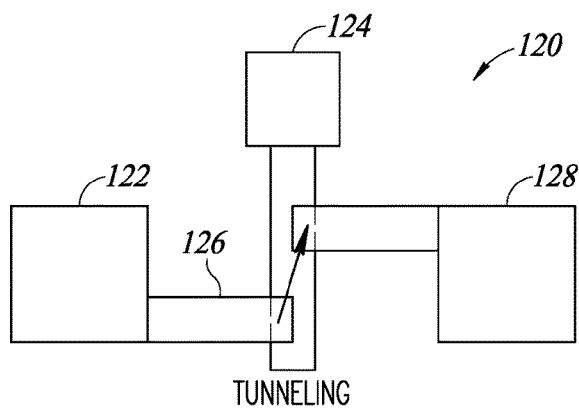
FIG. 6C is a diagram illustrating an example semiconductor qubit using tunneling through a separate layer 3D FIN-FET structure.

A diagram illustrating an example 3D semiconductor qubit using tunneling through a separate gate oxide layer 3D FIN-FET structure is shown in FIG. 6C. The 3D semiconductor qubit with fin-to gate tunneling 126, generally referenced 120, comprises qdots 122, 128, and control gate 124, which can be substantially floating.

Figure 6D:
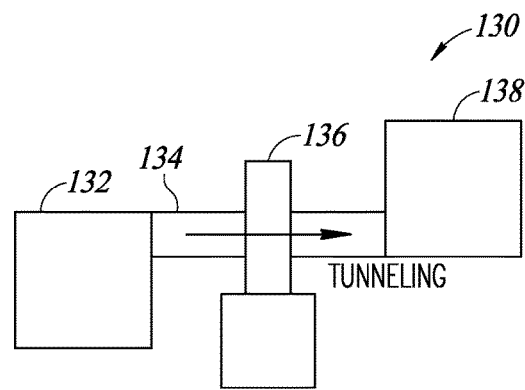
FIG. 6D is a diagram illustrating an example semiconductor qubit using tunneling through a local depleted well 3D FIN-FET structure.

A diagram illustrating an example 3D semiconductor qubit using tunneling through a local depletion in a fin structure is shown in FIG. 6D. The 3D semiconductor qubit with local depleted fin tunneling 134, generally referenced 130, comprises qdots 132, 138, and control gate 136.

Figure 7:
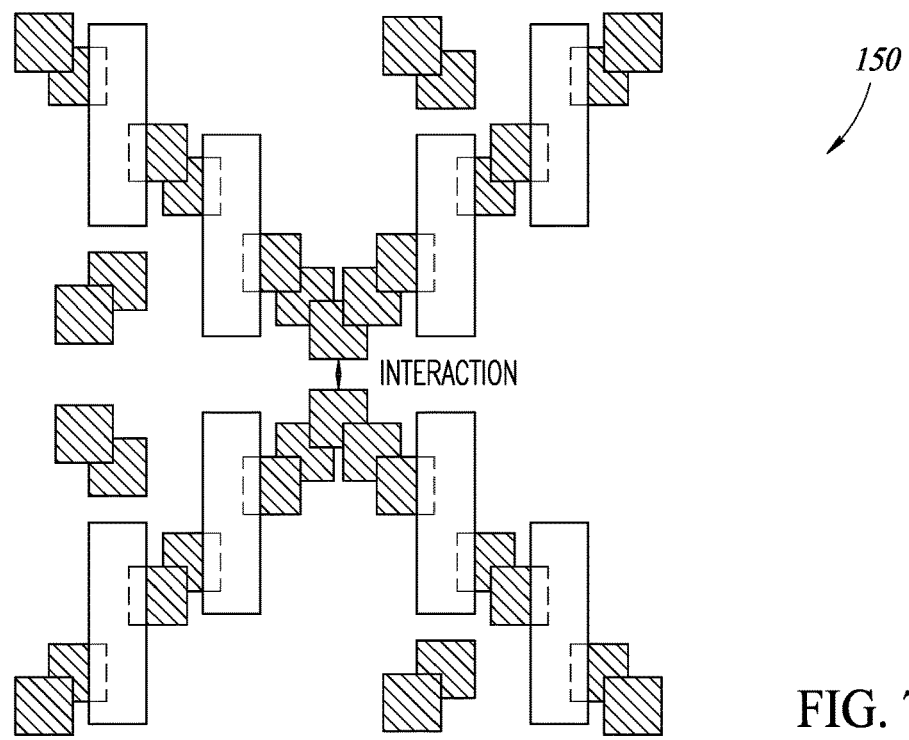
FIG. 7 is a diagram illustrating an example z shift register quantum interaction gate using planar process with partial overlap of semiconductor well and control gate.

Double-V and multi-V quantum interaction structures can be also implemented with qubits and qdots with tunneling through a thin oxide layer. A diagram illustrating an example z quantum shift register quantum interaction gate using planar process with partial overlap of semiconductor well and control gate is shown in FIG. 7. The quantum interaction gate, generally referenced 150, comprises a zig zag quantum shift register and uses half gate length side overlap with hangover.

Figure 8:
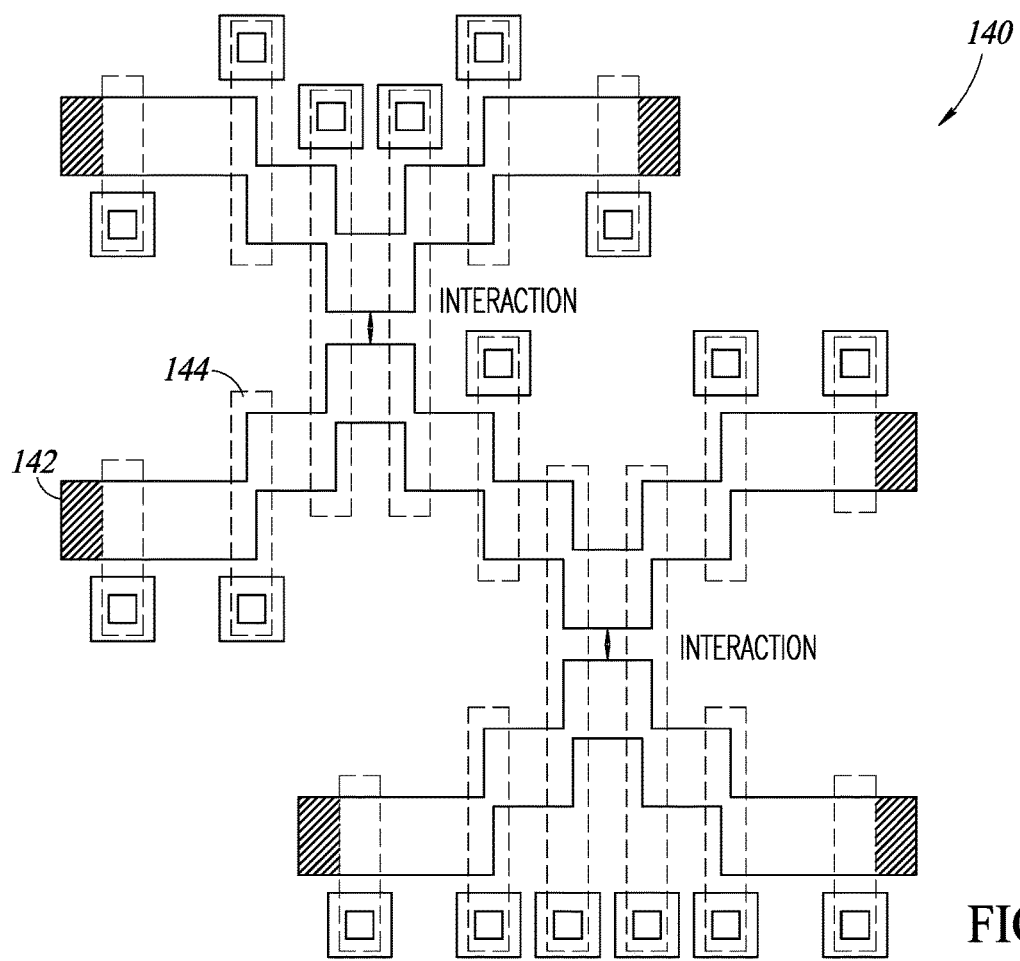
FIG. 8 is a diagram illustrating an example z quantum shift register quantum interaction gate using planar process with tunneling through a local depletion region.

Double-V and multi-V quantum interaction structures can also be implemented with qubits and qdots with tunneling through a depletion region. A diagram illustrating an example z quantum shift register quantum interaction gate using planar process with tunneling through a local depletion region is shown in FIG. 8. The quantum interaction gate, generally referenced 140, comprises a zig zag quantum shift register with two quantum interaction regions, a plurality of classic to quantum interface devices, and a plurality of control gates.

Figure 9:
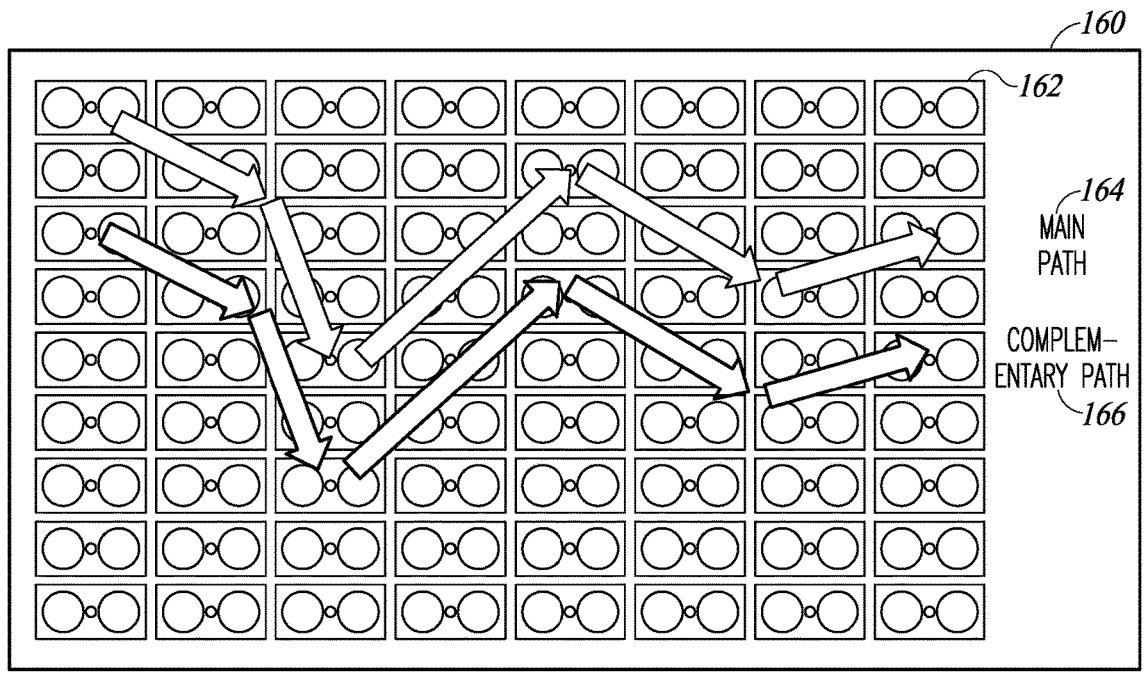
FIG. 9 is a diagram illustrating an example CNOT quantum interaction gate within a grid array of programmable semiconductor qubits.

One of the most efficient ways to build a quantum core or fabric is using a grid configuration in which the qdots are arranged in rows and columns. A diagram illustrating an example CNOT quantum interaction gate within a grid array of programmable semiconductor qubits is shown in FIG. 9. The re-configurable grid-based quantum computing structure, generally referenced 160, comprises a plurality of qubits 162 arranged in rows and columns and associated control circuitry including control signal generator (not shown). As an example, both a main path 164 and a complementary path 166 is shown programmed as indicated by the arrows. Note that the grid array of qubits can be re-programmed to implement other structures and configurations in accordance with the particular application.

Figure 10A:
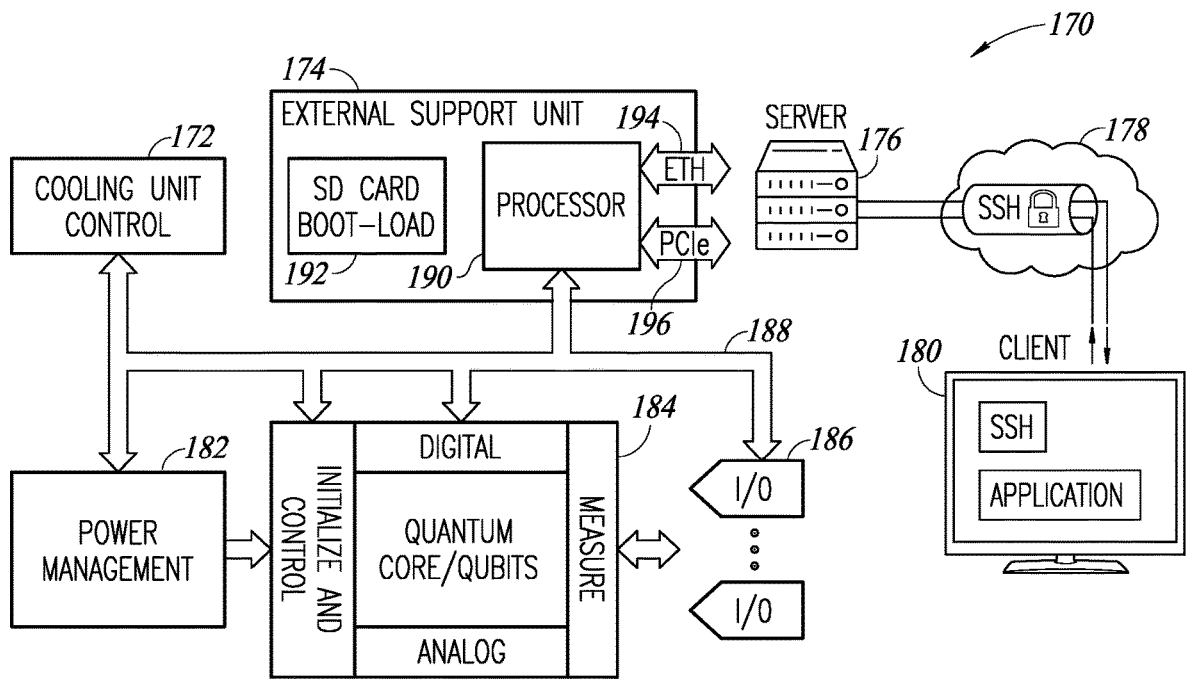
FIG. 10A is a high level block diagram illustrating a second example quantum computer system constructed in accordance with the present invention.

A high level block diagram illustrating a second example quantum computer system constructed in accordance with the present invention is shown in FIG. 10A. The quantum computer, generally referenced 170, comprises an external support unit 174, server computer 176, communications network 178, client computer 180, cooling unit control 172, communications bus 188, power management 182, quantum processing unit (QPU) 184 and I/O circuits 186. At the core of the system is the quantum processing unit 184 which comprises the quantum interaction gates, circuits, and cores and includes digital and analog sections, initialization and control section, and measurement section.

The server 176 may comprise a suitably programmed conventional computer that is linked to one or more conventional client computers 180 via a communications network 178 such as the internet using well known remote communications protocols such as secure shell (SSH). Thus clients are able to perform cloud computing using the quantum computer. The server computer interfaces with the external support unit 174 which may comprise any suitable computing device or platform such as a system on chip/field programmable gate array (SoC/FPGA) board such as the Zynq ARM/FPGA SoC development board manufactured by Xilinx, Inc., San Jose, Calif., USA. The FPGA board comprises an SD card boot loader 192, processor 190, Ethernet port 194, and PCIe port 196. The function of the FPGA board is to interface to the hardware in the system including the quantum processing unit 184 and the server 176. In addition, the FPGA board generates the signals for the serial interface, parallel interface, high speed interface, low speed interface, etc. The board typically runs an operating system (OS) such as Linux but can be any suitable OS.

Figure 10B:
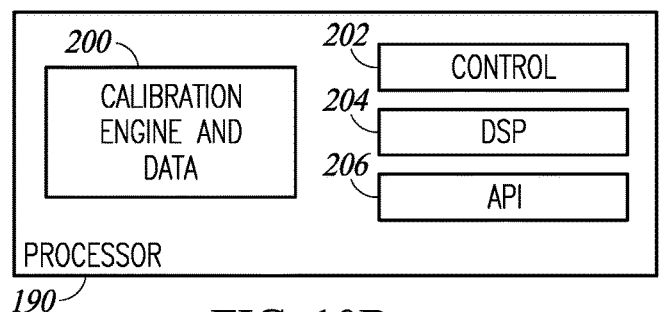
FIG. 10B is a diagram illustrating the processor of FIG. 10A in more detail.

A diagram illustrating the processor of FIG. 10A in more detail is shown in FIG. 10B. The processor 190 comprises a calibration engine and data block 200, control block 202, DSP block 204, and software API stack 206. The software stack and API controls the activities of the FPGA board which also includes software for performing calibration, data operations, and all required digital signal processing.

The FPGA board also interfaces with the cooling system via the cooling unit control block 172 accessible over the communications bus. The cooling unit controls the temperature the quantum processing unit operates at. In one embodiment, the quantum processing unit operates at 4K. The quantum computer system also comprises a power management unit 182 that functions to control the different supply voltages required by the quantum processing unit integrated circuit (IC) chip. The system also includes control I/O 186 directly from the FPGA board as well as the signal path I/Os which are generally higher frequency I/O. It is through the I/Os that data is injected into the chip 184 and detect data at the output.

The quantum processing unit (QPU) 184 comprises the quantum interaction gates, circuits, and/or cores, referred herein simply as the quantum core or quantum fabric. The quantum core(s) may comprise any number of quantum structures, e.g., qubits, qudits, etc., arranged in any desired fashion, e.g., linear array, two dimensional array, circular, etc.

Figure 11:
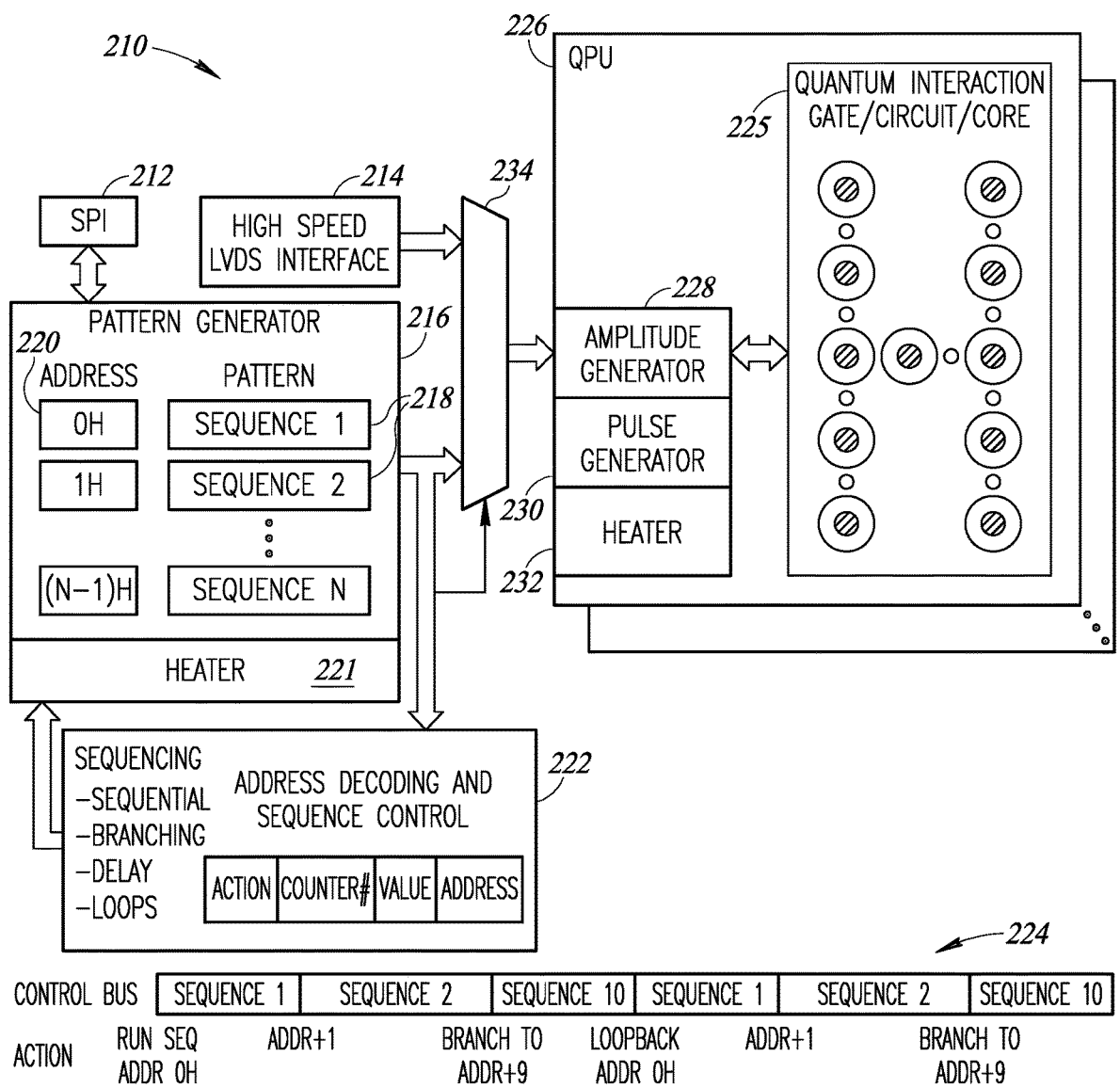
FIG. 11 is a diagram illustrating example pattern generator and sequence control circuit in more detail.

A diagram illustrating example pattern generator and sequence control circuit in more detail is shown in FIG. 11. The circuit, generally referenced 210, comprises pattern generator 216, heater 221, serial/parallel interface (SPI) 212, low voltage differential signaling (LVDS) interface 214, multiplexer 234, address decoding and sequence control block 222, and QPU 226. The QPU 226 comprises quantum core/fabric 225, amplitude generator 228, pulse generator 230, and heater 232.

The quantum core/fabric comprises a plurality of quantum cells that include a plurality of qdots, qubits, and control lines. The signals that control the quantum cell have both amplitude and pulse width characteristics. In addition, the pulse width also has element of time as each pulse begins and ends at a certain point in time and has a certain pulse width. These two characteristics of the control signals must be controlled. The function of the pattern generator is to provide the sequence of signals which ultimately are used to control the quantum core. Such control signals include, for example, reset, injectors, various imposers, and detector reference and detector signals, sampling of the output of the detector, etc. These signal pulses are generated in an appropriate sequence to properly operate the quantum core and perform quantum operations. The pattern generator comprises an array of sequences 218, i.e. sequence 1, sequence 2, . . . sequence N, each having an address 220 in memory. It is appreciated that the present invention is not limited to the pattern generator presented herein as numerous other mechanisms may be used to generate the appropriate signal sequences, including those stored in a memory.

A quantum command pointer (i.e. analogous to a program counter) is maintained and program execution or flow is established. Address decoding and sequence control block 222 functions to convert each sequence into an action, counter, data value, and address. The sequencing circuit is capable of sequential command execution, branching, delays, looping, and any other desired operations. An example sequence execution 224 is provided starting at address 0 with sequence 1. Sequence 2 is then executed which causes a branch to address+9 with sequence 10. A loopback to address 0 and sequence 1 occurs and the sequence execution repeats.

Figure 12:
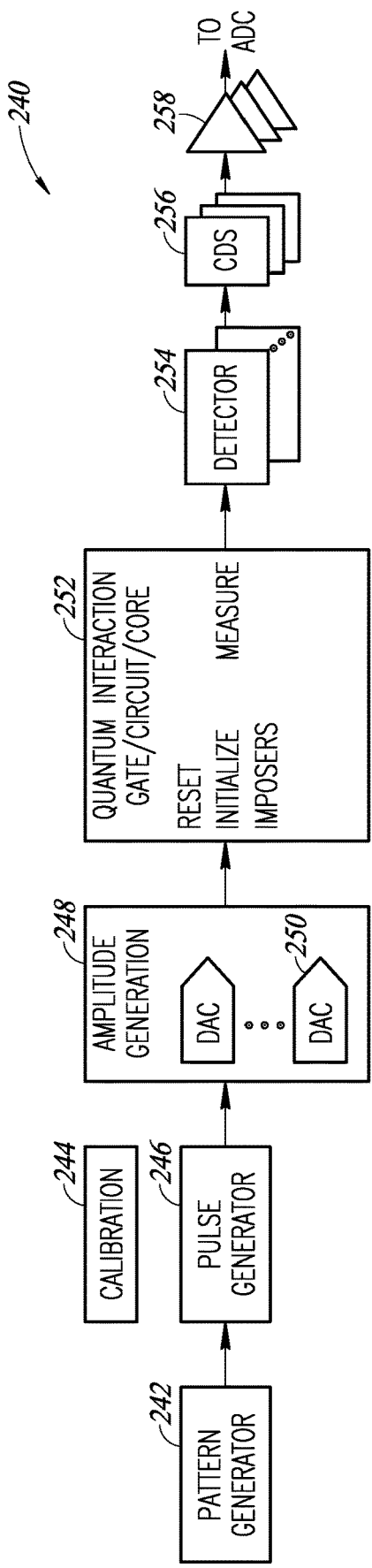
FIG. 12 is a diagram illustrating an example signal generation and control path.

A diagram illustrating an example signal generation and control path is shown in FIG. 12. The signal path, generally referenced 240, comprises programmable pattern generator 242, pulse generator 246, amplitude generation 248, quantum core 252, detector 254, correlated double sampling (CDS) 256, and buffer/amplifier 258. Initially, the pattern generator creates some pattern as represented by a series of sequences from commands received from the external support unit (ESU). In one embodiment, each sequence comprises an ordered array of zeros and ones. Pattern data from the sequences is provided to the pulse generator that functions to covert sequences of zeros and ones into digital pulses. The amplitude generator, via DACs 250, converts the digital signals to analog levels, e.g., tens or hundreds of millivolts. The analog levels generated are those required by the quantum core.

Thus, the programmable pattern generator creates the digital sequence while the pulse generator and amplitude generator create the implementation of the pulse sequence with analog circuits. The amplitude control controls the actual amplitude of the signals output to the quantum cell/core 252. By having the pulse generation cascaded with amplitude generation, both the amplitude and pulse width of the signal is controlled. The signal is then input to the quantum cell which has the four functions including reset, inject, impose, and measure/detect. Detectors 254 at the output convert the quantum state back into a classic circuit signals. After detection, a sampling CDS is performed. After sampling and amplification circuitry, the signal is converted to digital via analog to digital converters (ADCs) where the output can then drive digital circuits.

Note that alternatively, the sequences to be executed may be generated from memory rather than the ESU and pattern generator. In this embodiment, the sequences are retrieved from memory and then decoded and executed to control the quantum core.

Figure 13:
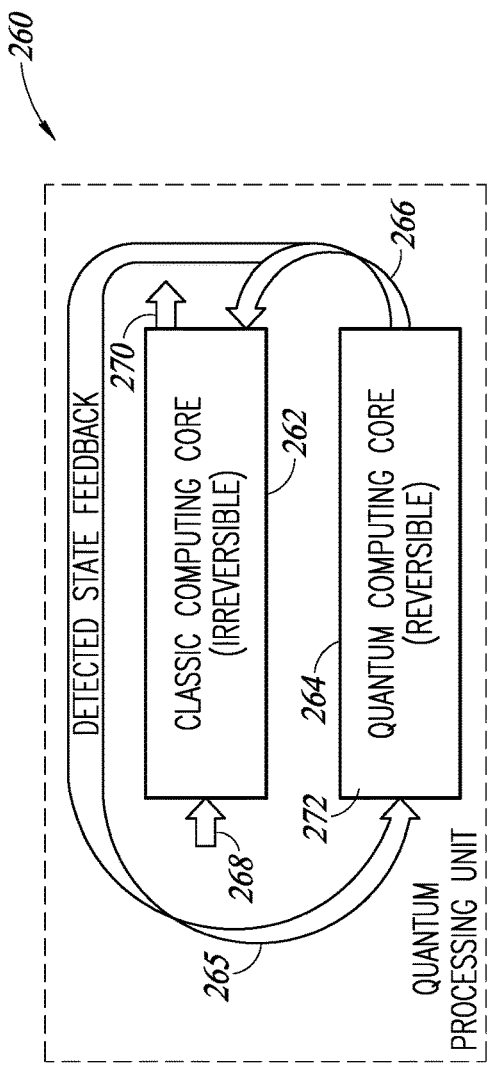
FIG. 13 is a high level block diagram illustrating an example quantum processing unit.

A high level block diagram illustrating an example quantum processing unit is shown in FIG. 13. In one embodiment, the quantum processing unit, generally referenced 260, is a quantum machine comprising two components, namely a classic computing core 262 and a quantum computing core 264. In addition, a detected state feedback loop or path is provided from the quantum computing core to detection and injection back into the quantum state such that the effective decoherence time of the quantum state is increased.

The quantum computing core is a reversible circuit meaning that it is possible to go to the computing outputs 266 from inputs 265, but it is also possible to go backwards, i.e. from the outputs and to the computing inputs. Only quantum computers, and some rare specialized reversible classical computers, are capable of this. The classic portion of the quantum machine is irreversible meaning that it is generally not possible to calculate the input 268 from only the output 270.

Figure 14:
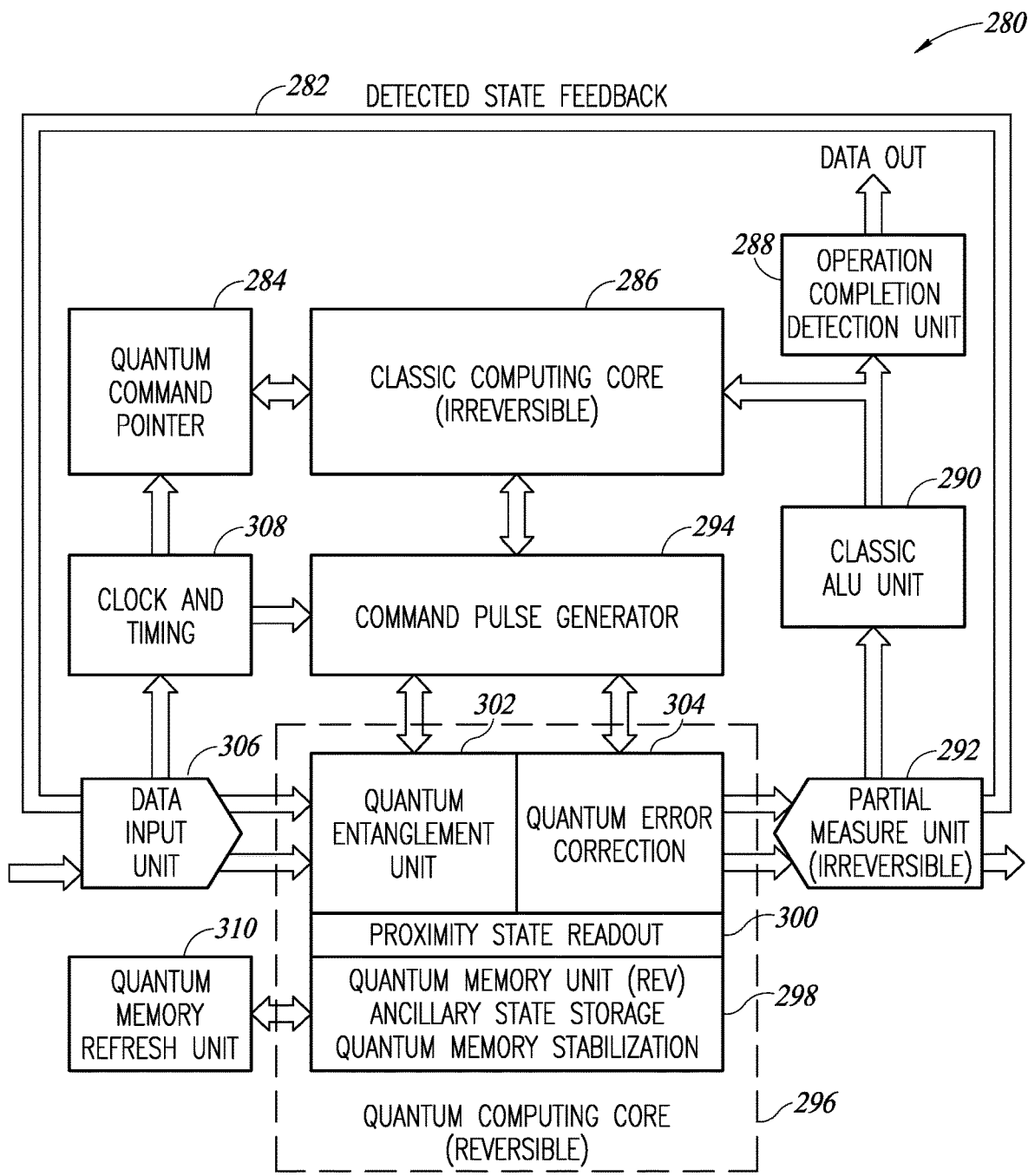
FIG. 14 is a high level block diagram illustrating an example quantum processing unit in more detail.

A high level block diagram illustrating an example quantum processing unit in more detail is shown in FIG. 14. The quantum processing unit, generally referenced 280, comprises an irreversible classic computing core 286, clock and timing circuit 308, command pulse generator 294, quantum command pointer 284, data input unit 306, quantum computing core 296, quantum memory refresh unit 310, classic arithmetic logic unit (ALU) 290, partial measurement unit 292, and operation completion detection unit 288. Quantum computing core 296 comprises quantum entanglement circuit 302, quantum error correction circuit 304, proximity state readout circuit 300, and quantum memory unit/ancillary state storage/quantum memory stabilization circuit 298.

Note that the classic computing core 286 is separate from the external support unit 12 (FIG. 1) which comprises a classic computing device such as a PC, FPGA, etc., i.e. an external classic computing core. In one embodiment, the QPU comprises a classical digital portion that includes a computing core, i.e. an internal classic computing core, on the same monolithic structure as the quantum computing core.

In order to perform quantum operations on quantum states, a relatively long decoherence time of the quantum states in the one or more quantum cores is desired. Otherwise, the quantum states may be lost and quantum operations would not be able to be successfully performed. Thus, it is preferable to have as long a decoherence time of the quantum state.

In one embodiment, a feedback loop (detected state feedback loop 282) is used to perform a partial measurement of the quantum cell or unit. This is analogous to a refresh process in a dynamic memory system, but rather with quantum operations. Given a quantum state, once the quantum state is read, the state collapses and it is thus gone. Once it is read, no further quantum operations can be performed on it. What is done instead, however, is that a partial read is performed which does not collapse the entire quantum state. A portion of the qubits are chosen selectively that are read. After detecting these qubits, the information is injected back into the classic computing core which then generates data output. That information can also be fed back to the data input unit 306 to be re-injected into the quantum state in the quantum computing core. Thus, by partially reading the quantum state and re-injecting the read data back into the quantum state, the data is refreshed and so a much longer decoherence time in the quantum computer or the quantum core is achieved. Note that employing partial quantum state detection combined with a feedback loop can be done regardless of the particular architecture used to implement individual qubits and qdots in the quantum core.

Note that to operate the quantum computing core, command pulses (block 294) are needed because both the classic and quantum computing cores require electronic control signals. Thus, appropriate clocks are required. The clock and timing circuit 308 generates a reference clock that is used to generate command pulses that control both the classic and the quantum computing cores.

The quantum command pointer 284 is used to execute algorithms. This provides a notion of a command pointer or program counter as in a classic processor. The data input unit 306 functions as an injector to the core. The system also comprises measurement circuits for detection and generates command pulses similar to the imposers. Measuring one or more qubits yields classical electronic signals that are input to a classic ALU 290 for performing computations with detected outputs. The output of the ALU can be injected back into the classic computing core to change the way in which the quantum computing core is driven. Providing a path from the detection circuitry through a classic ALU and then back into the classic computing core enables the error detection and error correction.

The quantum entanglement unit 302 functions to receive the signals that drive the one or more quantum cores towards entanglement. It typically comprises a plurality of control gates and imposer structures. The quantum error correction 304 attempts to correct errors that occur on the quantum side. The quantum computing core itself comprises various quantum interaction gates, circuits, and/or cores, including for example combinations of CNOT, Tofoli, ancillary, Pauli, Hadamard, etc.

Note that quantum operations are typically not single calculations because quantum computing is mostly probabilistic computing. In order to obtain a quantum result, the quantum computation is performed multiple times and the probability of the result is determined. Then a decision is made based on the statistics of the result. The operation completion detection unit 288 functions to determine that the quantum operation was performed a sufficient number of times and an output decision is made. The output of the operation completion detection unit is the output data.

In operation, input data is provided in general from the outside world. For example, consider performing a search of a quantum database to find a specific combination. In this case, the entire database is loaded into one or more quantum cores. The quantum machine then performs a quantum search. The output results of the search should be a pattern of ones and zeros located at a certain position. In another example, consider a search to find the density of a state in a database. Thus, to implement quantum operations to generate an output requires input data. The output of the operation completion detection unit indicates that the quantum measurement is complete and the result is available.

Figure 15A:
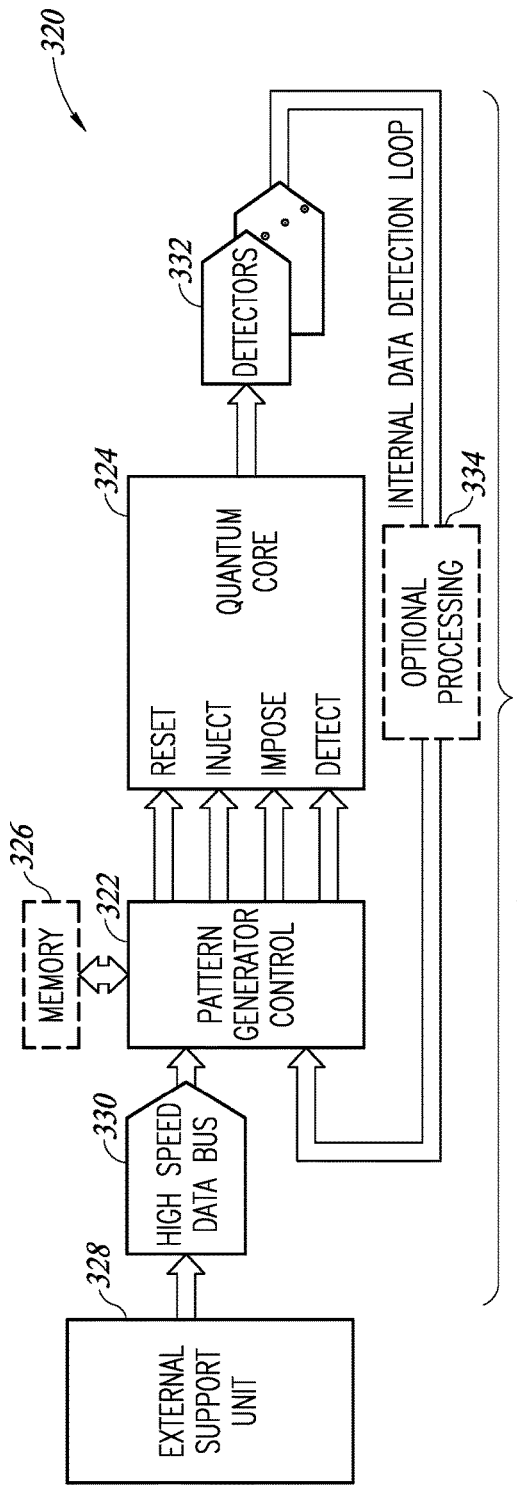
FIG. 15A is a high level block diagram illustrating an example internal data detection loop.

A high level block diagram illustrating an example internal (i.e. local) data detection loop is shown in FIG. 15A. The circuit, generally referenced 320, comprises one or more quantum cores 324, programmable pattern generator 322, memory 326, high speed data bus 330, external support unit (ESU) 328, detectors 332, and optional processing block 334.

In operation, the detectors 332 function to detect the output of a quantum operation in the one or more quantum cores. Various operations can then be performed with the outputs. One operation, for example, is calibration as the amplitude and pulse width of signals in the various circuits have mismatches, errors and noise associated with them. Any noise and variation of the control system will create noise in the quantum state, and therefore will create noise in the quantum detection. The present invention thus provides a mechanism for calibrating the system based on a known outcome. Based on the calibration, the different classic electric signals are adjusted such that any kind of non-ideality of the desired implementation is compensated for.

The one or more quantum cores 324 are normally driven by the pattern generator 322 control that provides the reset, inject, impose and detect signals. The output of the detector is looped back to the pattern generator in an internal (i.e. local) data detection loop. Data output of the quantum core is detected and then optionally processed 334 before it is injected back into the pattern generator 322 to impact the quantum core.

Figure 15B:
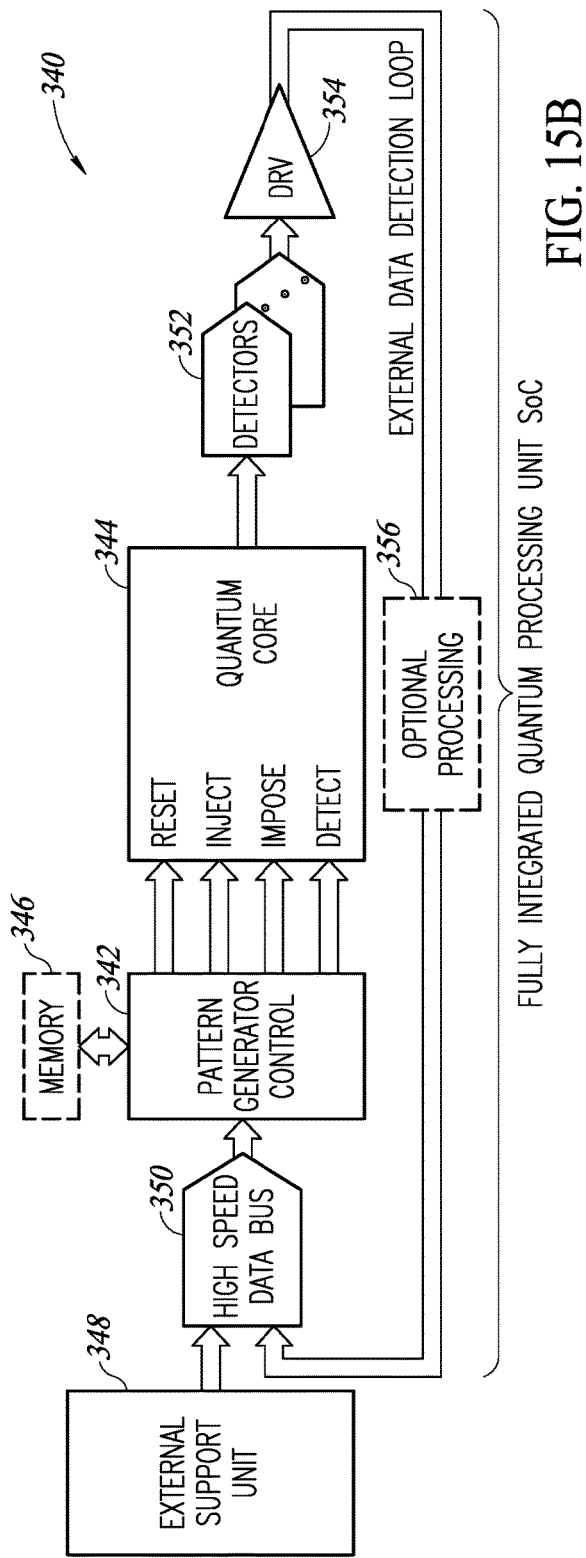
FIG. 15B is a high level block diagram illustrating an example external data detection loop.

A high level block diagram illustrating an example external data detection loop is shown in FIG. 15B. The circuit, generally referenced 340, comprises one or more quantum cores 344, pattern generator 342, memory 346, high speed data bus 350, external support unit 348, detectors 352, detected data drivers 354, and optional processing block 356.

In this embodiment, rather than use the signals directly from the detectors 352, the signals are looped externally, i.e. out of the QPU SoC but staying within the system. From the detectors, the signals are input to drivers to go off chip. Additional processing is performed and then the signals are input to the high speed data bus 350 where they are injected back into the pattern generator 342 forming an external closing of the loop.

Figure 15C:
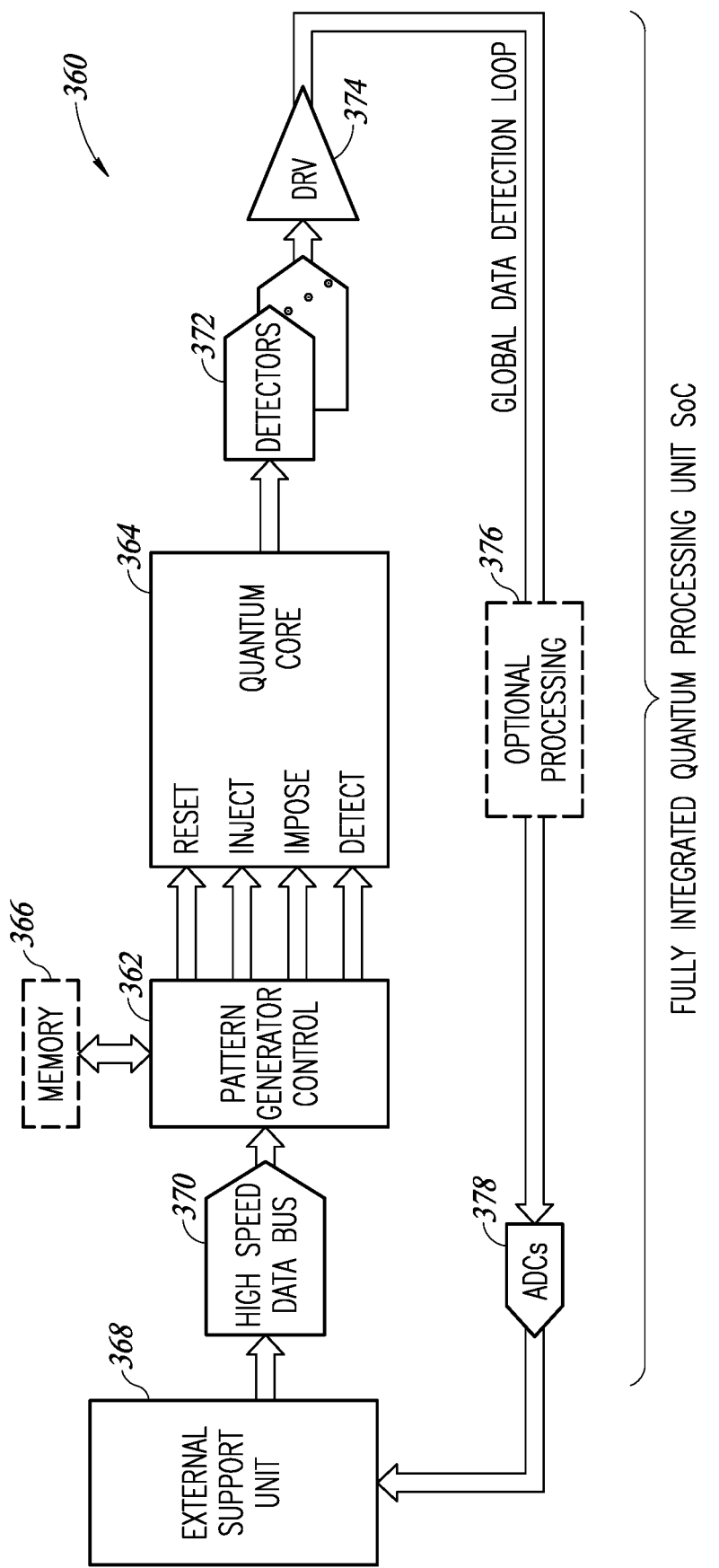
FIG. 15C is a high level block diagram illustrating an example global data detection loop.

A high level block diagram illustrating an example global (i.e. external) data detection loop is shown in FIG. 15C. The circuit, generally referenced 360, comprises one or more quantum cores 364, pattern generator 362, memory 366, high speed data bus 370, external support unit 368, detectors 372, drivers 374, optional processing block 376, and ADCs 378.

This embodiment implements a global data detection loop where data detected in the quantum core is optionally processed and then converted to digital form and output off chip to the external support unit 368 which controls the high speed data bus 370 where it is injected back into the pattern generator 362.

Thus, the system of the present invention provides three types of loops including (1) an internal (i.e. local) data detection loop; (2) an external data detection loop; and (3) a global data detection loop. Using any of these three loops, it is possible to (1) provide calibration to the one or more quantum cores; (2) provide error correction; and/or (3) perform the main quantum operation that provides output results. Note that the calibration loops may be implemented on the same or separate integrated circuit chips.

The feedback loops described supra are normally part of the architecture of the QPU. They all utilize the same infrastructure, but they generate different decisions that impact different circuit blocks. The architecture of the QPU provides for data to be input to the external support unit. An auxiliary input is input to the high speed data bus as well as to the pattern generator. The feedback signal from the detector is multiplexed in one embodiment to (1) the pattern generator; (2) high speed data bus; or (3) external support unit to create the three feedback paths, i.e. internal, external, and global, respectively. This is possible as a result of the re-programmability of the QPU and the ESU. The objective is to have a single universal quantum core.

In one embodiment, circuit 320 is mainly used for calibration, while circuit 340 is mainly used for calibrating the difference in propagation time in the high speed data, and circuit 360 is mainly used for global error correction that goes through the ESU. Note that circuits 320 and 340 can also be used for internal quantum error correction. Thus, these circuits can perform both calibration and quantum error correction. In addition, each can be used as part of the quantum operation where a subset of the results are read and fed back to refresh the quantum cell. During quantum operations, one or more quantum computations are performed, data is processed and it is assumed that the system is calibrated and accurate.

Figure 16A:
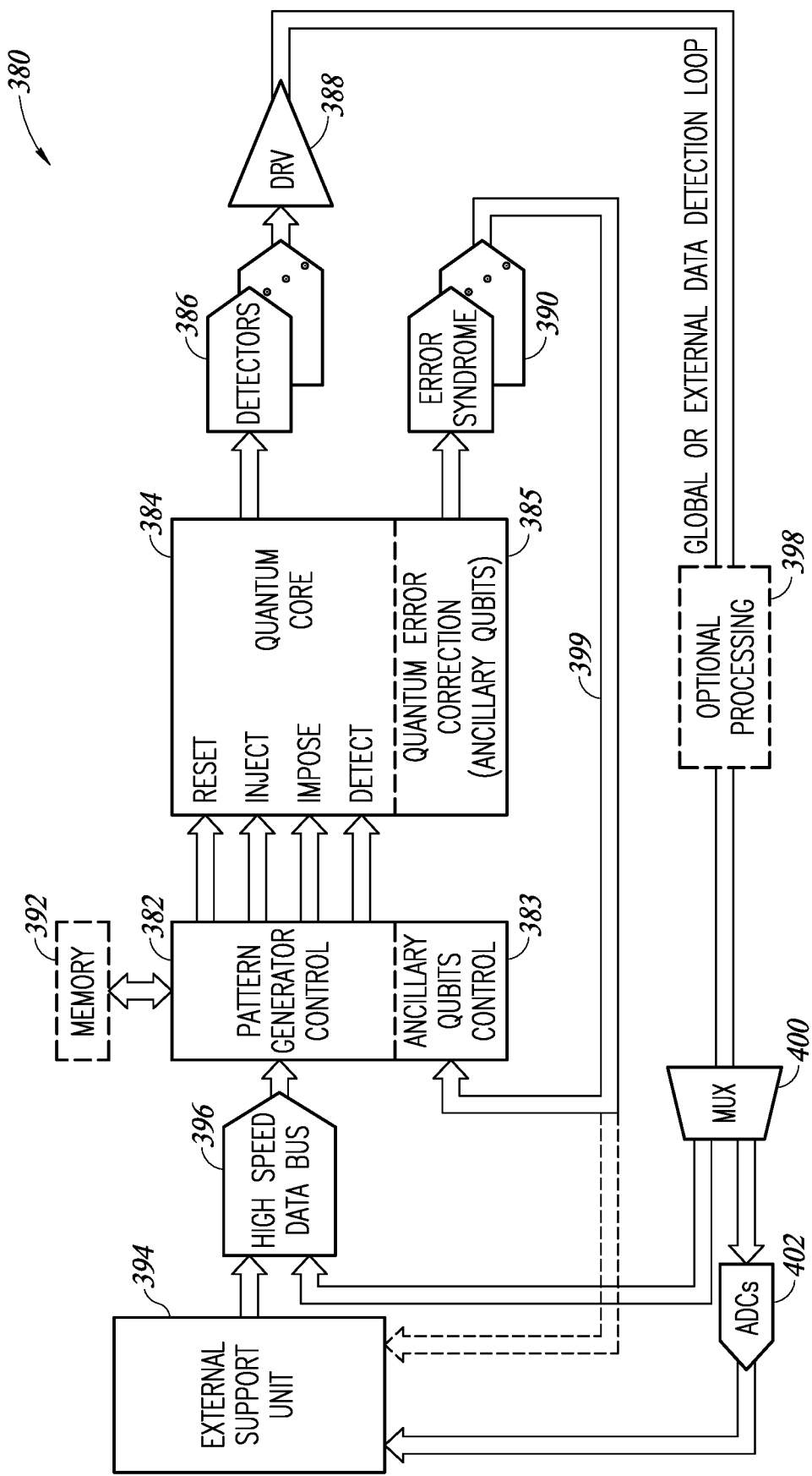
FIG. 16A is a high level block diagram illustrating an example error correction loop.

A high level block diagram illustrating an example error correction loop is shown in FIG. 16A. The circuit, generally referenced 380, comprises one or more quantum cores 384 including quantum error correction (ancillary qubits) 385, error syndromes 390, pattern generator control 382 including ancillary qubit control 383, memory 392, high speed data bus 396, external support unit 394, detectors 386, drivers 388, optional processing block 398, analog multiplexer 400, and ADCs 402.

Consider one or more quantum cores having a plurality of qubits. Error correction is performed by adding ancillary qubits, i.e. Hadamard qubits in equal probability distribution, and using them as part of the entire quantum state. The Hadamard qubits are processed and detected to yield an error syndrome from which a decision is made. In one embodiment, the quantum core is driven by the pattern generator that provides the voltage control signals having specific amplitudes and pulse widths that control the quantum core. The resulting error syndrome is fed back in an internal loop 399 to the pattern generator which functions to adjust the amplitude and pulse width such that the errors in the quantum operation are corrected. Thus, the detected signals are looped back to perform quantum error correction.

The quantum core and the detectors are divided into sections. One of which is the quantum error correction section 385 that comprise ancillary bits or qubits dedicated specifically to quantum error correction. The remainder of the qubits are "payload" qubits that perform the quantum operation itself. The output of the detectors 386 from the main quantum core that is performing the quantum operation is looped to different points via multiplexer 400 after optional processing 398, including (1) high speed data bus 396 with optional ADCs or (2) externally to ADCs 402 and ESU 394.

Figure 16B:
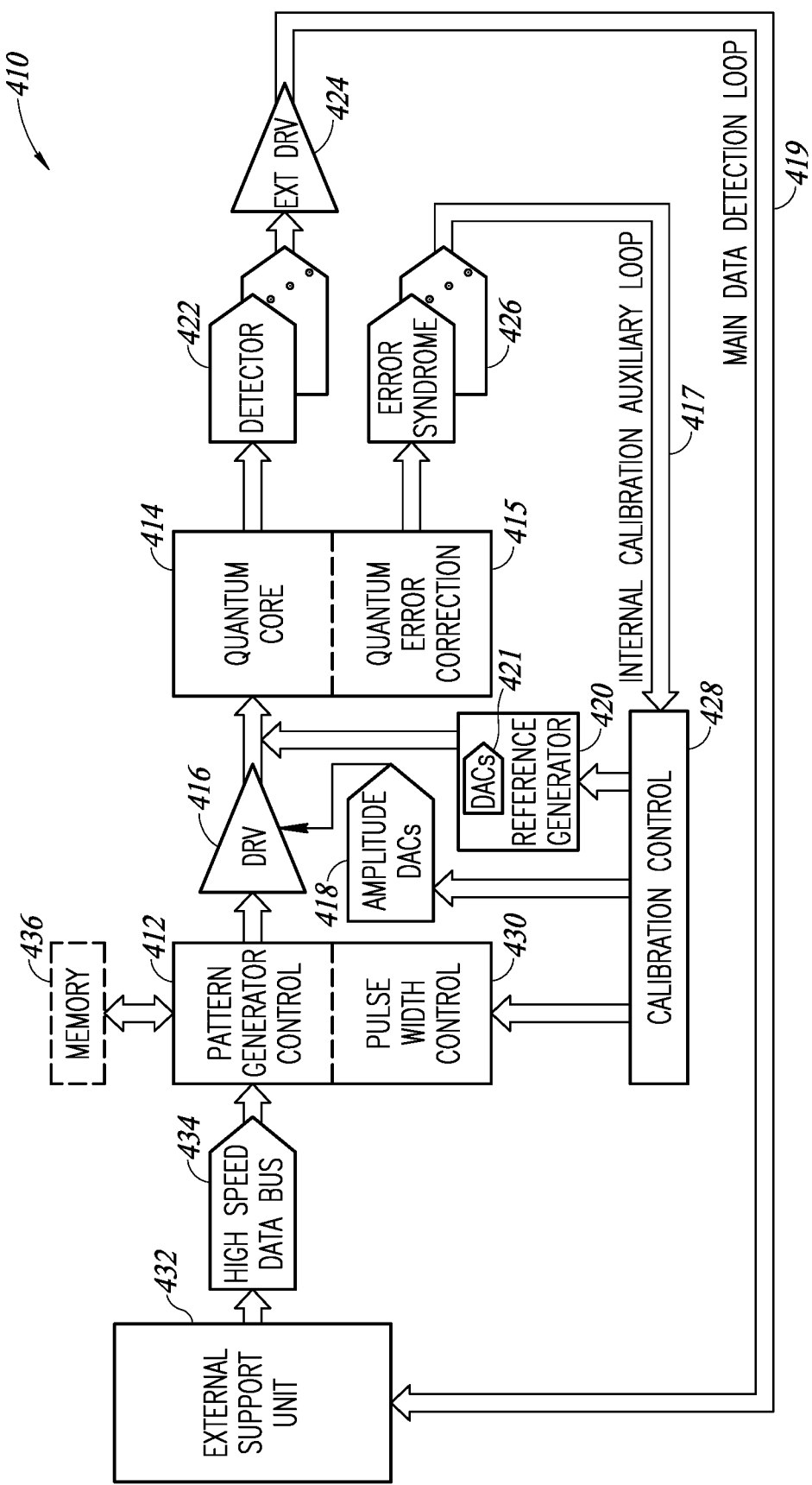
FIG. 16B is a high level block diagram illustrating an example internal calibration loop.

A high level block diagram illustrating an example internal calibration loop is shown in FIG. 16B. The circuit, generally referenced 410, comprises one or more quantum cores 414 including quantum error correction 415, error syndromes 426, memory 436, high speed data bus 434, external support unit 432, detectors 422, drivers 416, 424, pattern generator control 412, pulse width control 430, amplitude DACs 418, reference generator 420 and DACs 421, and calibration control 428.

Calibrating the quantum core implies possibly modifying any of the reset, inject, impose, detect signals each having amplitude and pulse width parameters as well as baseline and log reference points. Thus, three signal parameters are calibrated, including (1) amplitude, (2) pulse width, and (3) reference level. In this embodiment, the error syndromes are input to an internal calibration control circuit 428 that functions to change the code that determines (1) pulse width via pulse width control 430; (2) amplitude via amplitude DACs circuitry 418; and (3) reference level via reference generator 420, such that the error syndrome will correspond to an error free operation.

In one embodiment, the error syndromes are used to compute correction control signals in the programmable pattern generator for a quantum computing path that functions to de-rotate and scale the quantum state in both amplitude and phase in order to correct for detected errors before detection of data on the main path is performed.

Consider a delay in time or a pulse width variation within the quantum core. Instead of the pulse width being $T_{Rabi/2}$, which corresponds to an electron going from one qdot to another, the pulse width is $T_{Rabi/2}$ minus or plus a delay. This means that the particle will no longer be fully in one specific qdot or cell, but rather will be split. When such a particle is detected, rather than getting a high probability (i.e. ~100%) of being in the output qdot, the result will be some probability of being in a different qdot. Via detection, it is possible to determine the statistic that sheds light on where the error occurred. Using the calibration control 428, the pulse width, amplitude, and/or reference voltage can be compensated for, whichever needs to be adjusted in order to create a fairly quantum error free system. Once calibration is performed, the operation to be performed on the payload qubit will be quantum accurate.

In this embodiment, the error syndrome is injected into the calibration control which functions to modify the codes for the different DACs in the control path, i.e. reference DAC, amplitude DAC, and pulse width DAC. Assuming, for example, errors due to one or more DACs not generating the correct amplitude then errors will occur due to interference/imbalance in the quantum core. The errors due to interference in the quantum core are detected and a correction is determined. Consider an external electromagnetic perturbation. One or more quantum codes are used to encode the data such that there are redundant bits. From these redundant bits, errors can be detected. Quantum codes are used in performing calculations. A parity check, for example, can be performed and if wrong, an error deemed occurred and the calculation is performed again.

Note that in this embodiment of circuit 410, the calibration is done using an internal auxiliary calibration loop 417 close to the quantum core and not through the high speed data bus 434 or the ESU 432. The main data detection loop 419 from the quantum core 414 does go through the ESU.

Figure 16C:
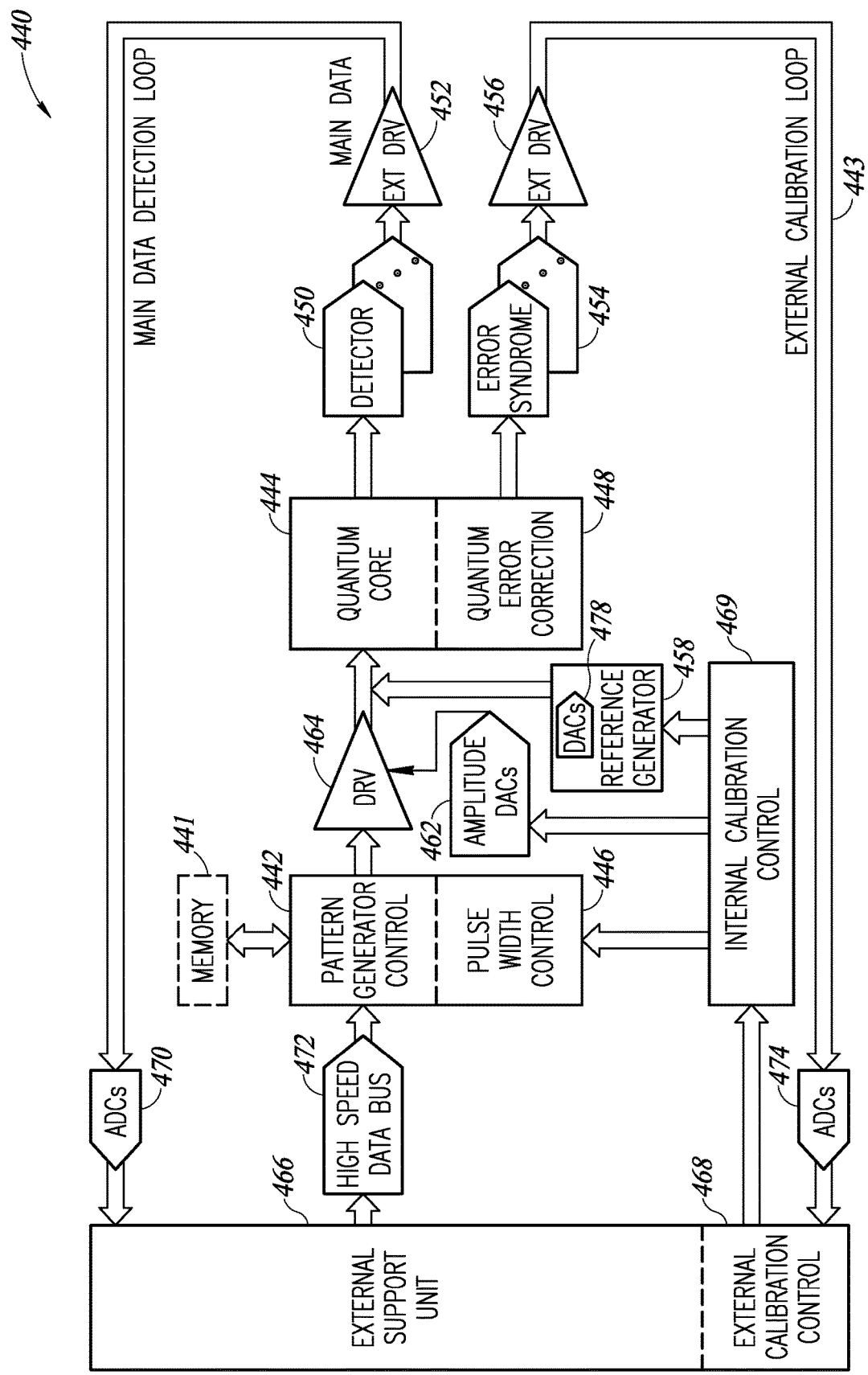
FIG. 16C is a high level block diagram illustrating an example external calibration loop.

A high level block diagram illustrating an example external calibration loop is shown in FIG. 16C. The circuit, generally referenced 440, comprises one or more quantum cores 444 including quantum error correction 448, error syndromes 454, memory 441, high speed data bus 472, external support unit 466 and external calibration control 468, detectors 450, drivers 452, 456, 464, pattern generator control 442, pulse width control 446, amplitude DACs 462, reference generator 458 and DACs 478, internal calibration control 469, ADCs 470, 474.

In this embodiment, an external calibration loop 443 is used and the error syndromes 454 are calculated from the quantum error correction block 448 with auxiliary Hadamard bits. The error syndromes are fed back to an external calibration control block 468 in the ESU 466 through an ADC 474. The external calibration control determines what and how to modify the control signals utilizing the CPU power of the ESU. The external calibration control communicates with and controls the internal calibration control 469 provides the actual control feedback for the pulse width, amplitude, and reference voltage. Thus, these three parameters of pulse width, amplitude, and reference voltage, can be controlled internally or externally via internal or external calibration loops.

Note that quantum error correction, although shown being performing internally, can also be done externally. In this case, the syndrome is pushed to either the internal classic computing core or the ESU which performs the calculation and injects back correction commands and/or data to correct any errors. Thus, both quantum error correction and calibration can be internal or external. In addition, they use any of the internal, external, and global feedback looping as shown in FIGS. 15A, 15B, and 15C, described in detail supra.

Figure 17A:
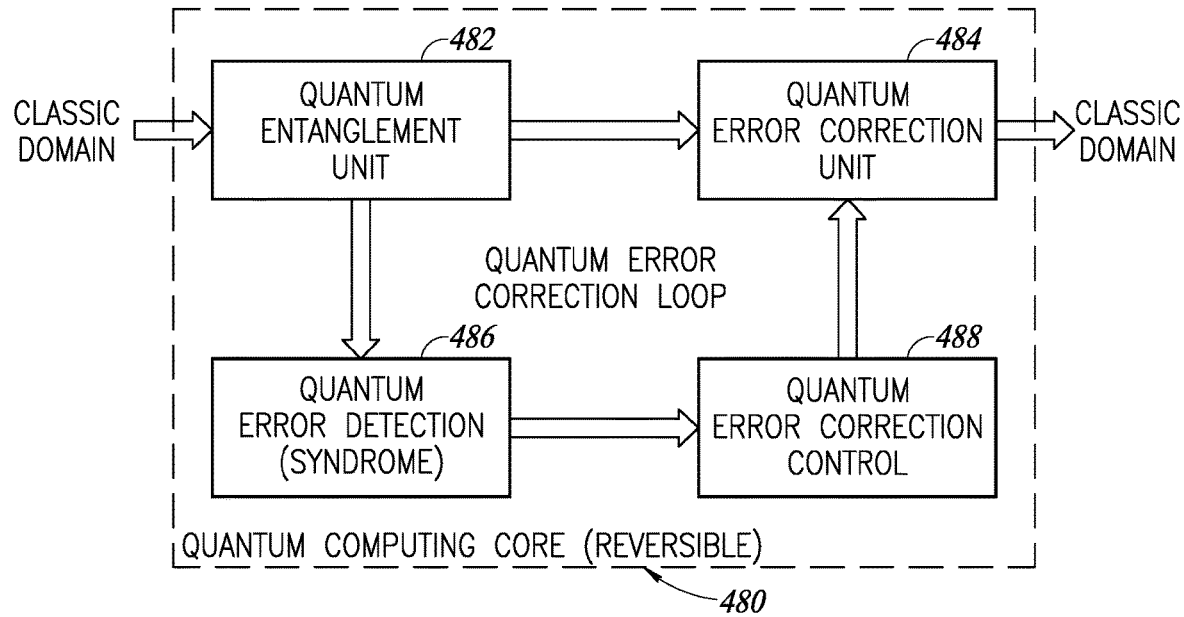
FIG. 17A is a high level block diagram illustrating a first example quantum error correction loop.

A high level block diagram illustrating a first example quantum error correction loop is shown in FIG. 17A. The circuit, generally referenced 480, comprises quantum entanglement unit 482, quantum error correction 484, quantum error detection (syndrome) 486, and quantum error correction control 488.

Two types of error correction are possible: (1) feedforward error correction, or (2) feedback error correction. The quantum entanglement unit 482 functions to configure the controls for the quantum structure to perform the quantum operation. The controls, however, may be inaccurate or in error. For example, there may be different shifting of pulses, different errors in the amplitude, pulse width, etc. Therefore any operation performed in the quantum entanglement unit may generate one or more errors which need to be corrected. Correcting the errors may be performed after the operation. Thus, the quantum entanglement unit is followed by the quantum error correction unit 484. In this case, it is performing forward error correction since it is after the quantum entanglement unit. The error is detected by the quantum error detection 486 which computes the error syndromes which is a classic signal, e.g., zeros and ones. The pattern of the zeros and ones, however, indicate where the quantum state was in error. Based on the syndrome, the quantum error correction control functions to calculate what is needed to correct for the errors that occurred.

Figure 17B:
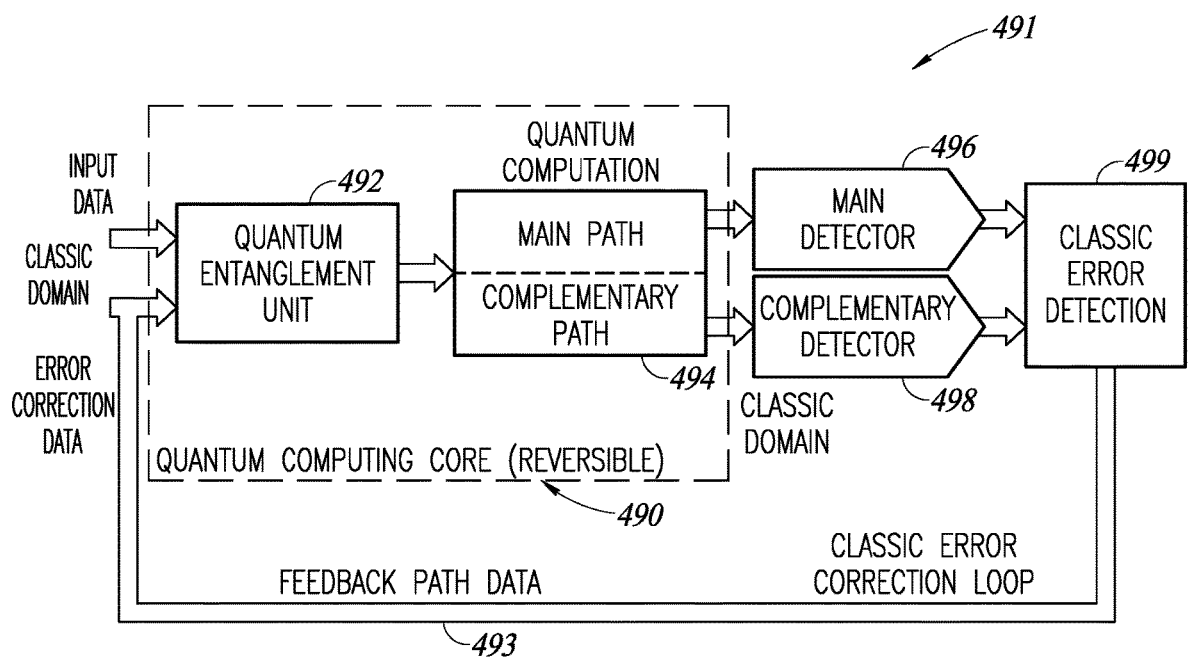
FIG. 17B is a high level block diagram illustrating a second example quantum error correction loop.

A high level block diagram illustrating a second example quantum error correction loop is shown in FIG. 17B. The circuit, generally referenced 491, comprises quantum computing core 490 which includes quantum entanglement unit 492, quantum computation 494 including main and complementary paths, main detector 496, complementary detector 498, and classic error detection 499.

In this case, feedback error correction is performed whereby the quantum entanglement unit 492 functions to configure the controls for the quantum structure to perform the quantum operation. The controls, however, may be inaccurate or in error. For example, there may be different shifting of pulses, different errors in the amplitude, pulse width, etc. Therefore any operation performed in the quantum entanglement unit may generate one or more errors which need to be corrected.

Note that the main signal path is accompanied by a complementary signal path. The paths are symmetric (i.e. complementary) and the electron can only be at one end of an active well. The quantum computation is split into two paths: a main path and a complementary path. There is a main detector for the main path as well as complementary detector for the complementary path. In general, the electron is present either in the main path or in the complementary path.

If in a quantum operation there is no electron in the main path and no electron in the complementary path then it can be inferred that something went wrong with the operation and hence an error is detected. The two detectors 496, 498 in combination with the classic error detection 499 determine whether an error occurred. The output of the two detectors should be either 1 and 0 or 0 and 1. If 0 and 0 or 1 and 1 is received, then an error is declared. The output of the classic error correction block 499 is fed back via feedback path data 493 to the quantum entanglement unit such that the operation is completed without considering that the data was in error.

Figure 17C:
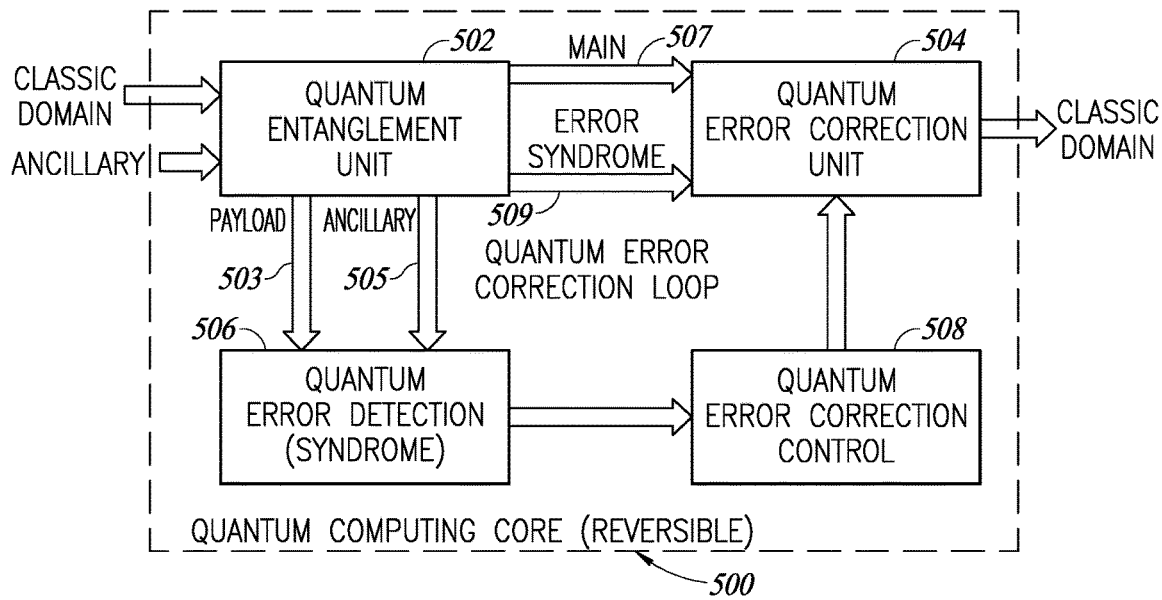
FIG. 17C is a high level block diagram illustrating a third example quantum error correction loop.

A high level block diagram illustrating a third example quantum error correction loop is shown in FIG. 17C. The circuit, generally referenced 500, comprises quantum entanglement unit 502, quantum error correction 504, quantum error detection (syndrome) 506, and quantum error correction control 508.

In operation, classic data/control is input to the quantum entanglement unit 502. In addition, ancillary qubits, i.e. Hadamard equal distribution state, are also injected into the quantum entanglement unit. From that point on, the data is split into main data path 507 and the error syndrome calculation data 509 which is used to perform quantum error correction by 504. The payload path 503 and ancillary path 505 are input to the quantum error detection 506. Note that the circuit 500 is of feedforward error correction type as errors are corrected after quantum entanglement thus implementing a complete quantum domain error correction mechanism.

The Hadamard state is a state having an equal distribution. A qubit that is placed in the Hadamard state is 50% on one qdot and 50% on the other. This can be considered the equivalent of a zero or a perfect balance. When a quantum computation is performed, the statistic of the output is considered. If, for example, the output is 51% on one side and 49% on the other, then a decision of '1' is made. If, however, the output is 50/50, a decision cannot be made. Thus, the Hadamard is analogous to the neutral state for a quantum operation. To compute an error syndrome, ancillary or Hadamard states are injected and the same quantum operation is performed on them. At the output, a neutral code is expected. If, however, the output code has some combinations of 0 and 1, the location of the zeros and ones indicate where the error occurred. Thus, the error syndrome can be used to determine where the error was made so that it can be compensated and corrected for.

Figure 17D:
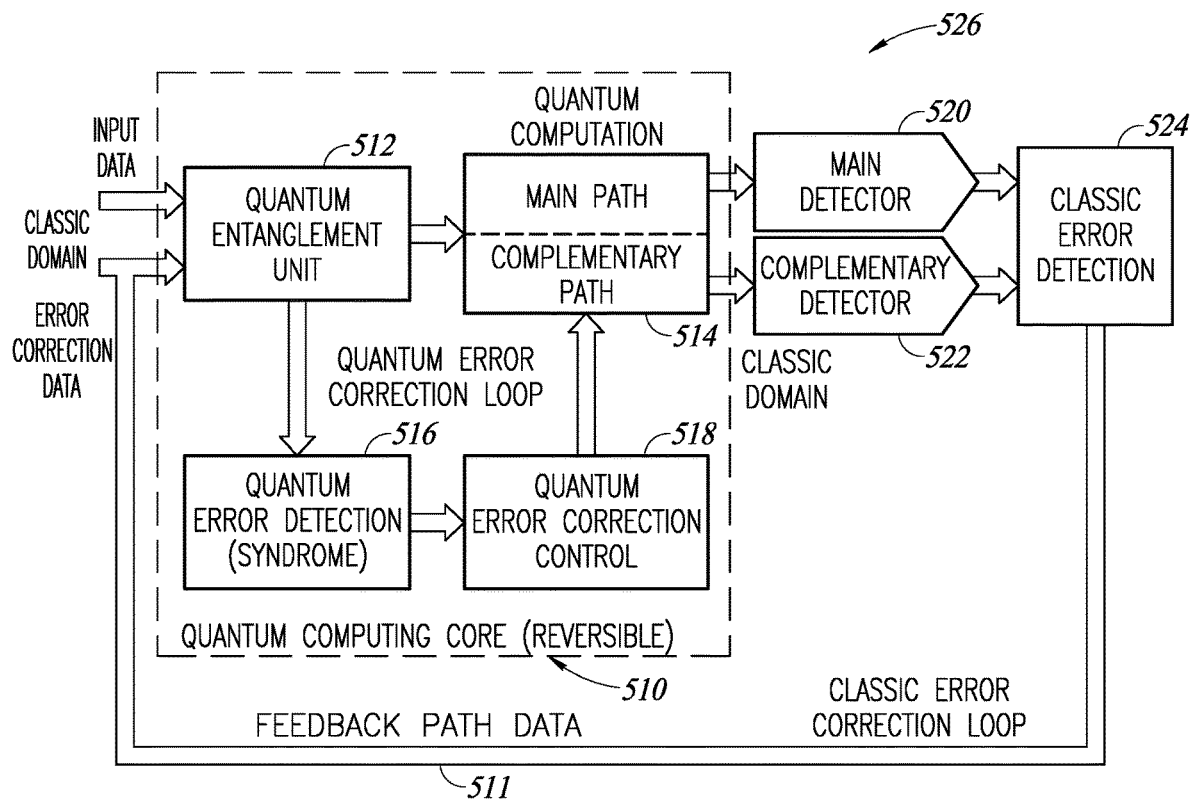
FIG. 17D is a high level block diagram illustrating a fourth example quantum error correction loop.

A high level block diagram illustrating a fourth example quantum error correction loop is shown in FIG. 17D. The circuit, generally referenced 526, comprises quantum computing core 510 which includes quantum entanglement unit 512 for configuring controls to perform operations on quantum states therein, quantum computation 514 including main and complementary paths, main detector 520, complementary detector 522, classic error detection 524 for generating correction feedback data input to the quantum entanglement unit, quantum error detection (syndrome) 516 for detecting errors in quantum computations in the quantum entanglement unit and utilizing ancillary states to calculate error syndromes, quantum error correction control 518 to determine corrections to apply to the quantum states, and quantum error correction unit (not shown) in the main and complementary path to output correcting errors in accordance with the corrections from the quantum error correction control unit.

Similar to the circuit 490 (FIG. 17B), the circuit implements a feedback error correction mechanism. Both circuits 490, 510 are hybrid error correction schemes where the error detection occurs in the classic world (classic error detection 524) and the results are fed back (feedback path data 511) to the quantum entanglement unit 512 to compensate for the errors in the quantum states. Note that the quantum entanglement unit is the portion of the quantum structure that creates the control required for a given quantum operation, e.g., imposers, etc.

Figure 18:
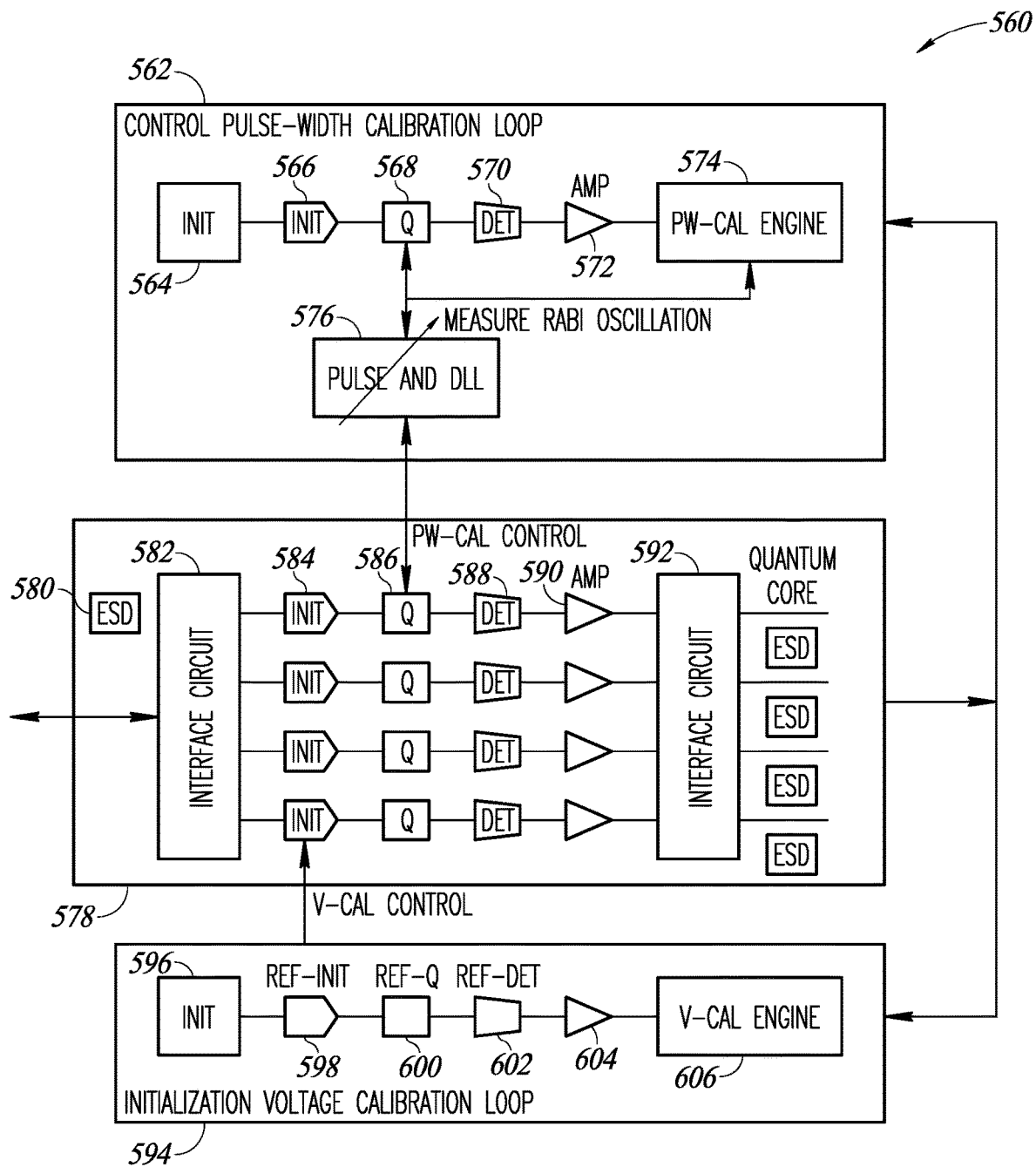
FIG. 18 is a high level block diagram illustrating an example calibration mechanism.

A high level block diagram illustrating an example calibration mechanism is shown in FIG. 18. The circuit, generally referenced 560, comprises a pulse width calibration control circuit 578, a control pulse width calibration loop 562, and an initialization voltage calibration loop 594. The pulse width calibration control circuit 578 comprises electrostatic discharge (ESD) blocks 580, interface circuits 582, 592, initialization circuits 584, quantum state 586 of the quantum structure, detectors 588, and amplifiers 590. The control pulse width calibration loop 562 comprises initialization circuits 564, 566, quantum state 568 of the quantum structure, detector 570, amplifier 572, pulse width calibration engine 574, and pulse and delay locked loop (DLL) 576 for measuring Rabi (occupancy) oscillation periods. The initialization voltage calibration loop 594 comprises initialization circuits 596, 598, quantum state 600 of the quantum structure, detector 602, amplifier 604, and voltage calibration engine 606. Note that the calibration loops 562, 594 may be internal or external for both amplitude and pulse width of the control signals.

Figure 19:
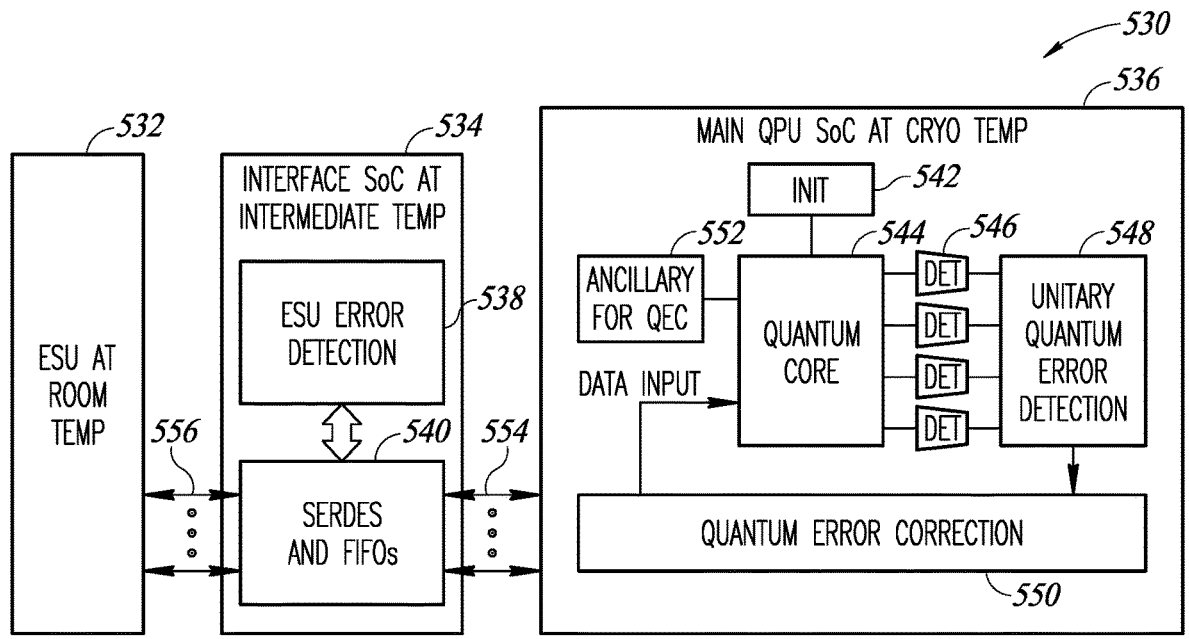
FIG. 19 is a high level block diagram illustrating example temperature distribution in a quantum computer.

A high level block diagram illustrating example temperature distribution in a quantum computer is shown in FIG. 19. In one embodiment, the quantum machine of the present invention operates at multiple temperatures. The quantum processing unit (QPU) typically operates at the lowest temperature, e.g., 4K. Preferably, the low temperature is provided only to the circuits that require it. Otherwise, excess power is dissipated that will heat up the quantum core which can decohere the quantum state. Thus, it is preferable to have the minimum amount of computation and circuitry at the lowest temperature and to perform less critical but more power hungry operations at a higher temperature.

Thus, the main QPU SoC 536 is maintained at the cryo temperature below approximately 20K, e.g., 4K. The main QPU SoC comprises one or more quantum cores 544, detectors 546, error detection 548 and correction loop 550 that needs to be at the lowest temperature. The high speed interface transfers data coming from the external support unit (ESU) which is preferably prepped before it is injected into the QPU. It is not desirable to have much power dissipation in the classic computing portion of the quantum machine at the lowest temperature. Thus, the quantum machine can have two different temperatures: a low (e.g., cryo) and high (e.g., room) temperature. In this case, the classic processing of the data is performed at the higher temperature. Alternatively, the quantum machine can have three different temperatures: a low (e.g., cryo), intermediate, and high (e.g., room) temperature. In this case, the ESU 532 and the classic CPU, e.g., PC, FPGA, etc., operates at room temperature. So ESU functions to pump the high frequency data, listen for high frequency feedback signals, and handle the low frequency handshake between the classic world and the quantum world. The interface SoC including classic CPU error detection, serializer/deserializer (SERDES), and FIFOs operate at an intermediate temperature. The main QPU operates at the cryo temperature.

Examples for the intermediate temperature include is 20K or 77K but may be any other temperature. Note that the freezing point of nitrogen is 77K. The freezing point of helium is 4K. Note also that the intermediate temperature is preferably not colder than the freeze-out temperature of silicon which is in the range of 30 to 35° K. This ensures that the classic circuits in the system operate properly and without any unnecessary countermeasures. Typically, commercial chillers have multiple stages and thus provide cooling at two or more temperatures.

Figure 20:
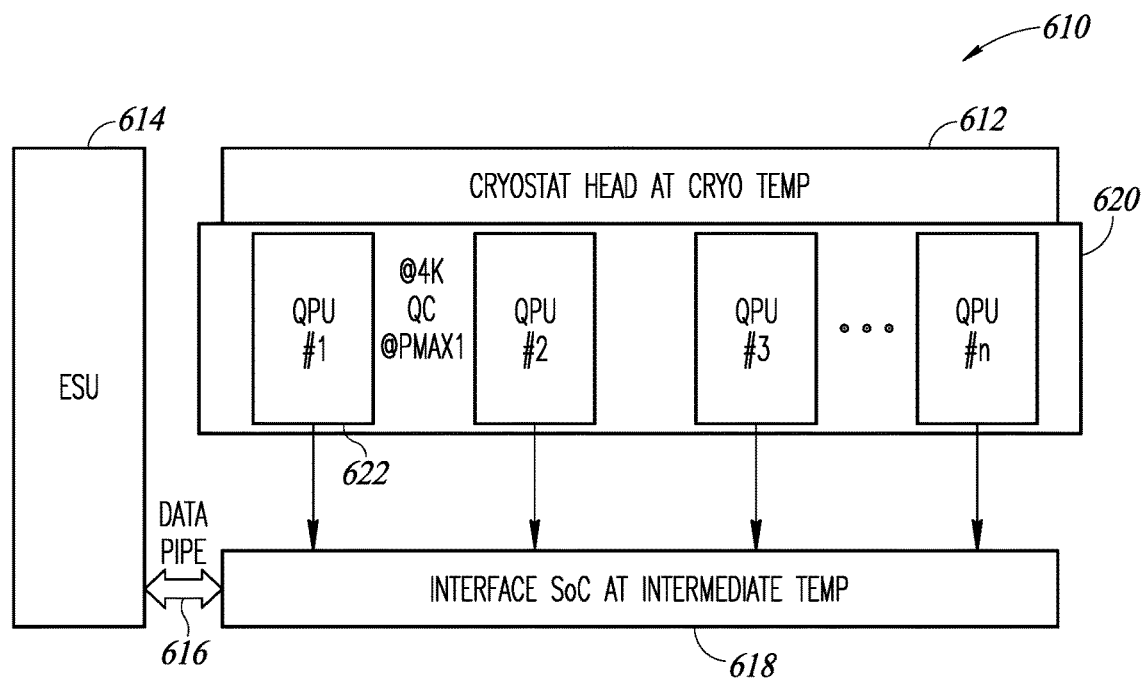
FIG. 20 is a diagram illustrating a plurality of QPUs.

A diagram illustrating a plurality of QPUs is shown in FIG. 20. The system, generally referenced 610, comprises a cryostat head 612, a plurality of QPUs 622, interface SoC 618, and ESU 614. In this embodiment, multiple QPUs 622 operate at the cryo temperature on the same cryo "finger" and communicate through the same interface SoC 618 that has multiple inputs for each quantum core. The interface SoC operates, for example, at the intermediate temperature and communicates through data pipe 616 with the ESU 614.

Figure 21:
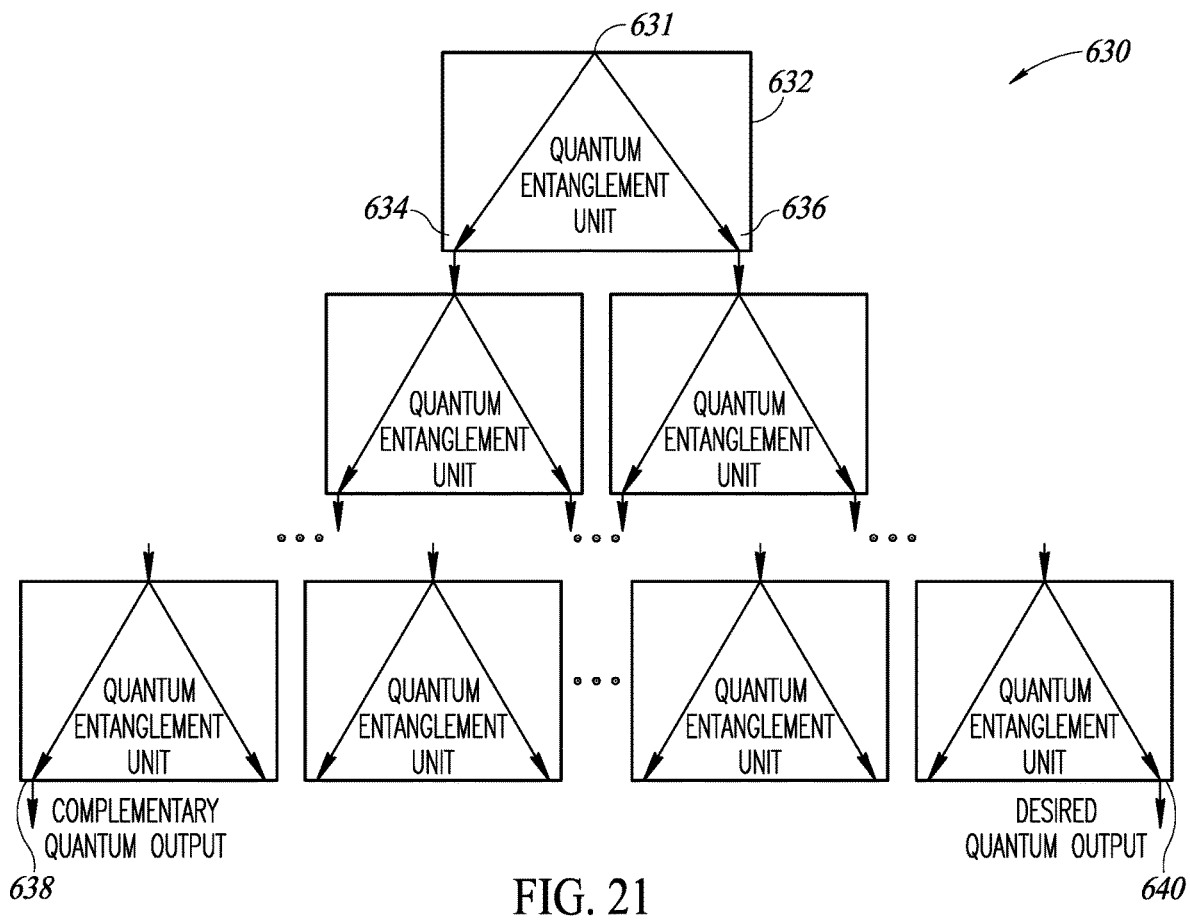
FIG. 21 is a diagram illustrating an example signal flow path.

A diagram illustrating an example signal flow path is shown in FIG. 21. In this circuit example, generally referenced 630, each quantum entanglement unit (i.e. quantum structure) 632 comprises an interaction spot 631 and a symmetrical structure to the left 634 and right 636 of the structure. After the quantum operation is complete, the particle can go either in one direction and the other. These operations, however, are complementary because the electron can be present only on one side or the other.

In one embodiment, each quantum circuit has a complementary feature or path. Thus, the signal path begins with one or more quantum bits, an operation is performed through a quantum path, and at each structure, the quantum path is split between the main path and the complementary path. The electron, however, can be present only on one path or the other, or any combination of them. For example, the electron can be 95% present at the main output and 5% present at the complementary output. The sum between the main and complementary paths should be one hundred percent. Thus, for each portion of the quantum signal path 632, there is a symmetric output where the particle can be present on either the main circuit path, complementary circuit path, or divided between the two in any proportion.

Figure 24:
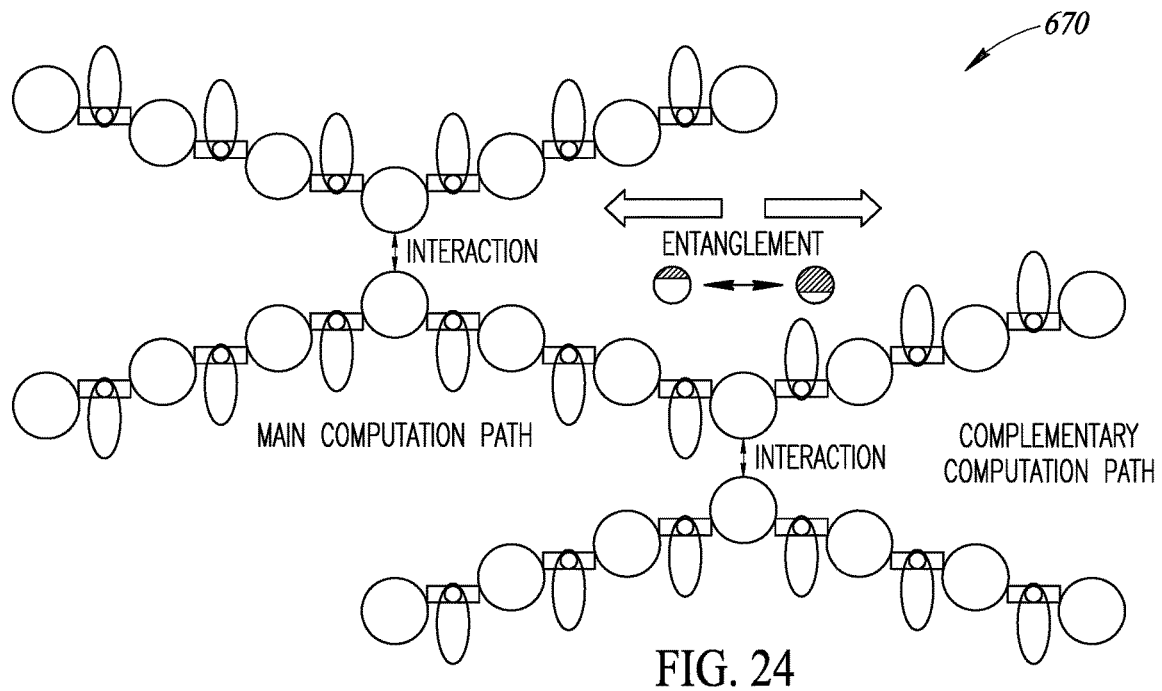
FIG. 24 is a diagram illustrating an example quantum structure having main and complementary paths.

Note that each quantum entanglement unit 632 may comprise any quantum structure such as the structure illustrated in FIG. 24. In this example, the circuit 670 comprises a main computation path as well as a complementary computation path along with two interaction points rather than one.

In one embodiment, the quantum error correction is performed in the quantum domain, as opposed to the classic domain, where it is a reversible operation since quantum computations are reversible. Alternatively, correction can be performed using classic circuitry in which case the operation is destructive. To compute in the classic domain requires collapsing the quantum state. A result is obtained and the classic data is injected back into the quantum structure and re-entangled in the quantum entanglement unit.

Figure 22:
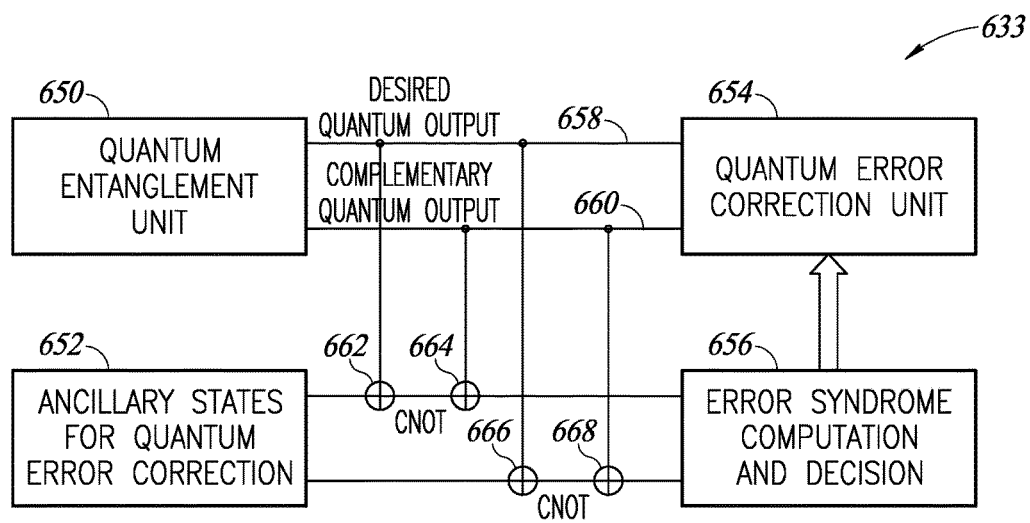
FIG. 22 is a high level block diagram illustrating an example quantum based error correction circuit.

A high level block diagram illustrating an example quantum based error correction circuit is shown in FIG. 22. The quantum error correction circuit, generally referenced 633, comprises quantum entanglement unit 650, quantum error correction unit 654, ancillary states for quantum error correction 652, and error syndrome computation and decision 656. In operation, the quantum entanglement unit processes the payload qubits, i.e. performs the quantum operation. The ancillary states are the equally distributed states or Hadamard states. Two outputs are generated by the quantum entanglement unit, namely a desired quantum output 658 and a complementary output 660.

Controlled NOT operations 662, 666 are performed with the desired quantum output and the ancillary states. Controlled NOT operations 664, 668 are performed with the complementary quantum output and the ancillary states. From the desired and complementary output of the quantum entanglement unit, it is known that the electron can only be present on one or the other or a summation of the two's probabilities that sums to one hundred percent. The operation begins with an ancillary bit, which is 50/50 distribution. A controlled NOT is then applied to it first with the desired and then the complementary output, as well as the other way around. If no errors occurred, the output remains in 50/50 state, preserving the Hadamard state. If errors occurred in the quantum entanglement unit, after control NOTing it with the desired and the complementary signal, the result will no longer be 50/50 but rather, something else, for example, 48/52. Therefore, starting with bit that is precisely 50/50 that results in 48/52 split, it can be determined that an error (or departure from the ideality) in that bit occurred. In response, either (1) the output bits can be corrected, or (2) declare an error and redo the quantum operation.

To correct the output, the ancillary gate is used to obtain the error syndrome. The error syndrome indicates where the error has occurred. The quantum structure is then modified with the quantum error correction which generates a rotation since the quantum state is represented by a vector that can be rotated. Thus, a de-rotation of the quantum state is performed to correct for the error that is detected. In this manner, using the error syndrome, the quantum state is de-rotated so as to create an error free quantum state. This constitutes a quantum domain error correction.

Figure 23:
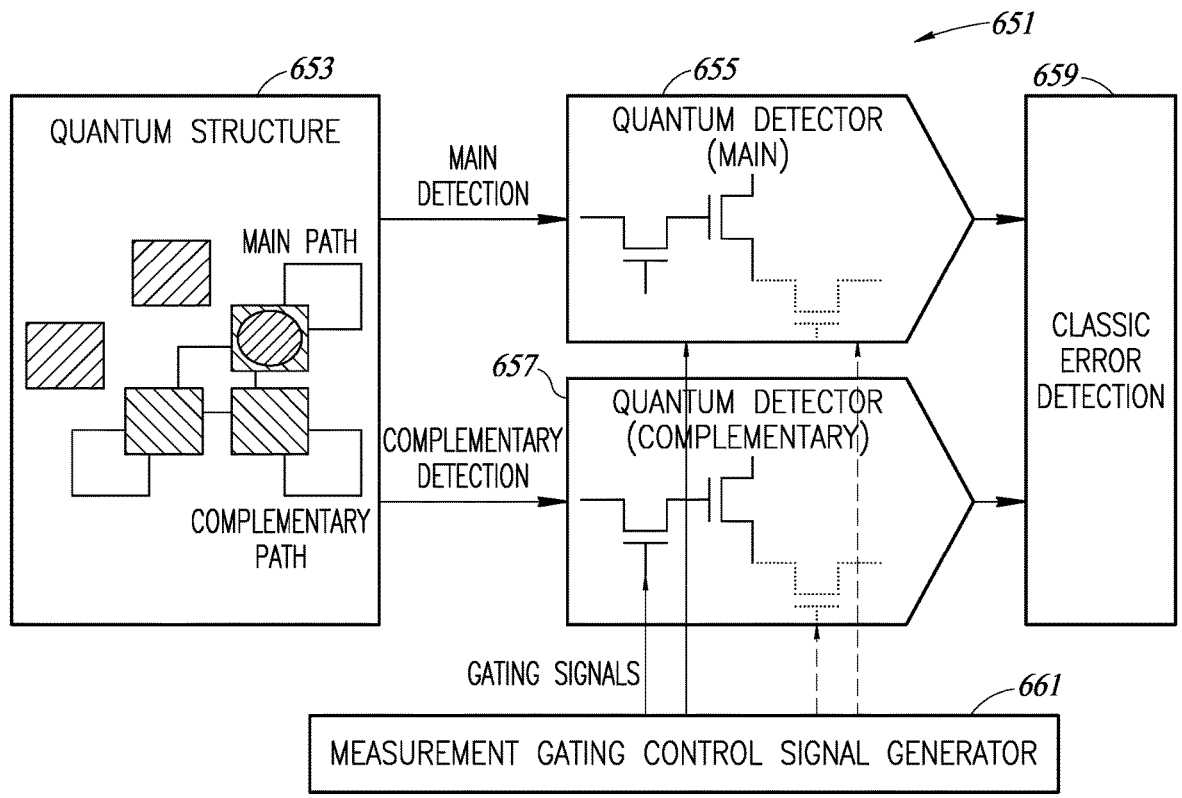
FIG. 23 is a high level block diagram illustrating an example classic based error correction circuit.

A high level block diagram illustrating an example classic domain based error correction circuit is shown in FIG. 23. The quantum error correction circuit, generally referenced 651, comprises quantum structure 653, main quantum detector 655, complementary quantum detector 657, classic error detection 659, and measurement gating control signal generator 661.

In this embodiment, error correction is performed in the classic domain where errors cannot be fully corrected. Rather, an error can only be detected and the quantum operation repeated. The quantum structure 653 comprises main and complementary paths. Separate outputs are detected by the main detector 655 and complementary detector 657. The detection results are then input to the classic error detection circuit 659 which functions to detect errors. Note that in the quantum cells 653 where there are main and complementary paths, the electron is either 100% at one output, 100% at the other output, or a summation of the two's probabilities that sums to 100%, since electrons cannot be lost from the operation. The classic error detection circuit functions to detect whether the electron is present at any of the outputs. If the electron is not present at any output, then an error is declared. If an electron is detected at both outputs, then one additional electron is present that cannot be account for, meaning an error occurred.

A useful feature of the quantum machine of the present invention is programmability of the structures and operation therein. The quantum operations occurring in the quantum circuits or cores are performed mainly with control signals. These control signals have amplitude, pulse width, and reference levels characteristics. Depending on these parameters of the control signals, the same quantum structures can yield different operations and functionality.

Figure 25A:
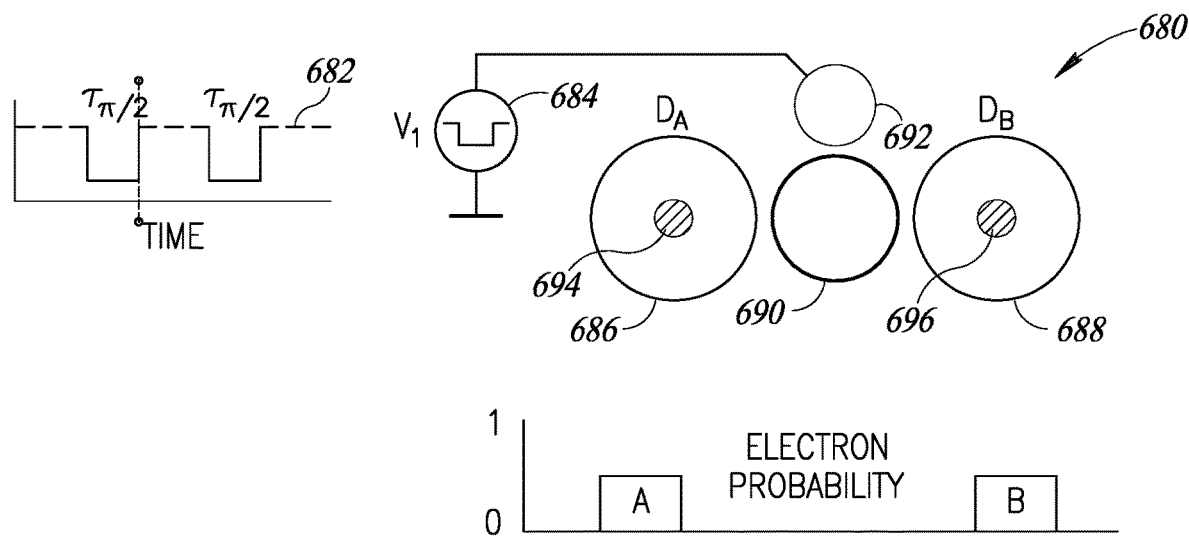
FIG. 25A is a diagram illustrating an example Hadamard state.

For example, a control pulse equal to ¼ of the Rabi oscillation yields the Hadamard gate (if the qubit is started from a classical or base state). A diagram illustrating an example equal distribution Hadamard state is shown in FIG. 25A. The qubit 680 comprises a left qdot $D_A$ 686 and a right qdot $D_B$ 688 with control pulse generator $V_I$ 684 providing a control signal 682 to the control terminal 692. The control signal is a pulse having a duration $\tau_{\pi/2}$. Note that the electron can be in other than a base state. There is middle point when the electron is equally split between two sides. It is appreciated, however, that the electron (its wavefunction) 694, 696 is present at the same time in both qdots or multiple qdots with the probability split 50/50. When the electron is split 50/50 this is called a Hadamard state. The Hadamard gate takes an electron and places it in an equal probability distribution. The Hadamard state is represented by a vector θ that is at 90 degrees.

Figure 25B:
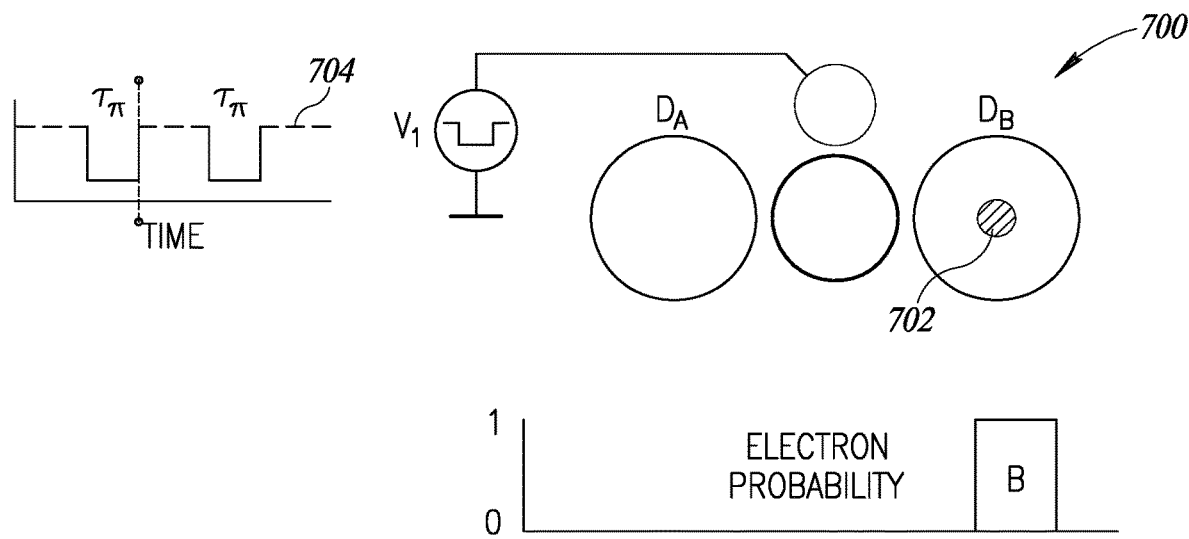
FIG. 25B is a diagram illustrating an example quantum inverter state.

A diagram illustrating an example quantum inverter state is shown in FIG. 25B. Note that the electron tunnels only when the tunnel barrier is low. When the tunnel barrier is high, the electron cannot tunnel and it stays in whatever state it was left before the tunnel barrier was raised. If a control pulse is applied that is equal in duration to the Rabi oscillation period 2π then the electron 702 starts from the left side $D_A$, tunnels to $D_B$ and will come back to $D_A$. If a control pulse equal to π is applied, i.e. half the Rabi oscillation, the electron travels from the left side to the right side, as shown in FIG. 25B. If control pulse $\tau_\pi$ 704 provided by control pulse generator $V_I$ is applied to the control terminal that lowers the tunnel barrier for half the Rabi oscillation, the electron will go from $D_A$ on the left to $D_B$ on the right qubit 700. This operation is called a quantum inverter. It is distinguished from the controlled inverter or quantum NOT. Applying any other control signal value results in a splitting of the electron between qdots $D_A$ and $D_B$ resulting in a rotation gate.

Figure 26:
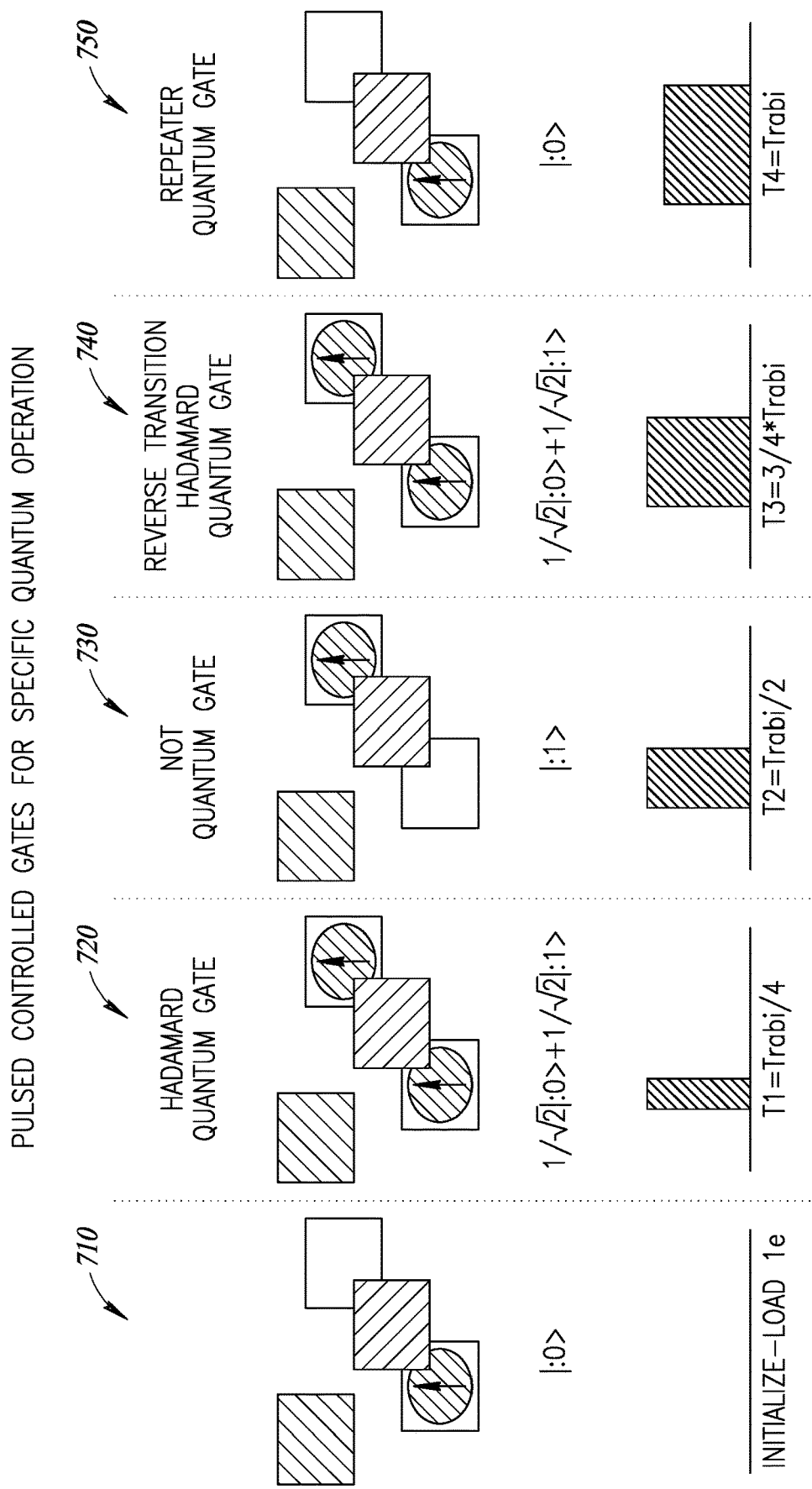
FIG. 26 is a diagram illustrating example pulsed quantum operation gates.

A diagram illustrating example pulsed quantum operation gates is shown in FIG. 26. Once the qubit 710 is initialized with a single electron at one end, it can be configured into numerous types of quantum gates depending on the particular application. The resulting functionality of the qubit depends on the control pulse applied to the control terminal. Thus, applying a control pulse with period Trabi/4 yields an equal distribution Hadamard gate 720. Applying a control pulse with period Trabi/2 yields a quantum inverter or NOT gate 730. Applying a control pulse with period ¾*Trabi yields a reverse transition Hadamard quantum gate 740. Applying a control pulse with period Trabi yields a quantum repeater gate 750 wherein the carrier ends up in the same place where it started. An attempt to detect such an operation, results in the particle not appearing to move. Applying another control pulse results in a quantum rotation. Thus, the exact same hardware provides different quantum operations depending on the how it is controlled via the different control signals. This is termed electronic reprogrammability of the quantum structures.

Figure 27A:
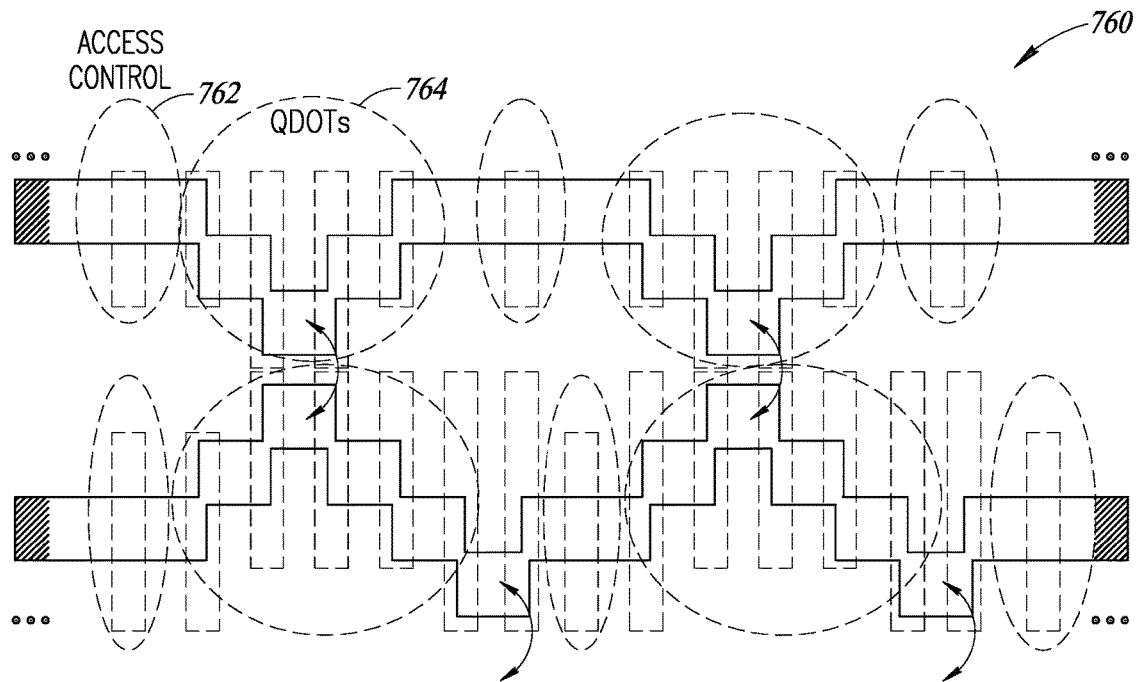
FIG. 27A is a diagram illustrating a first example quantum structure with access control.

A diagram illustrating a first example quantum structure with access control is shown in FIG. 27A. The quantum structure, generally referenced 760, comprises a plurality of access control gates 762 and a plurality of qdots 764 fabricated with semiconductor planar structures using local depletion tunneling. The structure comprises continuous quantum wells having control gates on top of them. Interaction qdots are located close to each other to permit quantum interactions between particles in the different qubits. After interaction, the particles are moved away from each other to prevent further interaction. Which section of each qubit that is active can be determined by use of the access control gates 762. For example, consider that the barrier of the access control gate in the middle of the upper well is high. In this case, the electron in the upper left structure can never travel to the right structure. In this manner, the path the carrier can move is coded which can be programmed and reprogrammed. At a later time, for example, the barrier of selected access control gates can be configured to allow particles to move in a different configuration allowing particles to travel from one cell to another.

Figure 27B:
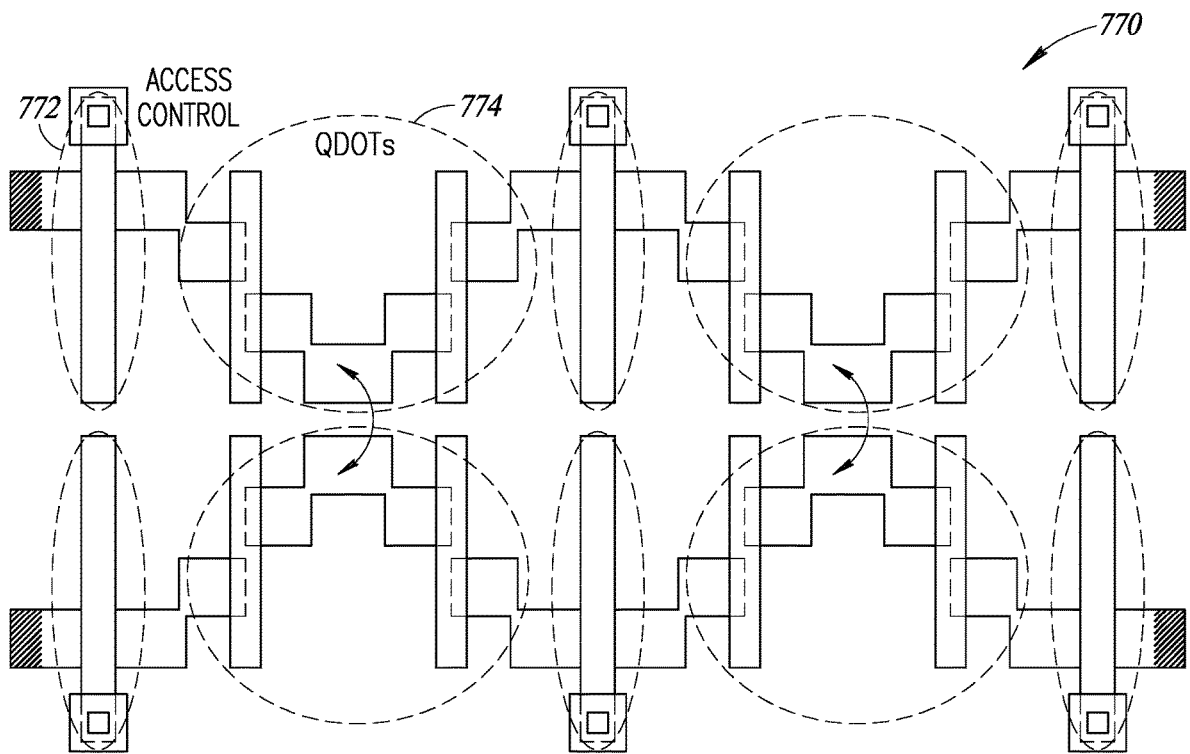
FIG. 27B is a diagram illustrating a second example quantum structure with access control.

A diagram illustrating a second example quantum structure with access control is shown in FIG. 27B. Similar to the circuit 760, the circuit, generally referenced 770, comprises a plurality of access control gates 772 and a plurality of qdots 774 fabricated with semiconductor planar structures using tunneling through thin oxide. The structure comprises continuous quantum wells having control gates on top of them. Interaction qdots are located close to each other to permit quantum interactions between particles in the different qubits. After interaction, the particles are moved away from each other to prevent further interaction. Which section of each qubit that is active can be determined by use of the access control gates 772.

Access control can be used in more complicated structures such as in matrices of qubits and structures (all referred to as a quantum fabric), as described in more detail infra. Note that any functionality can be created by using the access control gate and associated control signaling. Use of these two features (complicated matrices of quantum cells and access control gates) can be used to fabricate a reprogrammable quantum computer. Thus using the same hardware, many different computations can be performed and not just a single computation. Control of the quantum fabric is generally done through a software interface. This is analogous to a classic processor having an ALU that can perform any kind of operation, where an assembler is the software language that drives the processor to perform functions. The same arrangement in the quantum domain is provided, where the quantum operations to be performed are based on the control signals provided by the pattern generator which contains the necessary digital programmability. Along with the pattern generator, the access control gates determine the path the quantum computations take.

Figure 28A:
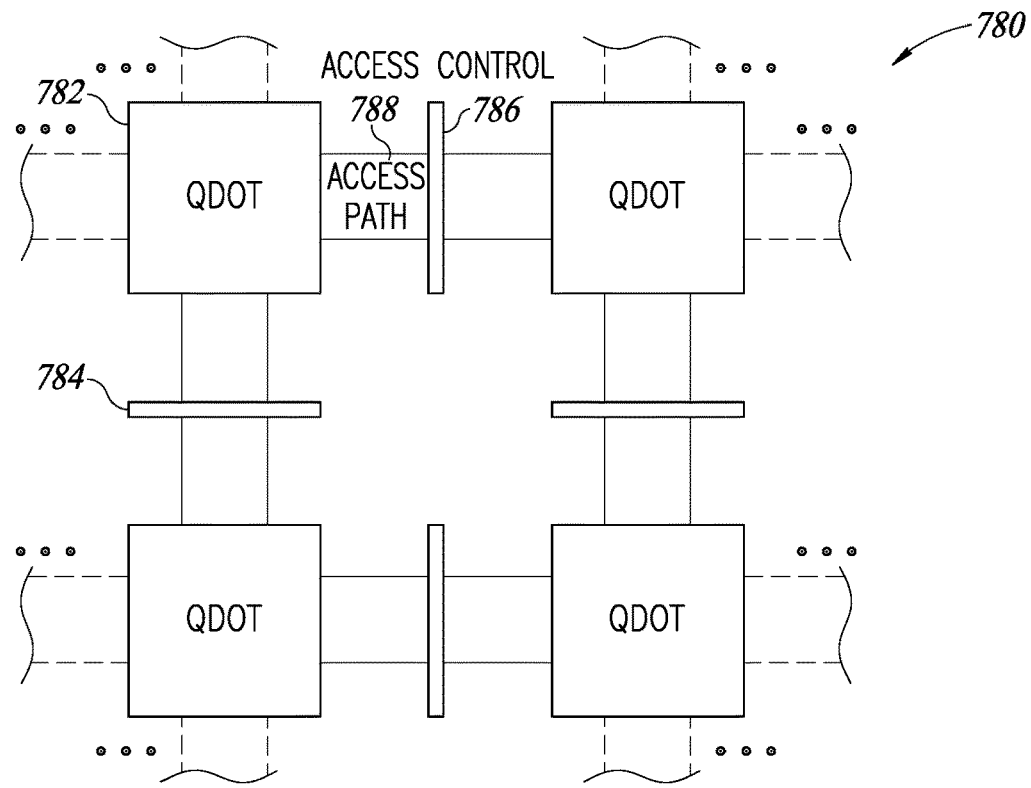
FIG. 28A is a diagram illustrating an example quantum fabric with single access control gates.

FIGS. 28A through 28H illustrate several quantum fabric examples with varying number of qdots and active control gates that can be used to construct variable or reprogrammable quantum computer. A diagram illustrating an example quantum fabric with single access control gates is shown in FIG. 28A. The quantum fabric portion, generally referenced 780, comprises a plurality of qdots 782, horizontal and vertical access paths 788, 784, and a plurality of access control gates 786. In this embodiment, signal propagation occurs in both the horizontal and vertical direction. The access paths are also located on both the horizontal and vertical paths. In accordance with desired operation, the quantum fabric can be programmed (via the pattern generator and appropriate sequencing) to determine the path the particle(s) take within the fabric by controlling the different access control gates.

Figure 28B:
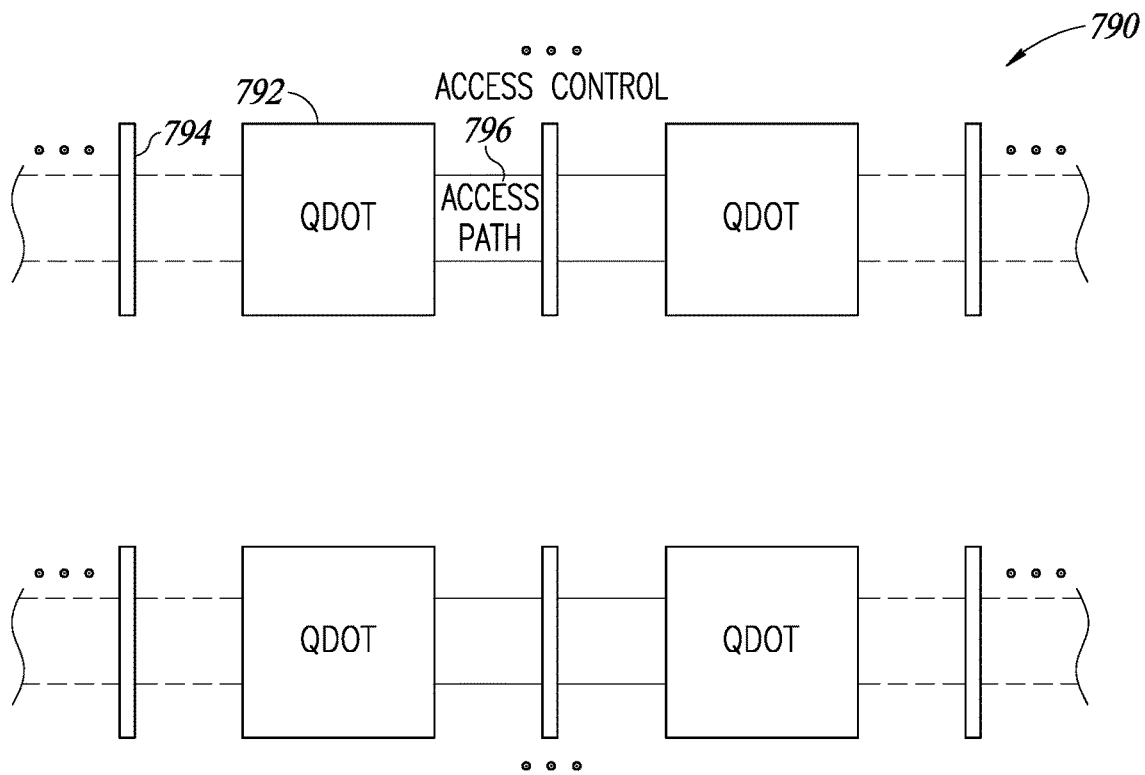
FIG. 28B is a diagram illustrating an example quantum fabric with horizontal only access control gates.

A diagram illustrating an example quantum fabric with horizontal only access control gates is shown in FIG. 28B. The quantum fabric portion, generally referenced 790, comprises a plurality of qdots 792, horizontal access paths 796, and a plurality of access control gates 794. Depending on the semiconductor process available, it may not be possible to fabricate vertical interaction or paths. In this case, only horizontal paths that interact with each other along with horizontal motion and horizontal oriented access control gates can be fabricated.

Figure 28C:
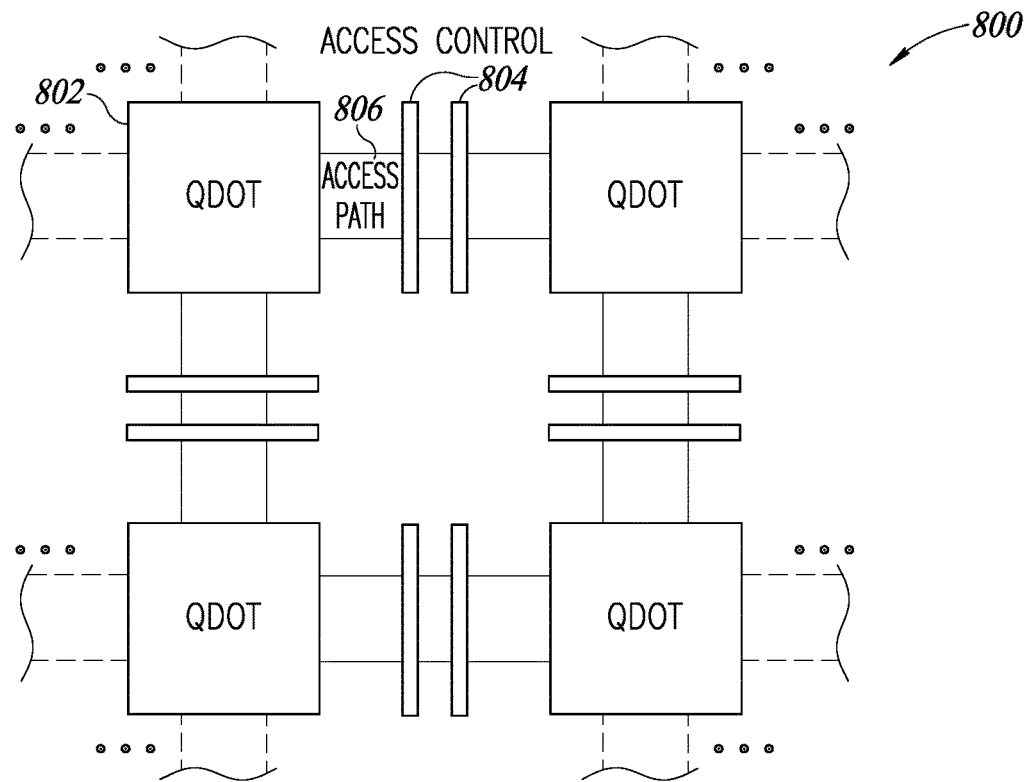
FIG. 28C is a diagram illustrating an example quantum fabric with double access control gates.

A diagram illustrating an example quantum fabric with double access control gates is shown in FIG. 28C. The quantum fabric portion, generally referenced 800, comprises a plurality of qdots 802, horizontal and vertical access paths 806, and a plurality of access control gates 804. In this embodiment, one or more paths comprise a plurality of access control gates, e.g., two in this example. Having multiple access control gates in a path enables more complicated features to be implemented. The multiple access control gates may have different controls allowing for more sophisticated control of the signal path.

For example, in some embodiments, it is desirable to have two separate gates because they can be controlled by different signals, e.g., similar to an AND gate where the path is transparent only if both access control signals are ON. Note that a quantum fabric may comprise any combination of single, double, or more access control gates depending on the application so as to reprogram the signal path in any desired fashion.

Figure 28D:
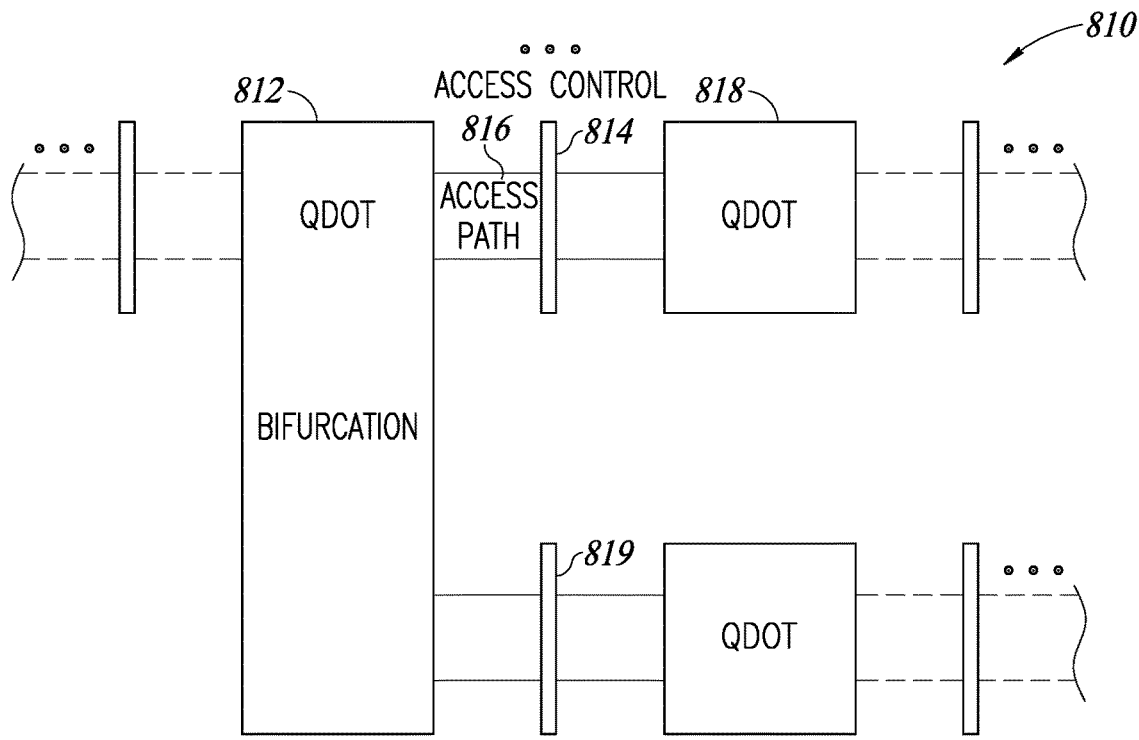
FIG. 28D is a diagram illustrating an example quantum fabric with a single input bifurcation qdot.

A diagram illustrating an example quantum fabric with a single input bifurcation qdot is shown in FIG. 28D. The quantum fabric portion, generally referenced 810, comprises a plurality of qdots 818, horizontal access paths 816, a plurality of access control gates 814, 819, and a bifurcation qdot 812. In this embodiment, a single quantum path is bifurcated based on a quantum control. Access control gate signals control how the particle moves forward using a classic electronic signal to control the access control gates. The quantum bifurcation is determined by a quantum operation, i.e. a quantum control. This is distinguished from a classic gate as a classic gate is controlled by a classic signal. Note that programmability can be obtained using both classic signals and quantum signals.

The bifurcation occurs in the quantum structure whereby the electron can take one path or the other. In one embodiment, classic access control with the two access control gates 814, 819 are used. In an alternative embodiment, the particle is bifurcated in the quantum domain. For example, quantum bifurcation can be achieved using a magnetic field where the quantum carrier interacts with the magnetic field to create what is called a quantum hall effect. Thus, depending on the direction and orientation of the magnetic field, it can be determined whether the carrier goes in the top direction or the bottom direction.

Figure 28E:
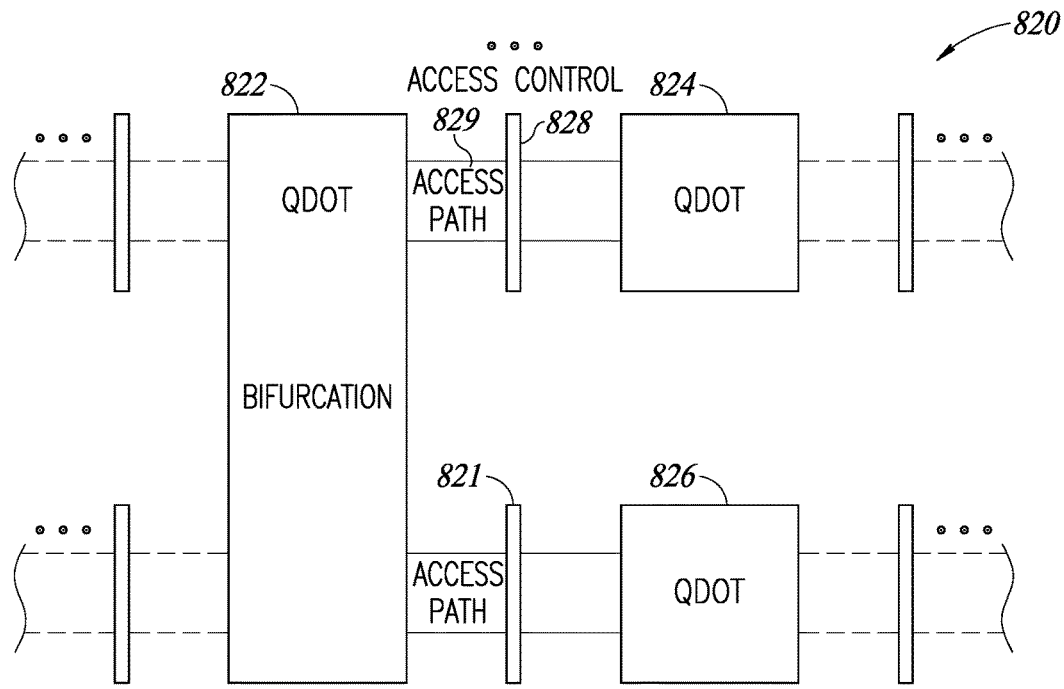
FIG. 28E is a diagram illustrating an example quantum fabric with a double input bifurcation qdot.

A diagram illustrating an example quantum fabric with a double input bifurcation qdot is shown in FIG. 28E. The quantum fabric portion, generally referenced 820, comprises a plurality of qdots 824, 826, horizontal access paths 829, a plurality of access control gates 828, 821, and a double input bifurcation qdot 822. In this embodiment, a multiple bifurcation 822 provides a cross connect ability for the two input quantum paths, to provide, for example, a programmable SWAP or CNOT operation. Each output of the bifurcation qdot has an associated access control gate 828, 821.

Figure 28F:
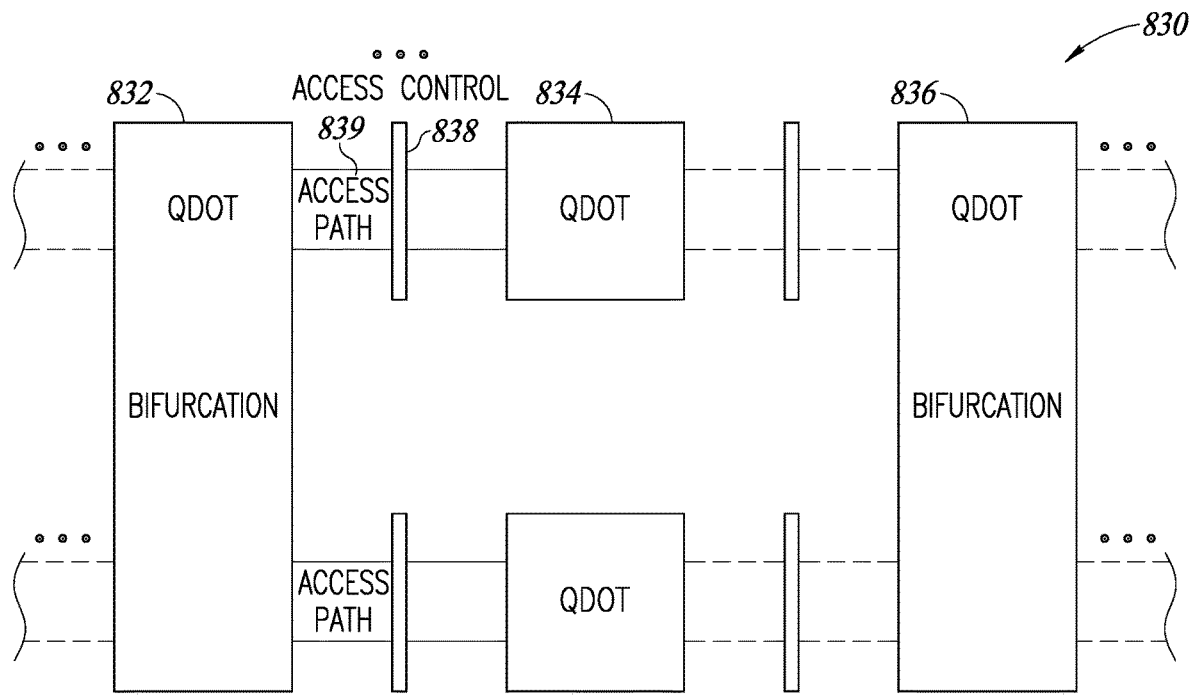
FIG. 28F is a diagram illustrating an example quantum fabric with double input bifurcation qdot and double output bifurcation qdot.

A diagram illustrating an example quantum fabric with double input bifurcation qdot and double output bifurcation qdot is shown in FIG. 28F. The quantum fabric portion, generally referenced 830, comprises a plurality of qdots 834, horizontal access paths 839, a plurality of access control gates 838, and bifurcation qdots 832, 836. In this embodiment, two double input bifurcation qdots are employed to create a more complex programmable quantum signal path.

Figure 28G:
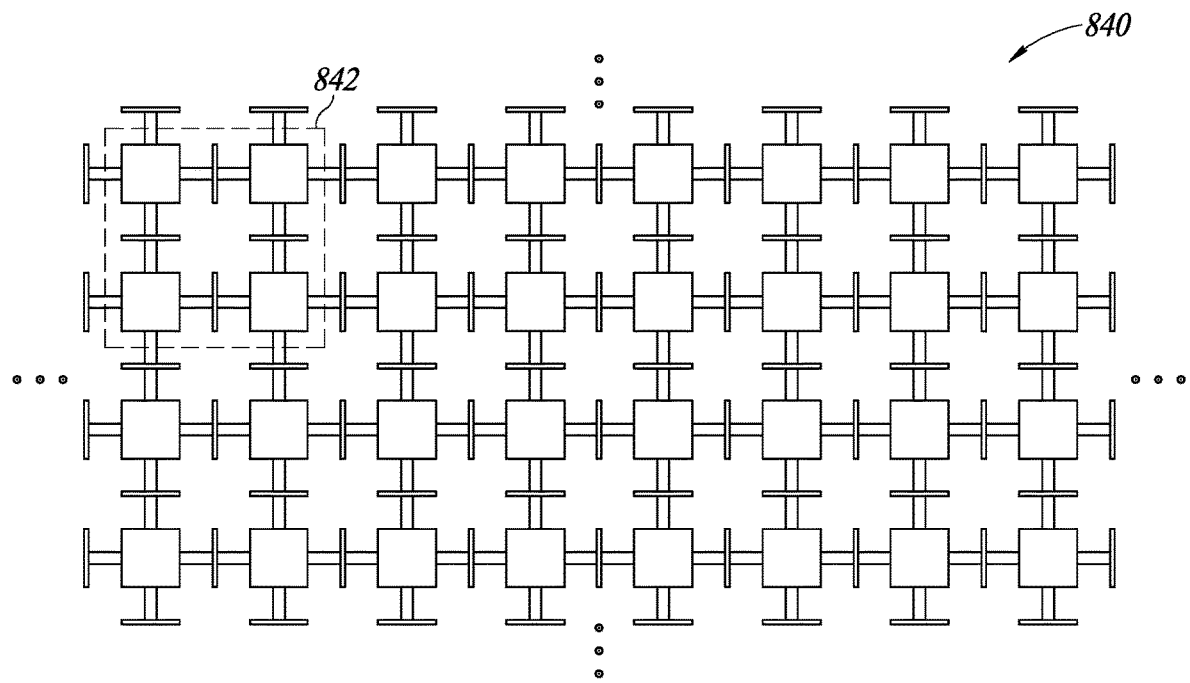
FIG. 28G is a diagram illustrating an example quantum fabric with horizontal and vertical access control paths.

A diagram illustrating an example quantum fabric with horizontal and vertical access control paths is shown in FIG. 28G. The quantum fabric portion, generally referenced 840, comprises a plurality of fabric sections 842 as described supra in FIG. 28A and having both horizontal and vertical access paths. It is appreciated that a quantum fabric having any number of qdots, access control gates, access paths, etc. can be constructed to form a matrix analogous to a quantum FPGA. From the plurality of qdots, any combination can be selected to be active and used to create a given quantum function and/or operation. The nonselected qdots are inactive and their corresponding access control gates are off, i.e. open.

Figure 28H:
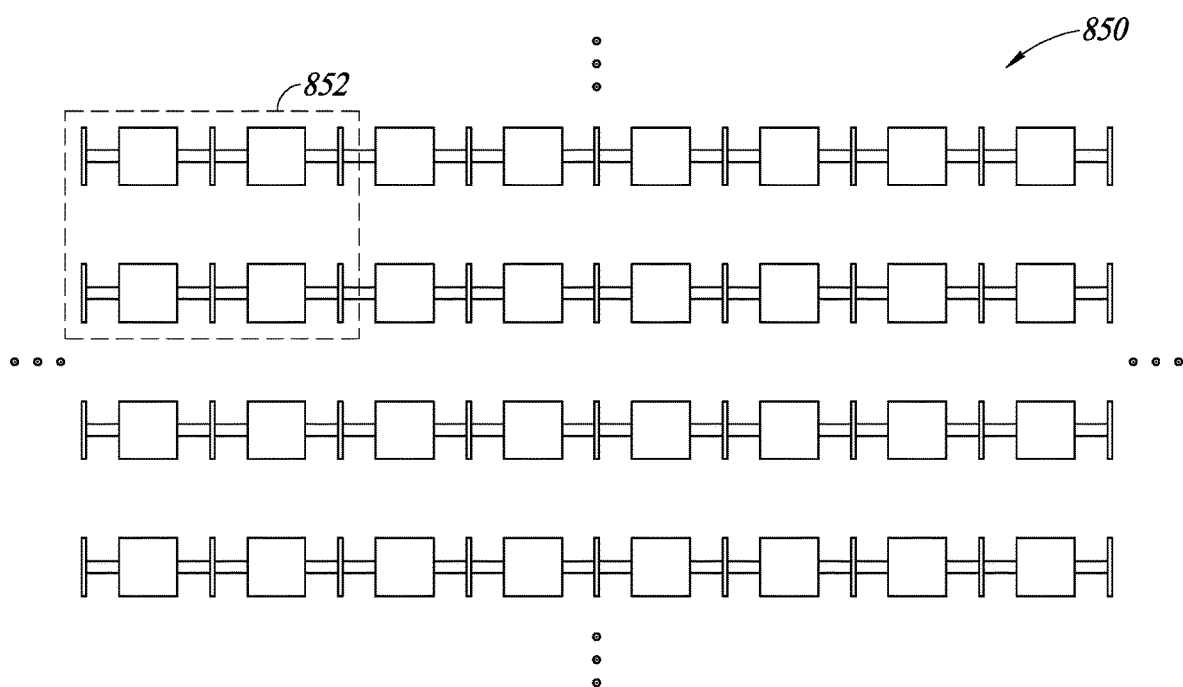
FIG. 28H is a diagram illustrating an example quantum fabric with horizontal only access control paths.

A diagram illustrating an example quantum fabric with horizontal only access control paths is shown in FIG. 28H. The quantum fabric portion, generally referenced 850, comprises a plurality of fabric sections 852 as described supra in FIG. 28B and having only horizontal access paths.

Figure 29:
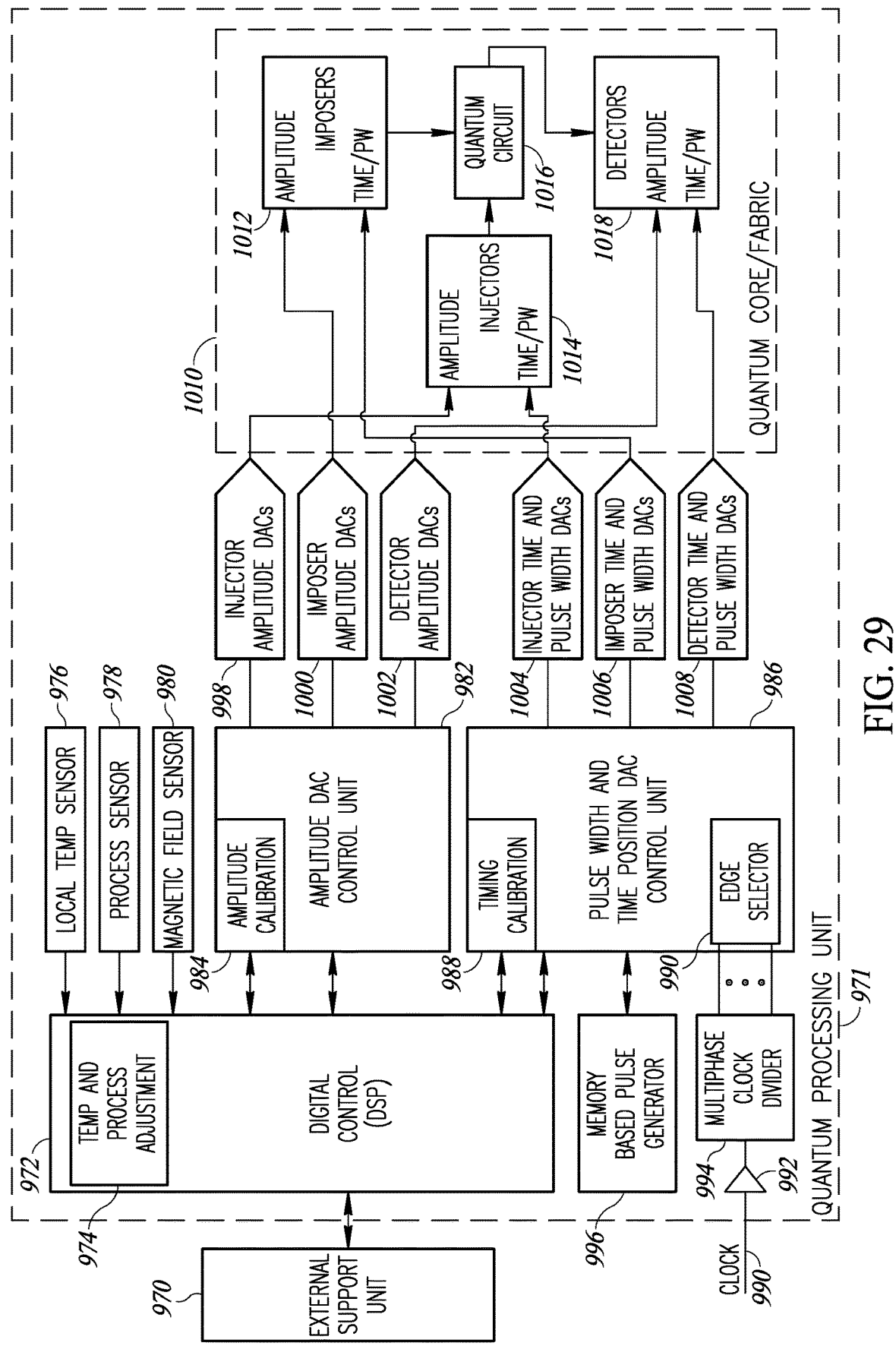
FIG. 29 is a high level block diagram illustrating an example quantum processing unit with separate amplitude and time position control units.

A diagram illustrating an example quantum processing unit with separate amplitude and time position control units is shown in FIG. 29. The quantum processing unit 971 comprises digital control (DSP) circuit 972, amplitude DAC control unit 982, pulse width and time position DAC control unit 986, injector amplitude DACs 998, imposer amplitude DACs 1000, detector amplitude DACs 1002, injector time and pulse width DACs 1004, imposer time and pulse width DACs 1006, detector time and pulse width DACs 1008, and one or more quantum cores 1010. The quantum core 1010 comprises a quantum circuit 1016, imposers 1012, injectors 1014, and detectors 1018.

The quantum computing core has a certain structure depending on the desired application along with injector, imposer, detector, and reset (not shown) circuits. All the required control signals (i.e. various voltage pulses) to these circuits are generated by the DAC electronic circuits in this example. These pulses at different voltage levels and widths control the quantum core. It is appreciated that they can be generated not only with digital to analog control circuits but by using pure analog circuitry as well. Regardless of the mechanism, ultimately, analog control is required. The pulse shaping can be performed by an analog circuit, digital circuit, or a combination thereof.

Thus, a plurality of DACs provide the control signals that are input to the quantum structure to control the injectors, imposers, and detectors. In one embodiment, 32 control signals, i.e. 32 DACs, are required for each qubit. Although the amplitude and timing can be controlled together, it is typically easier to control them separately as shown in FIG. 29. Therefore, some DACs are dedicated to controlling amplitude and others are dedicated to controlling timing of the signals.

The quantum processing unit interfaces to the outside world via the digital control (DSP) 972 and the external support unit (ESU) 970. The digital control determines how the internal quantum structure is configured. In addition, each of the amplitude DAC control units and the pulse width and time position DAC control units comprise calibration circuits 984, 988, respectively. In one embodiment, calibration circuits (also referred to as calibration loops) are used to compensate for variation in the circuits and to enable generation of precise amplitude and timing. Without calibration loops, the amplitude and timing of the control signals may be inaccurate due to process variability, temperature variability, and other environmental variabilities resulting in inaccuracies in the quantum structure.

In addition, the quantum processing unit comprises a high frequency clock 990 that is provided externally. The clock is input to a clock buffer 992 followed by a multiphase clock divider 994. Using an edge selector 990, the multi-phase signal is used to create pulses that have various pulse widths and positions in time. A memory based pulse generator 996 functions to select a sequence to use for each of the control pulses.

Moreover, the quantum processing unit comprises several sensors, including a local temperature sensor 976, process sensor 978 to detect process corners for the chip, and magnetic field sensor 980 to detect the magnetic field of the earth or other perturbing electromagnetic fields in proximity, all connected to the digital control 972. For example, if a perturbation on the system is detected, a temperature and process adjustment 974 or an environmental adjustment that changes the digital control can be performed. This, in turn, will change the amplitude and the timing that goes into the DACs thereby changing the signals input to the quantum structure to compensate for those external factors.

Figure 30:
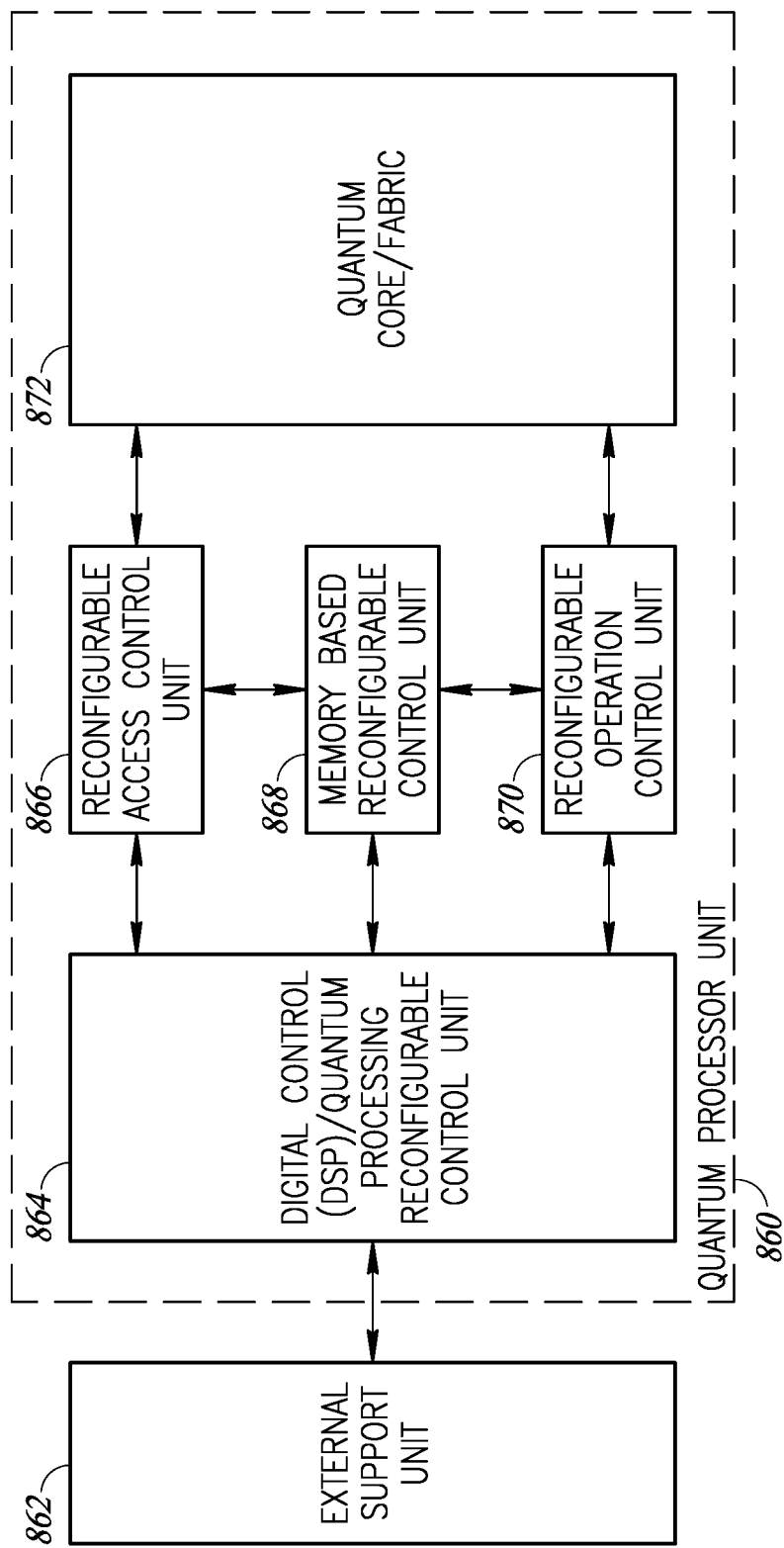
FIG. 30 is a high level block diagram illustrating an example quantum processing unit with reprogrammable access control and operation control units.

A high level block diagram illustrating an example quantum processing unit with reprogrammable access control and operation control units is shown in FIG. 30. The quantum processing unit, generally referenced 860, comprises a digital control (DSP)/quantum processing reconfigurable control unit 864 in communication with the external support unit (ESU) 862, reconfigurable access control unit 866, reconfigurable operation control unit 870, memory based reconfigurable control unit 868, and quantum fabric 872.

In operation, consider an algorithm to be executed in the quantum fabric that is a sequence of quantum operations. The memory based reconfigurable control unit 868 is loaded with instructions that indicate what controls are needed to be active and when in order to select and configure the appropriate qubits in the quantum fabric or matrix. The memory unit 868 stores all the iterations that are required that will act on the amplitude and pulse width controls as well as the access control gates of the fabric. The reconfigurable access control unit 866 functions to provide the control signals to the access control gates in the quantum fabric. The reconfigurable operation control unit 870 functions to provide control signals to the qdots and qubits in the quantum fabric.

Note that the quantum fabric or matrix may comprise any combination of quantum structures. For example, the quantum fabric may comprise the fabric 800 shown in FIG. 28C, the fabric 840 shown in FIG. 28G, or the fabric 850 shown in FIG. 28H.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A quantum computing machine, comprising:
   one or more quantum cores each including a quantum computing unit and a quantum entanglement unit for configuring controls thereto;
   a quantum error detection unit operative to detect errors in quantum computations in said quantum entanglement and quantum computing units and to calculate error syndromes therefrom; and
   a quantum error correction unit operative to perform forward error correction correcting errors detected by said quantum error detection unit.

2. The quantum computing machine according to claim 1, wherein said quantum computation comprises a main path and an ancillary path.

3. The quantum computing machine according to claim 1, further comprising a partial readout unit operative to generate a partial readout of a quantum state that is re-injected back into said one or more quantum computing cores thereby extending quantum decoherence time.

4. The quantum computing machine according to claim 1, wherein said one or more quantum computing cores comprise a plurality of qdots constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

5. A quantum computing machine, comprising:
   one or more quantum computing cores including a quantum entanglement unit for configuring controls to perform operations on quantum states therein;
   ancillary quantum states input to said quantum entanglement unit and an ancillary quantum processing path;
   a quantum error detection unit operative to detect errors in quantum computations in said quantum entanglement unit utilizing said ancillary quantum states to calculate error syndromes therefrom;
   a quantum error correction control unit operative to determine corrections to apply to said quantum states based on computed error syndromes; and
   a quantum error correction unit operative to perform forward error correction correcting errors in accordance with said corrections from said quantum error correction control unit.

6. A quantum computing machine, comprising:
   one or more quantum computing cores including a quantum entanglement unit for configuring controls to perform operations on quantum states therein;
   a quantum computation including a main path and a complimentary path;
   a main detector coupled to said main path and a complimentary detector coupled to said complimentary path;
   a classic error detection unit coupled to the output of said main detector and said complimentary detector, and operative to generate error detection and/or error correction feedback data input to said quantum entanglement unit;

a quantum error detection unit operative to detect errors in quantum computations in said quantum entanglement unit and quantum computation utilizing ancillary quantum states to calculate error syndromes therefrom;

a quantum error correction control unit operative to determine corrections to apply to said quantum states; and a quantum error correction unit operative to perform forward error correction correcting errors in accordance with said corrections from said quantum error correction control unit.

7. The quantum computing machine according to claim 6, wherein said error syndromes are used to compute correction control signals in a programmable pattern generator for a quantum computing path that de-rotates and scales said quantum state in both amplitude and phase in order to correct for detected errors before detection of main path data is performed.

8. The quantum computing machine according to claim 6, wherein said classic error detection unit is implemented internally in a classic computing core.

9. The quantum computing machine according to claim 6, wherein said classic error detection unit is implemented externally in an external support unit in communication with said one or more quantum computing cores.

10. The quantum computing machine according to claim 6, further comprising a partial readout unit operative to generate a partial readout of a quantum state that is re-injected back into said one or more quantum computing cores thereby extending quantum decoherence time.

11. The quantum computing machine according to claim 6, wherein said one or more quantum computing cores comprise a plurality of qdots constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

12. A quantum computing machine, comprising:
one or more quantum computing cores, each quantum computing core including:
a quantum entanglement unit for configuring controls for performing one or more quantum computations;
a quantum error detection unit operative to detect errors in said one or more quantum computations in said quantum entanglement unit and to calculate error syndromes therefrom; and
a quantum error correction unit operative to perform forward error correction thereby correcting errors detected by said quantum error detection unit.

13. The quantum computing machine according to claim 12, wherein said one or more quantum computation comprises a main path and an ancillary path.

14. The quantum computing machine according to claim 12, further comprising a partial readout unit operative to generate a partial readout of a quantum state that is re-injected back into said one or more quantum computing cores thereby extending quantum decoherence time.

15. The quantum computing machine according to claim 12, wherein said one or more quantum computing cores comprise a plurality of quantum dots constructed using at least one semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

16. The quantum computing machine according to claim 12, wherein said error syndromes are used to compute correction control signals in a programmable pattern generator for a quantum computing path that de-rotates and scales said quantum state in both amplitude and phase in order to correct for detected errors before detection of main path data is performed.

17. The quantum computing machine according to claim 12, further comprising a classic error detection unit implemented in a classic computing core.

18. The quantum computing machine according to claim 12, further comprising a classic error detection unit implemented externally in an external support unit in communication with said one or more quantum computing cores.

* * * * *